（12） United States Patent
Kapusta et al.

(10) Patent No.: US 10,332,832 B2
(45) Date of Patent: Jun. 25, 2019

(54) METHOD OF MANUFACTURING AN ELECTRONICS PACKAGE USING DEVICE-LAST OR DEVICE-ALMOST LAST PLACEMENT

(71) Applicant: General Electric Company, Schenectady, NY (US)

(72) Inventors: Christopher James Kapusta, Delanson, NY (US); Raymond Albert Fillion, Niskayuna, NY (US); Risto Ilkka Sakari Tuominen, Tokyo (JP); Kaustubh Ravindra Nagarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/670,423

(22) Filed: Aug. 7, 2017

(65) Prior Publication Data

US 2019/0043802 A1  Feb. 7, 2019

(51) Int. Cl.
*H01L 21/00*  (2006.01)
*H01L 23/522*  (2006.01)
(Continued)

(52) U.S. Cl.
CPC ........ *H01L 23/5226* (2013.01); *H01L 21/486* (2013.01); *H01L 23/4952* (2013.01);
(Continued)

(58) Field of Classification Search
CPC ............. H01L 23/5226; H01L 23/4952; H01L 23/49541; H01L 25/043; H01L 24/97;
(Continued)

(56) References Cited

U.S. PATENT DOCUMENTS 5,725,718 A * 3/1998 Banholzer ......... H01L 21/68721
118/728
5,841,193 A  11/1998 Eichelberger
(Continued)

FOREIGN PATENT DOCUMENTS

| WO | 1983003065 A1 | 9/1983 |
| WO | 2006134216 A2 | 12/2006 |
| WO | 2006134217 A1 | 12/2006 |

OTHER PUBLICATIONS

Dufour et al., "Microwave Multi-Chip Module Utilizing Aluminum Silicon Carbide With In-Situ Cast Components and High Density Interconnect Technology," 1997 International Conference on Multichip Modules, pp. 309-314.
(Continued)

*Primary Examiner* — Vu A Vu
(74) *Attorney, Agent, or Firm* — Ziolkowski Patent Solutions Group, SC

(57) ABSTRACT

A method of manufacturing a multi-layer electronics package includes attaching a base insulating substrate to a frame having an opening therein and such that the frame is positioned above and/or below the base insulating substrate to provide support thereto. A first conductive wiring layer is applied on the first side of the base insulating substrate, and vias are formed in the base insulating substrate. A second conductive wiring layer is formed on the second side of the base insulating substrate that covers the vias and the exposed portions of the first conductive wiring layer and at least one additional insulating substrate is bonded to the base insulating substrate. Vias are formed in each additional insulating substrate and an additional conductive wiring layer is formed on each of the additional insulating substrate. The described build-up forms a multilayer interconnect structure, with the frame providing support for this build-up.

21 Claims, 47 Drawing Sheets

(51) Int. Cl.
*H01L 23/495* (2006.01)
*H01L 25/04* (2014.01)
*H01L 23/00* (2006.01)
*H01L 21/48* (2006.01)

(52) U.S. Cl.
CPC ........ *H01L 23/49541* (2013.01); *H01L 24/03* (2013.01); *H01L 24/82* (2013.01); *H01L 24/97* (2013.01); *H01L 25/043* (2013.01); *H05K 2201/10674* (2013.01)

(58) Field of Classification Search
CPC ....... H01L 24/03; H01L 24/82; H01L 21/486; H05K 2201/10674
USPC .......................................................... 438/108
See application file for complete search history.

(56) References Cited

U.S. PATENT DOCUMENTS

| | | | |
|---|---|---|---|
| 6,197,614 B1 | 3/2001 | Ho | |
| 7,956,457 B2* | 6/2011 | Fillion | .................... H01L 23/16 |
| | | | 257/712 |
| 8,212,363 B2* | 7/2012 | Takahashi | .............. H05K 1/115 |
| | | | 257/774 |
| 8,898,895 B2* | 12/2014 | Ueki | ...................... H05K 3/423 |
| | | | 29/831 |
| 2003/0060172 A1* | 3/2003 | Kuriyama | .............. H04B 1/036 |
| | | | 455/575.1 |
| 2014/0029210 A1 | 1/2014 | Gowda et al. | |
| 2014/0029234 A1 | 1/2014 | Chauhan et al. | |
| 2016/0104666 A1 | 4/2016 | Gowda et al. | |
| 2016/0174387 A1 | 6/2016 | Tuominen | |
| 2016/0183376 A1 | 6/2016 | Gowda et al. | |
| 2017/0256506 A1* | 9/2017 | Tomita | .................. H01L 23/585 |

OTHER PUBLICATIONS

Fillion et al., "A High Performance Polymer Thin Film Power Electronics Packaging Technology," Proceedings 2002 International Symposium on Microelectronics, Sep. 4-6, 2002, pp. 408-414.

Tang et al., "Challenges of Flip Chip Packaging with Embedded Fine Line and Multi-layer Corless Substrate," 2015 Electronic Components & Technology Conference, pp. 1219-1222.

Wang et al., "Interconnection of Fine Lines to Micro Vias in High Density Multilayer LTCC Substrates," 2005 International Symposium on Microelectronics, pp. 810-815.

Hamelink et al., "Through-Polymer-Via for 3D Heterogeneous Integration and Packaging," EPIC 2015, Dec. 2-4, 2015, Singapore, pp. 1-7.

Shen et al., "Design of On-Chip Microwave Filters in Integrated Fan-Out Wafer Level Packaging (InFO-WLP) Technology," APEMC 2015, pp. 1-3.

* cited by examiner

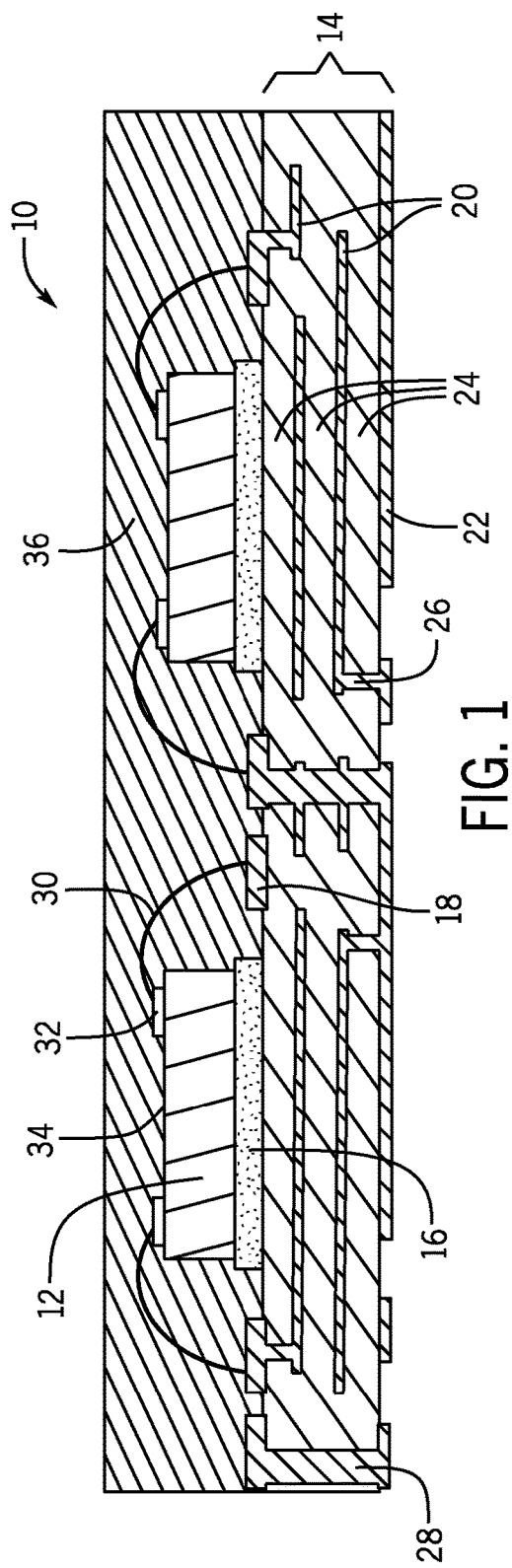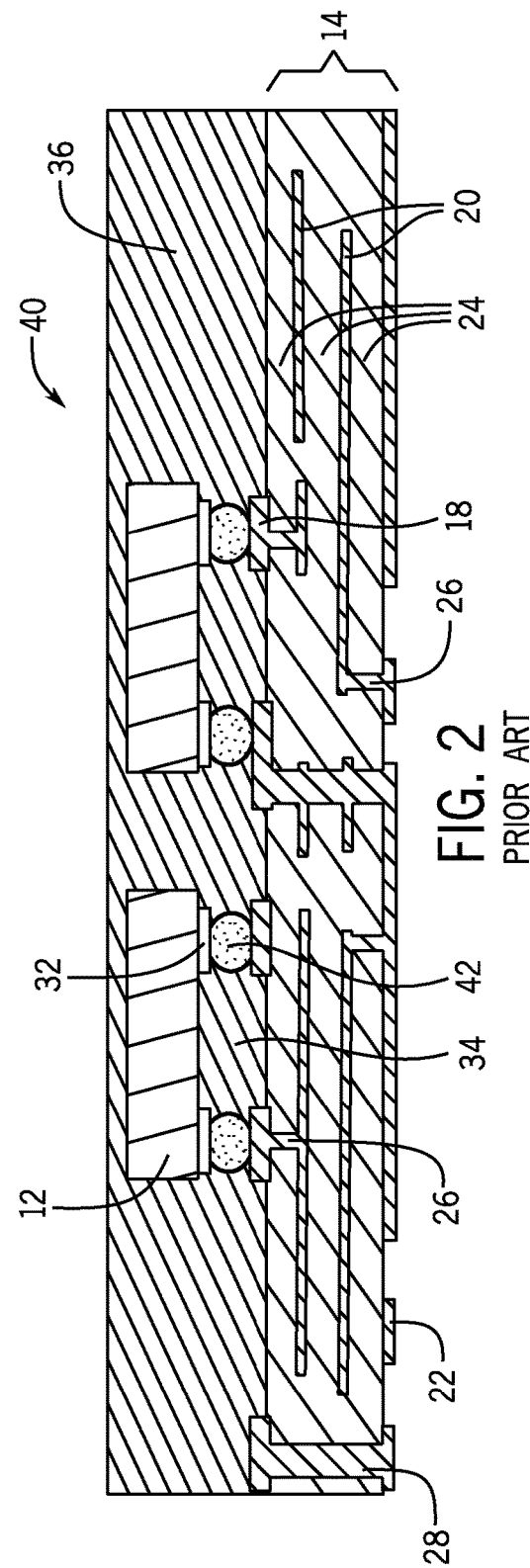

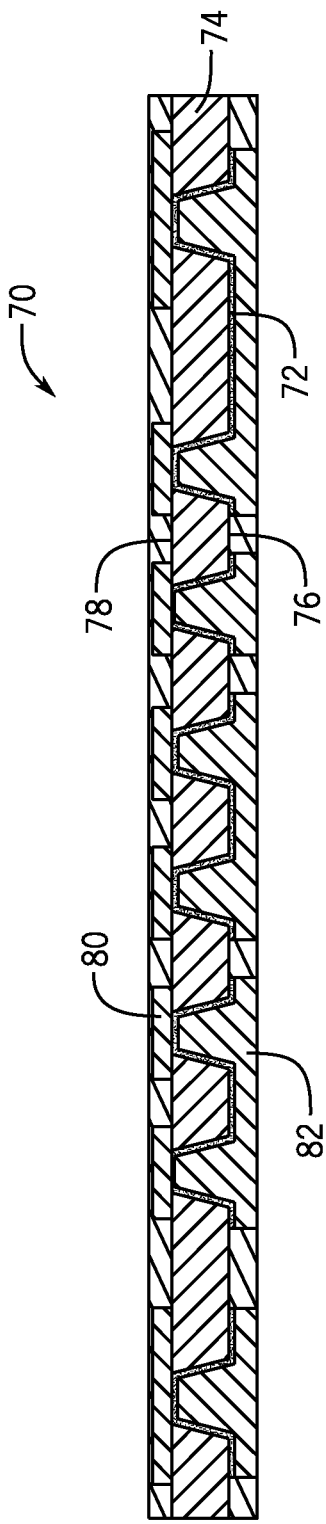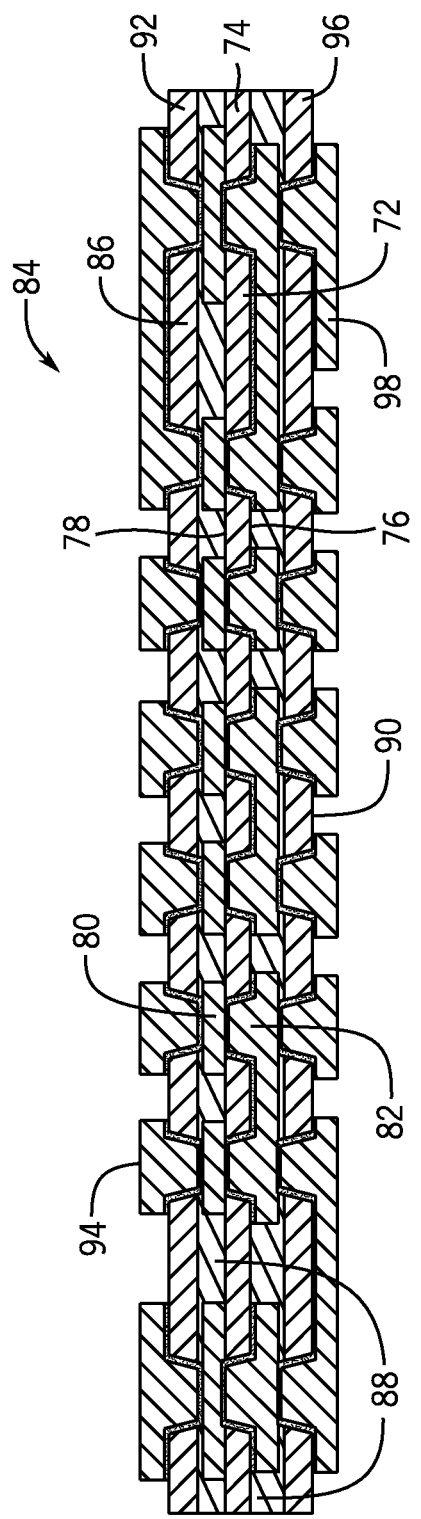

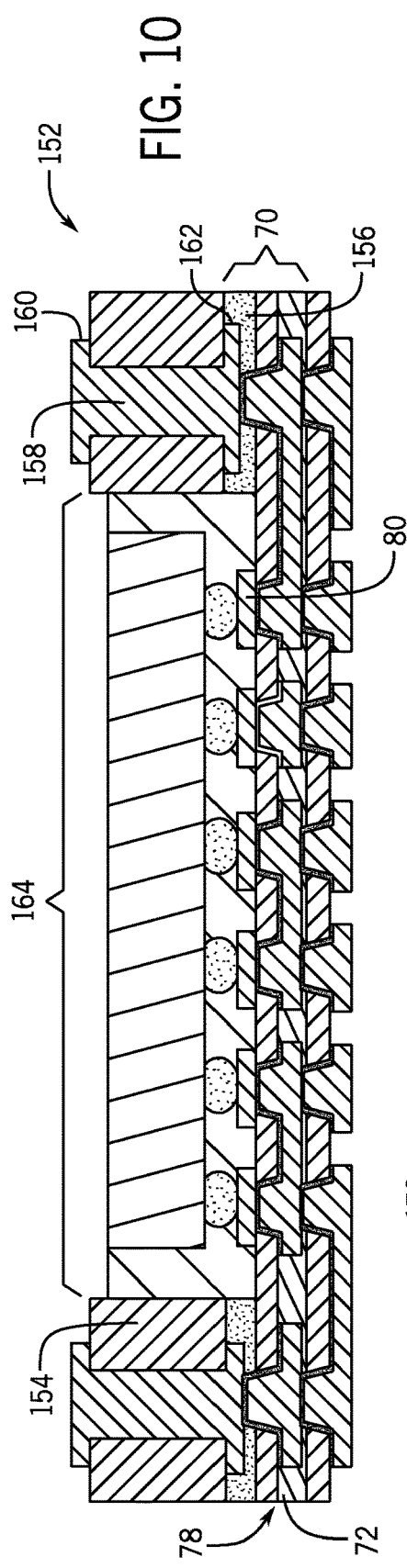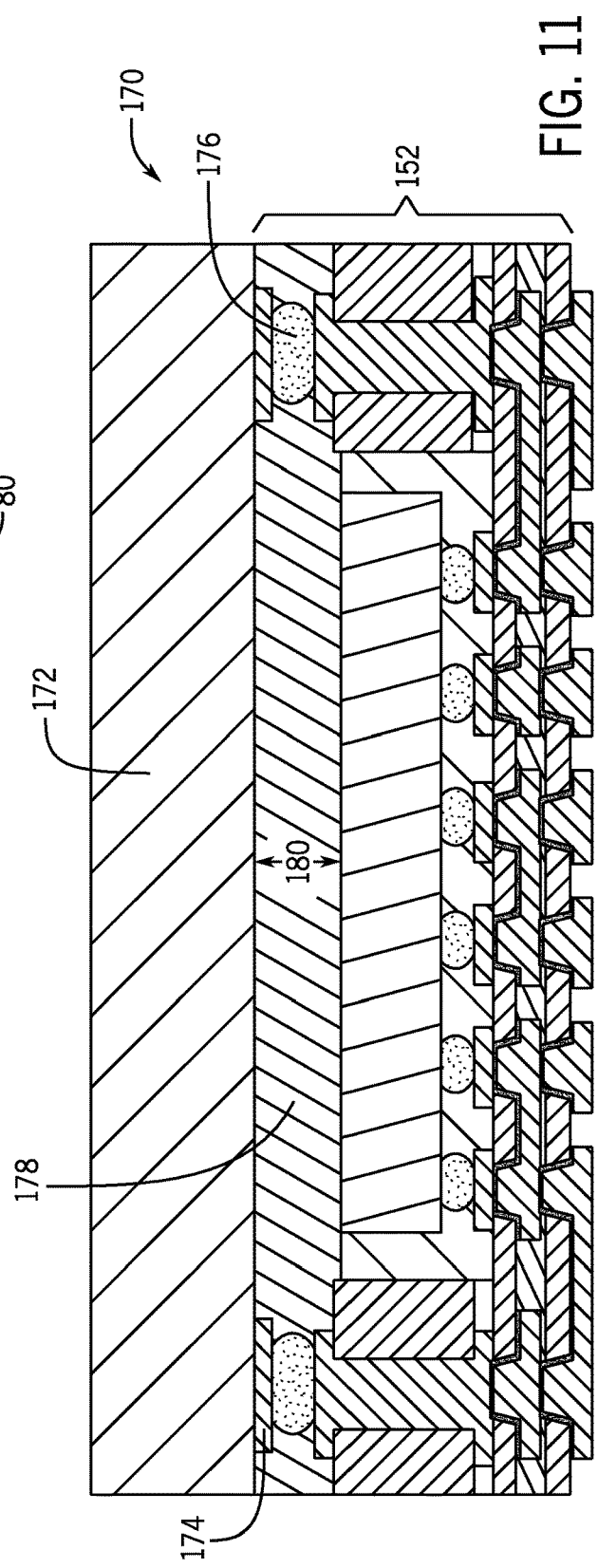

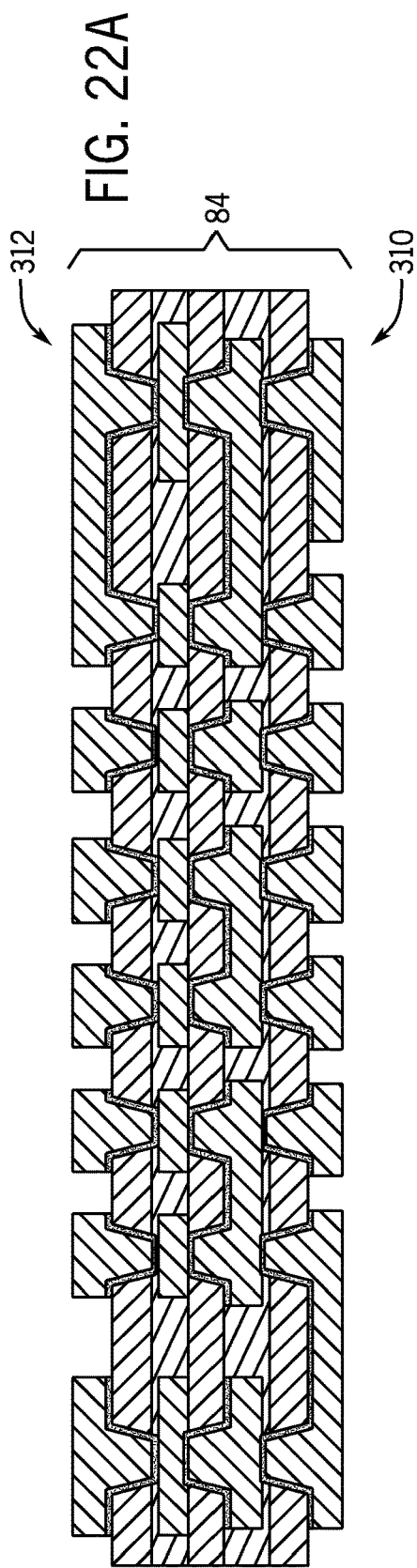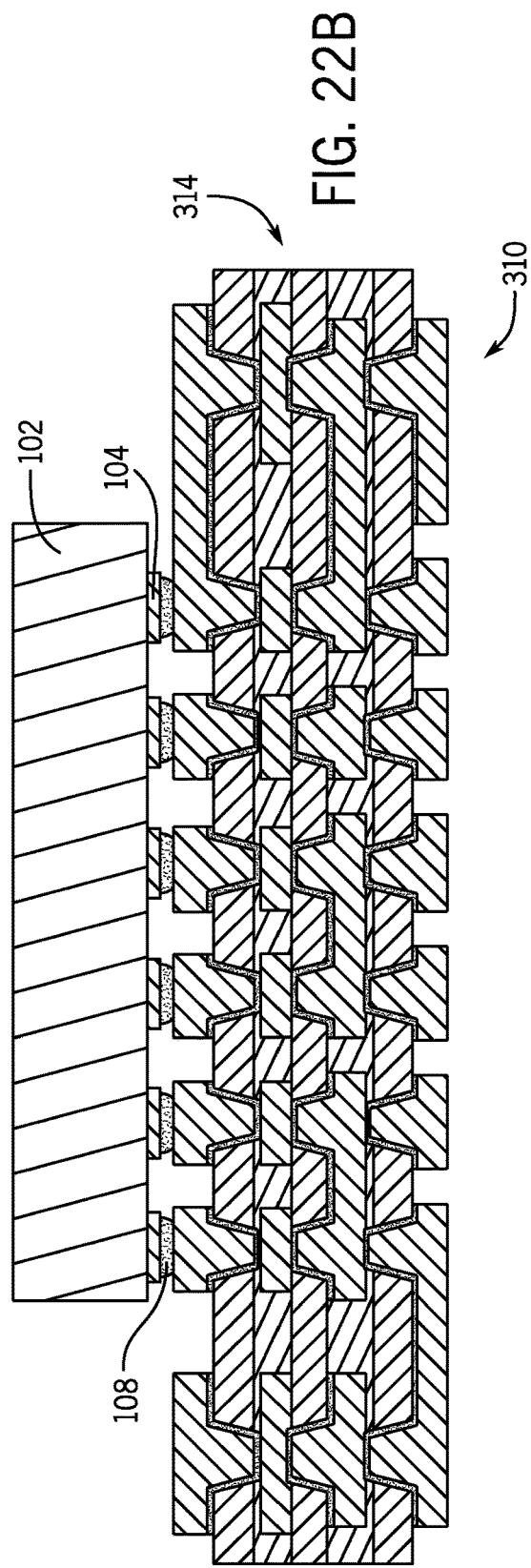

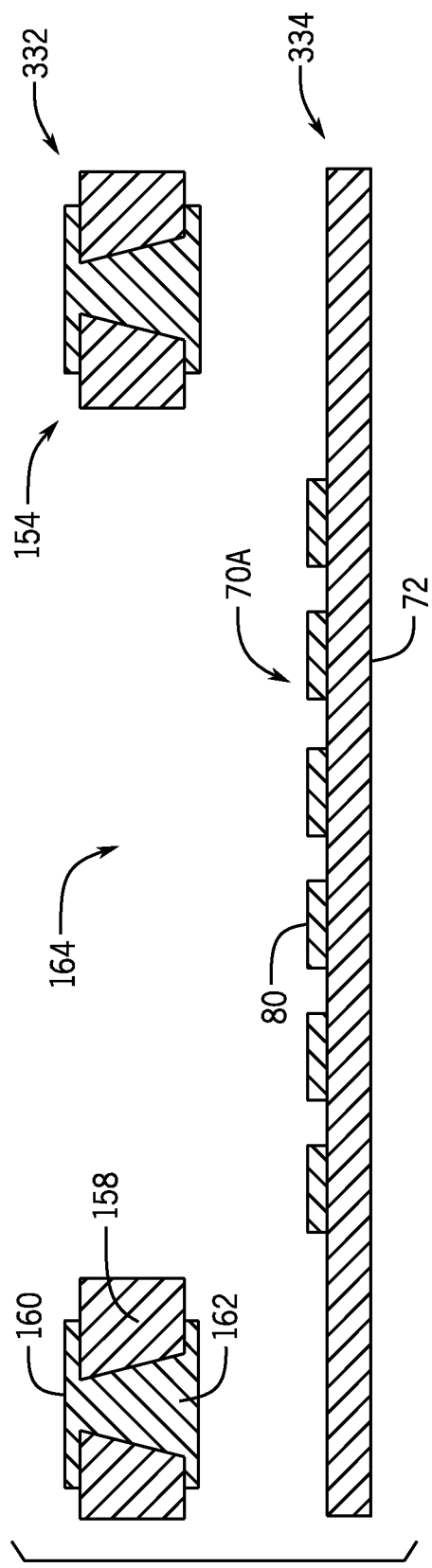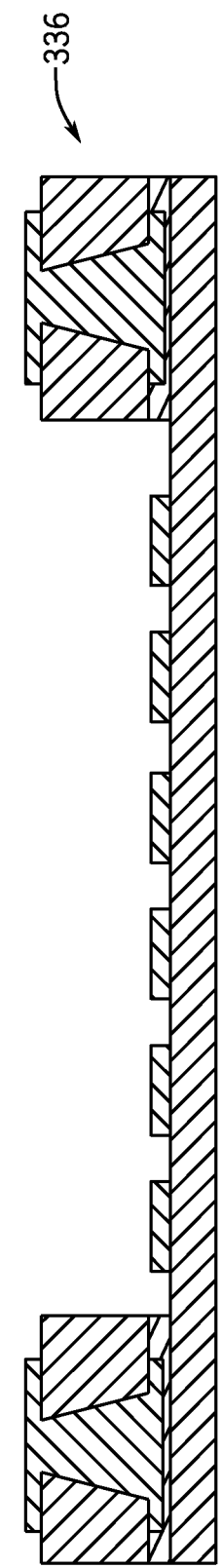
FIG. 23A
FIG. 23B

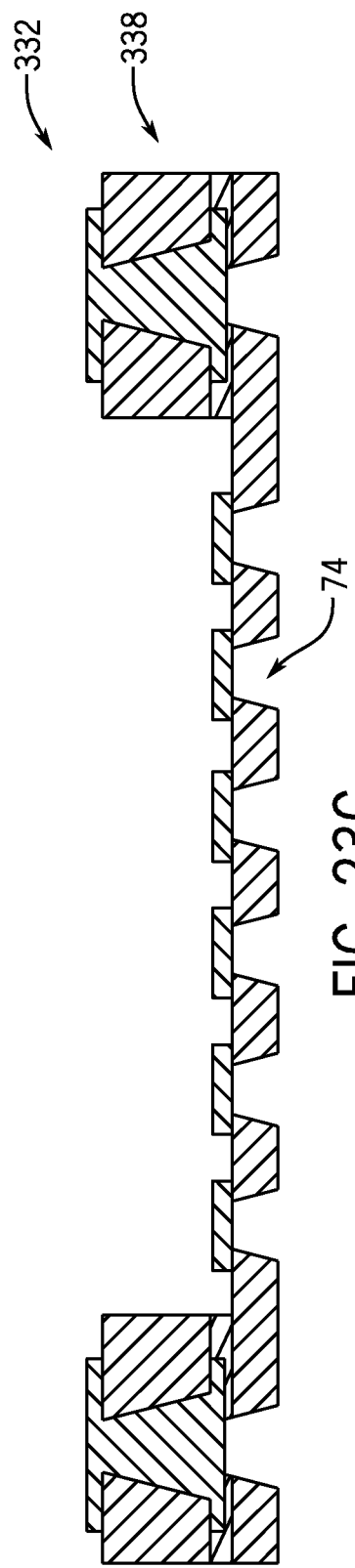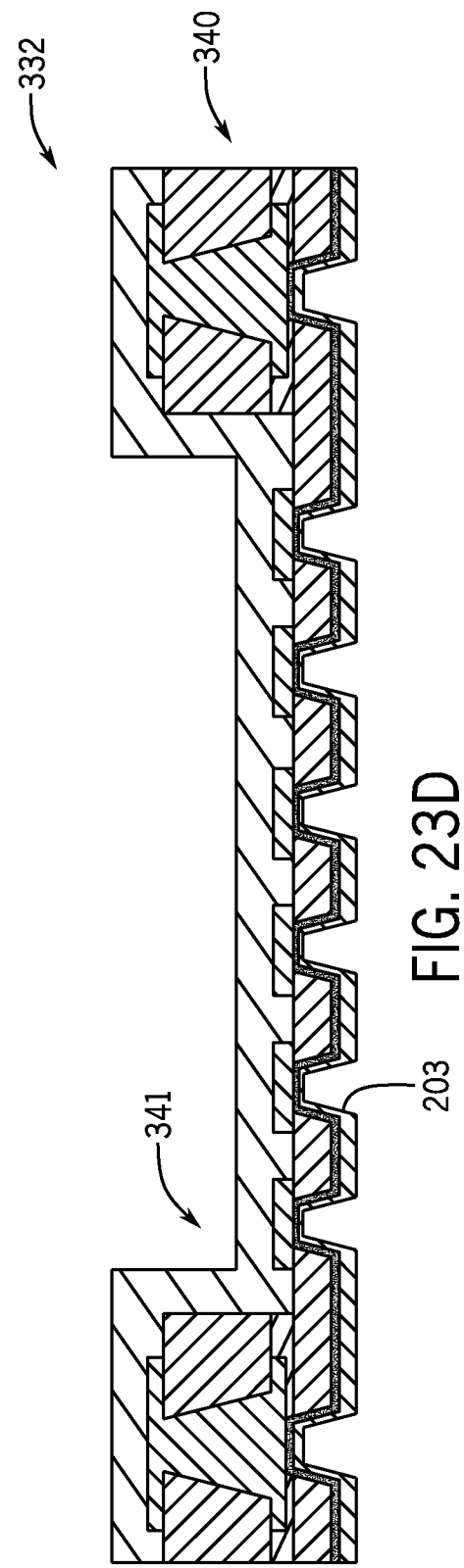

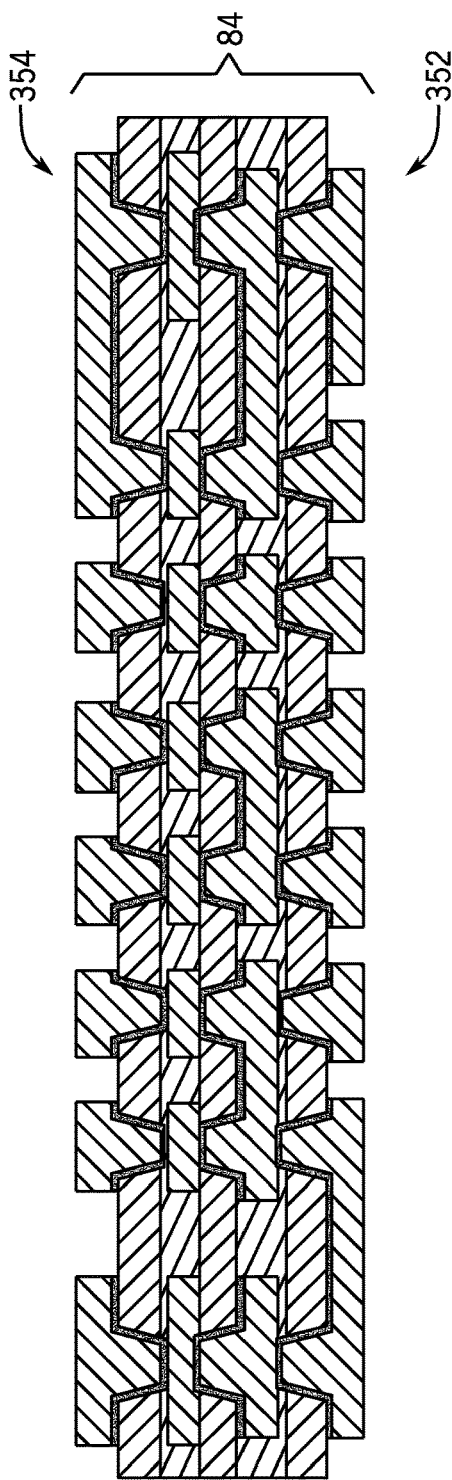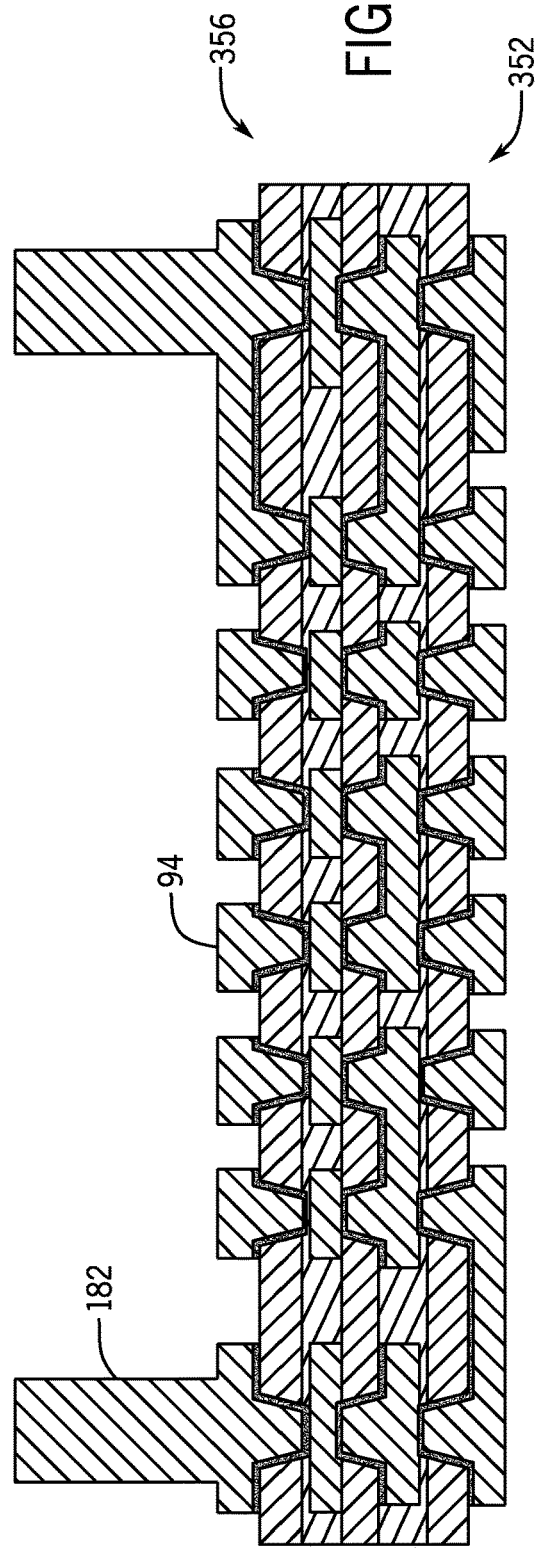

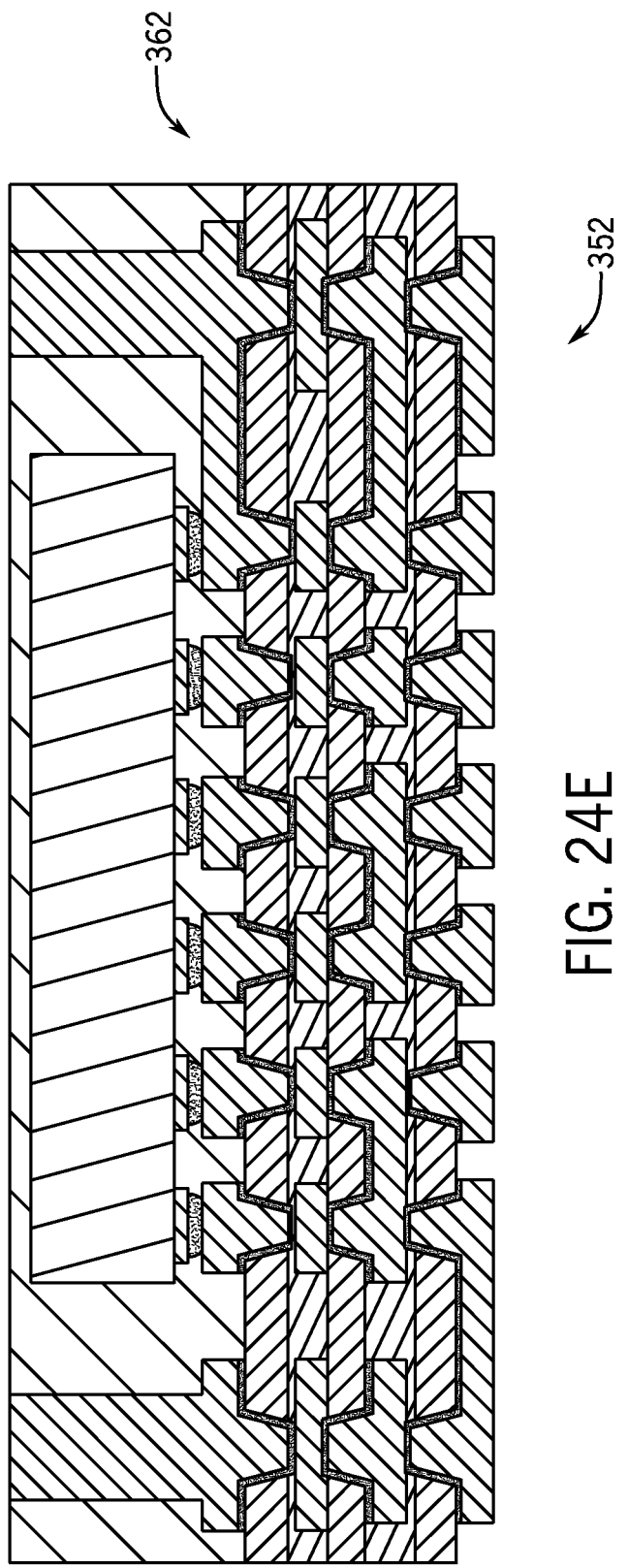

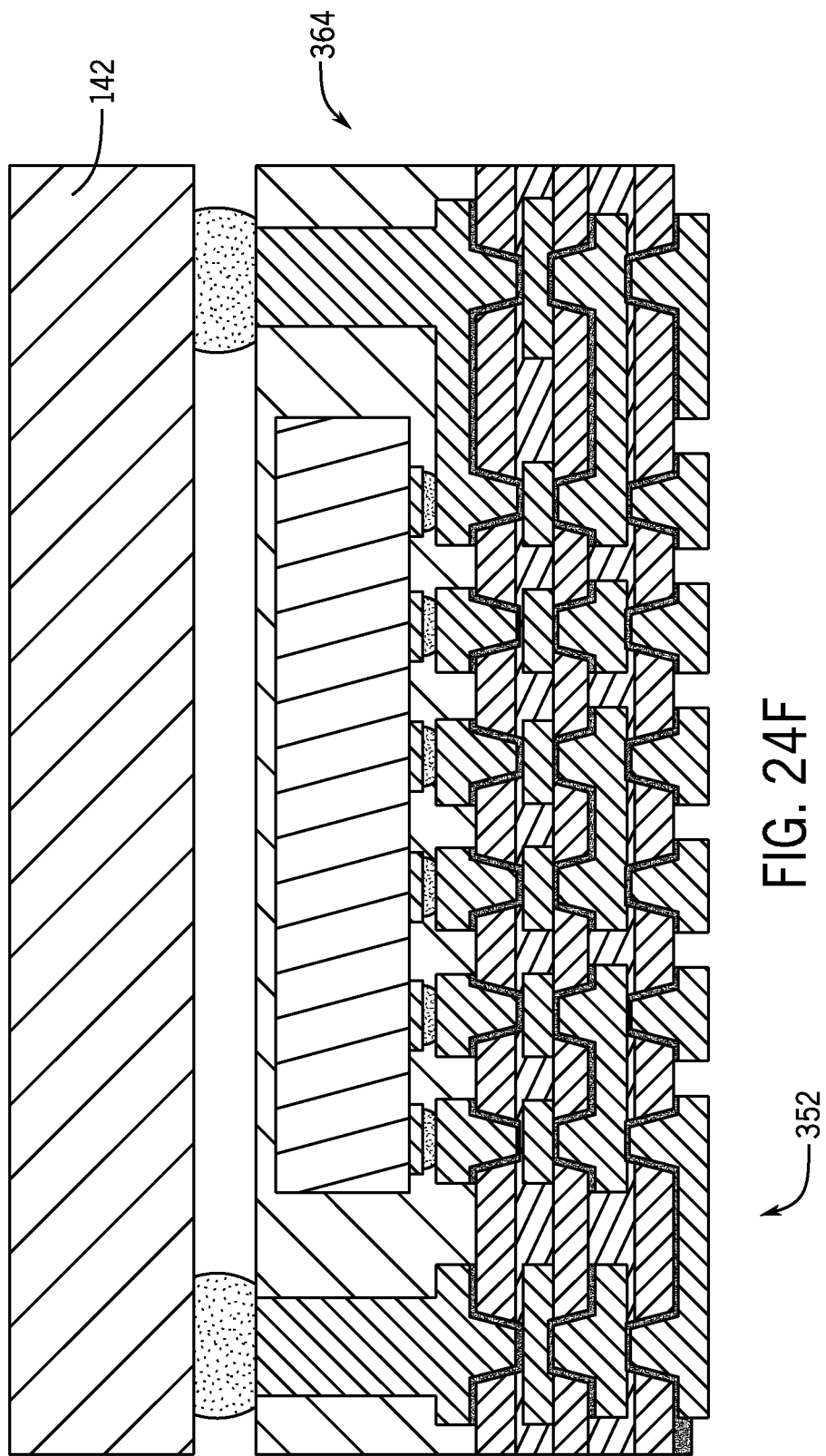

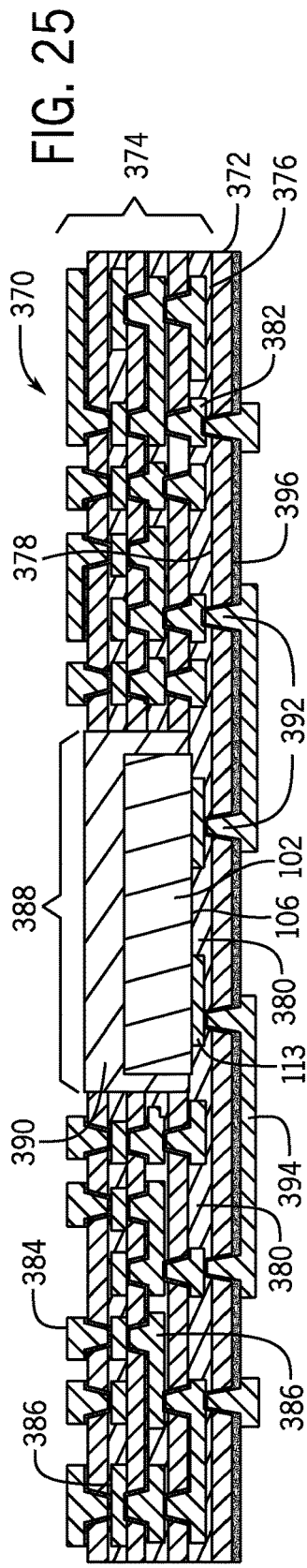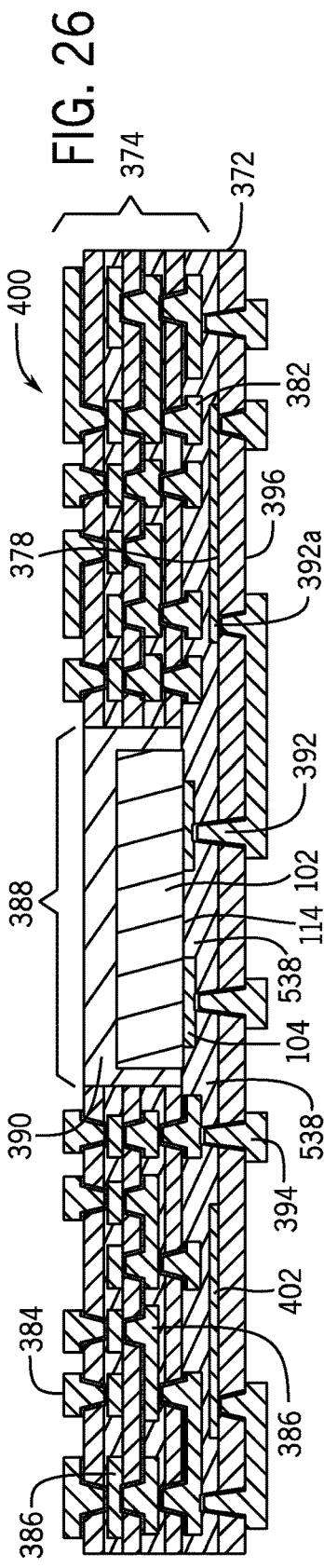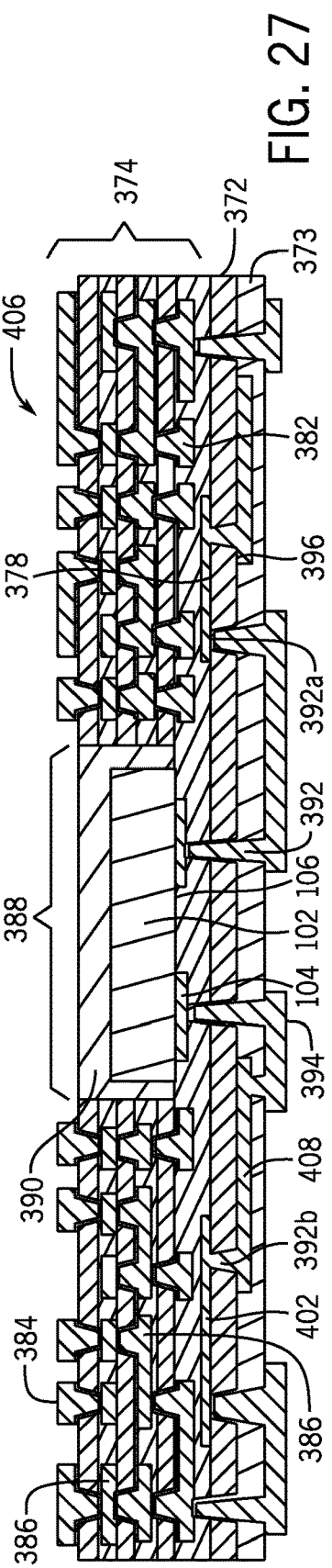

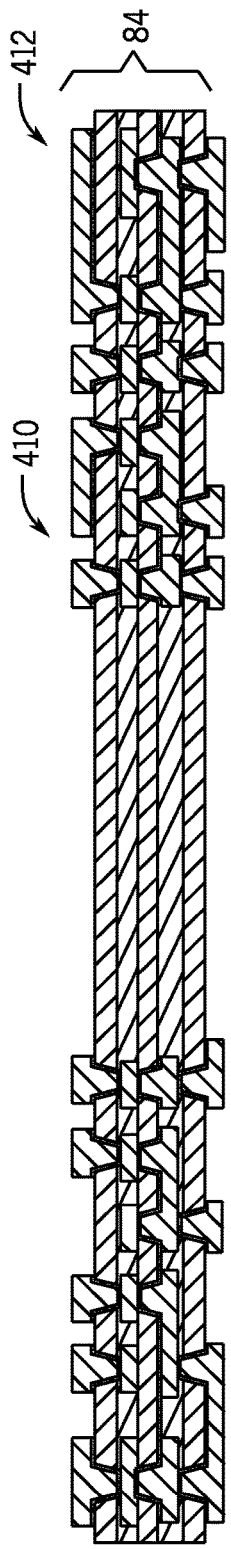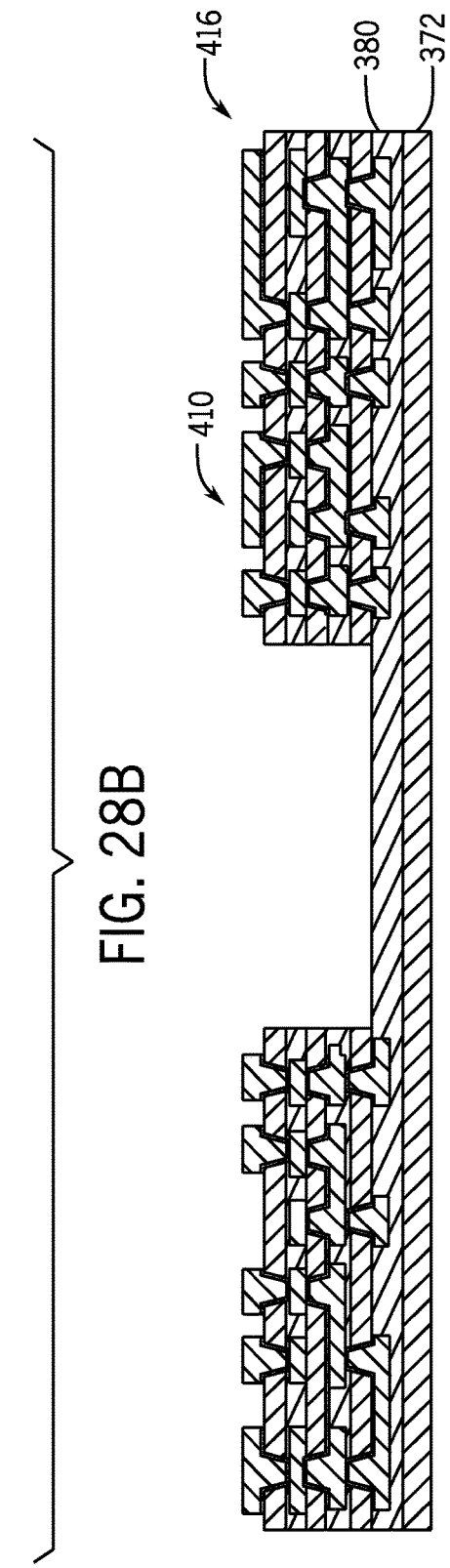

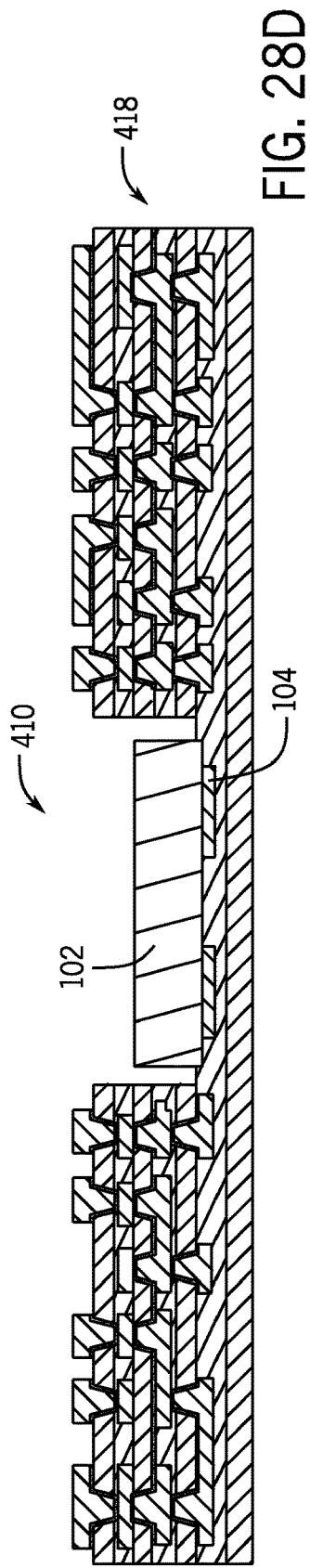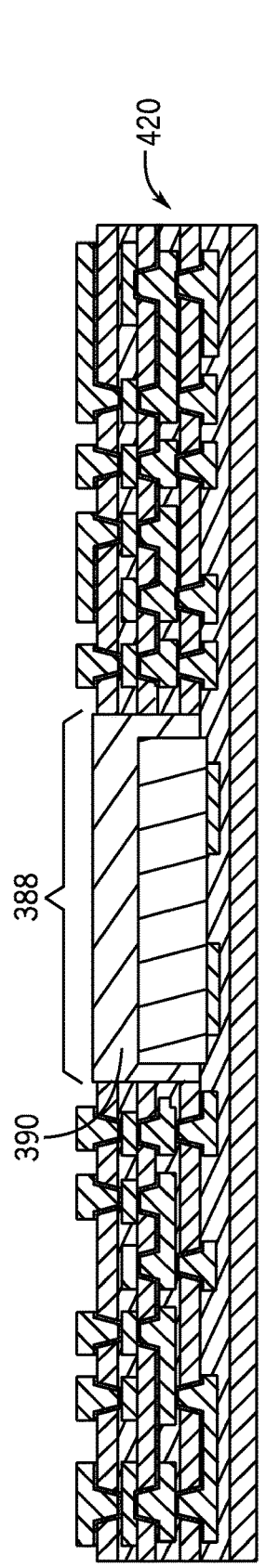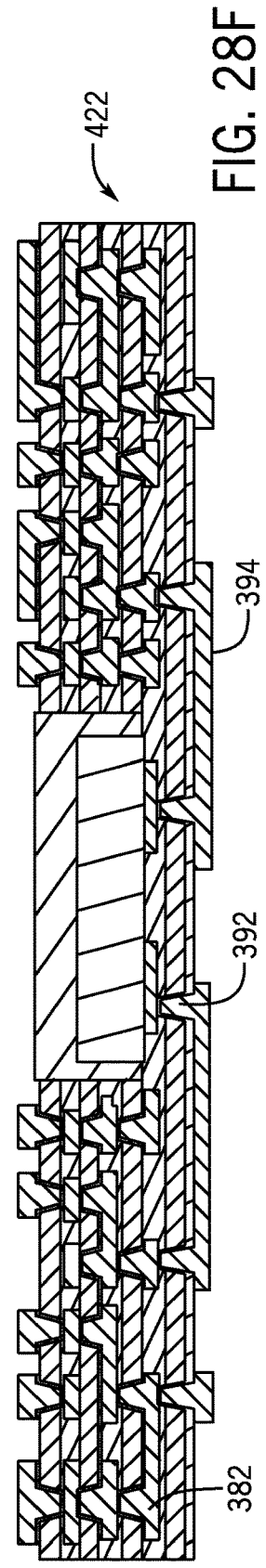

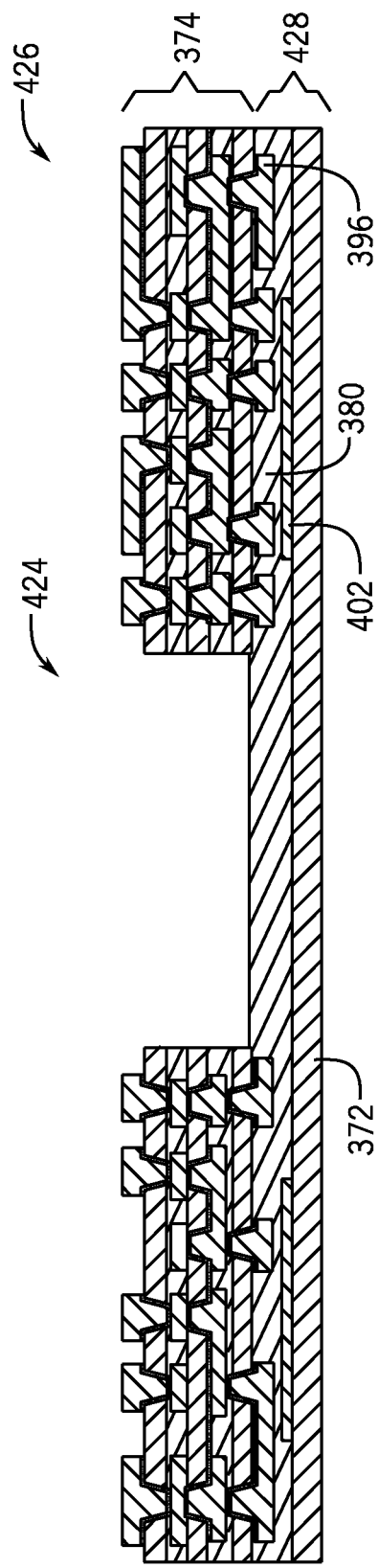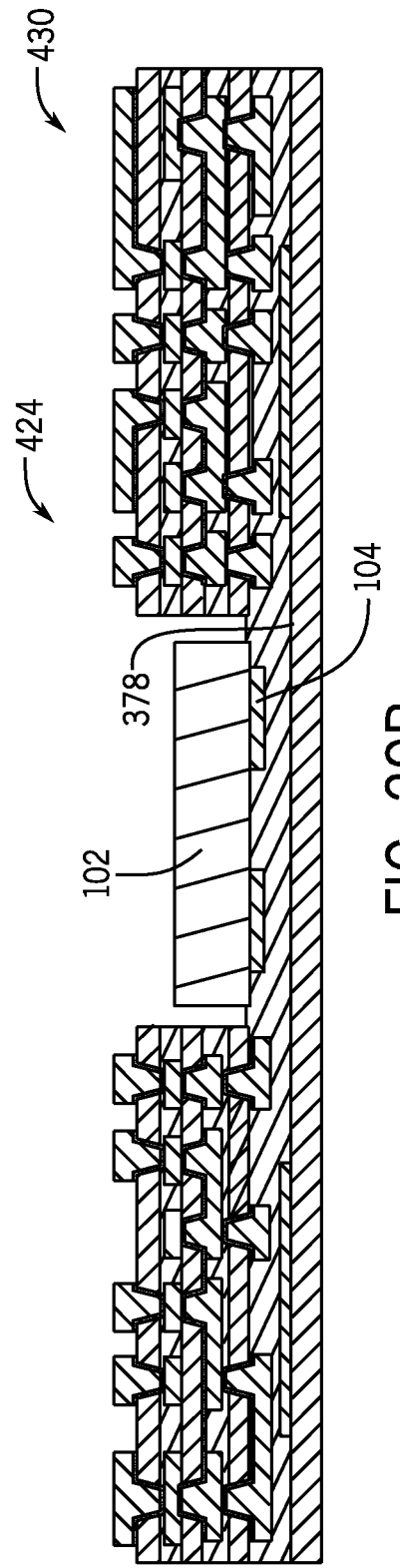

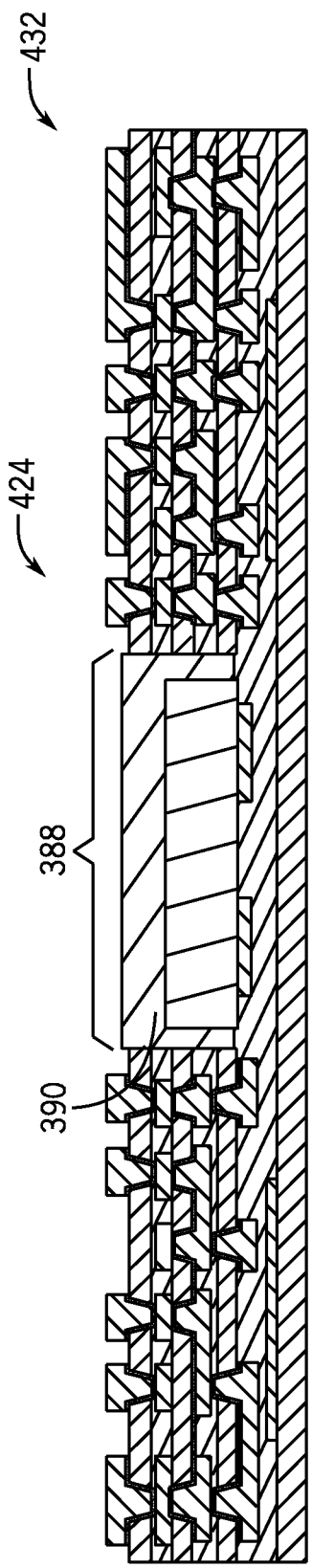
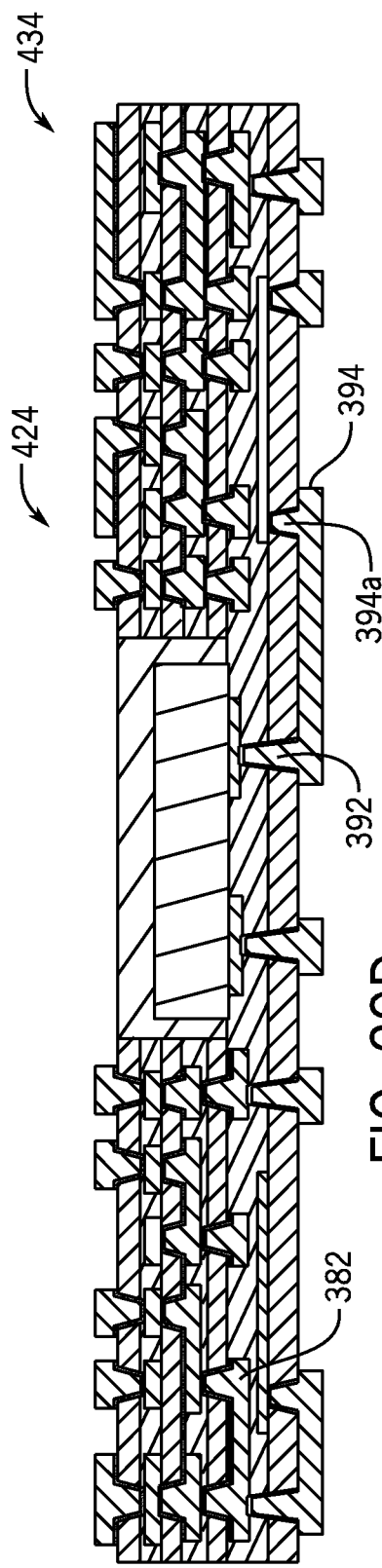
FIG. 29C
FIG. 29D

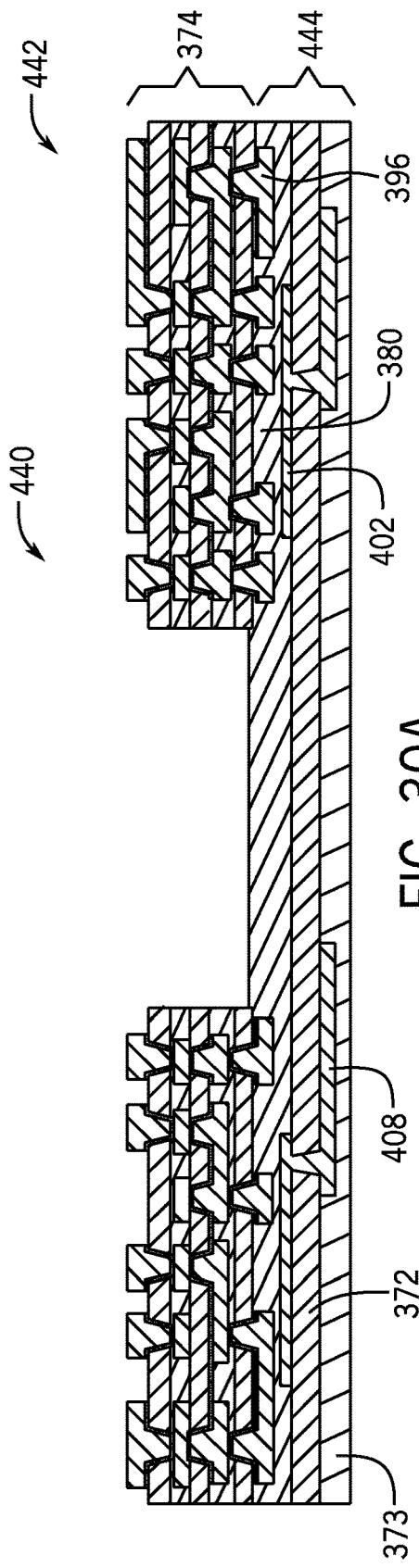
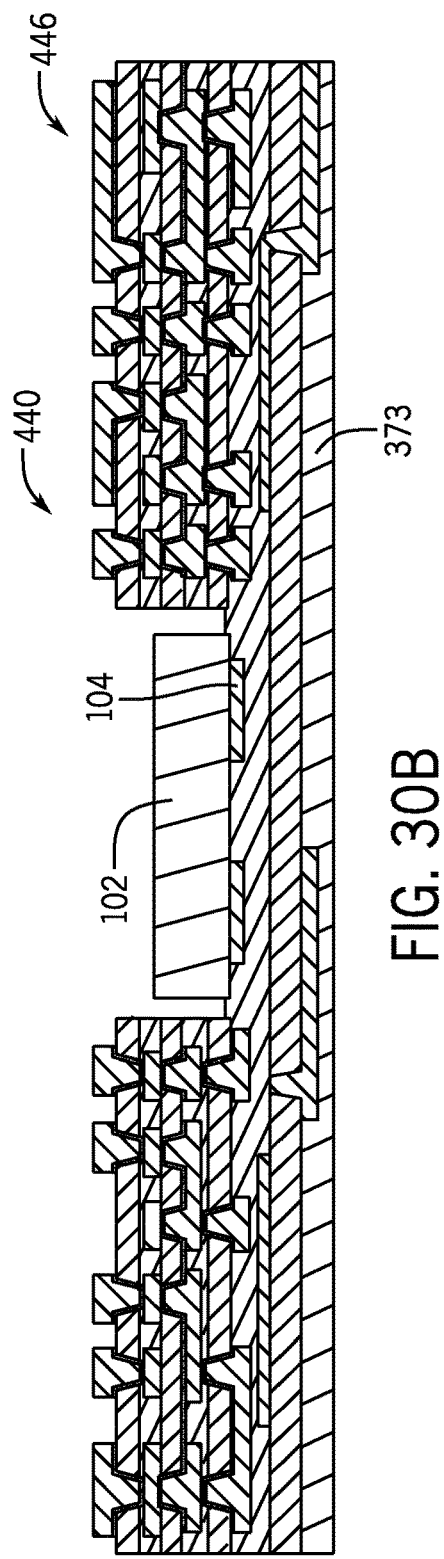
FIG. 30A
FIG. 30B

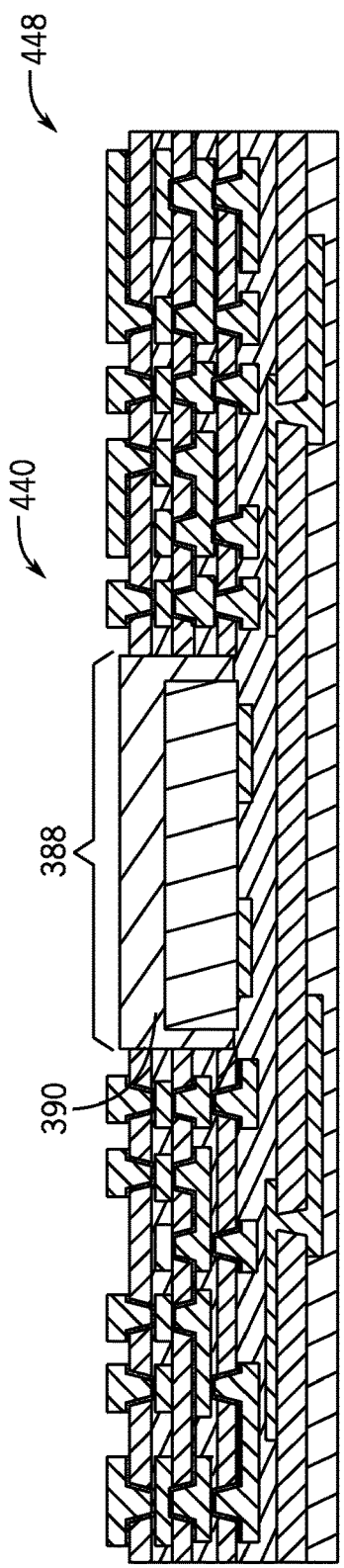
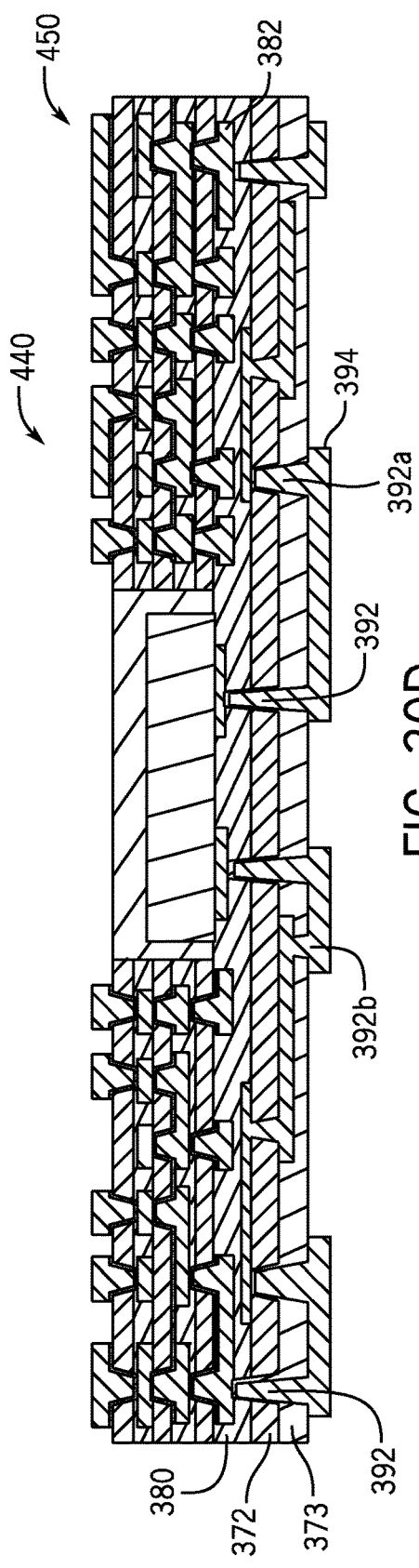
FIG. 30C
FIG. 30D

METHOD OF MANUFACTURING AN ELECTRONICS PACKAGE USING DEVICE-LAST OR DEVICE-ALMOST LAST PLACEMENT

BACKGROUND OF THE INVENTION

Embodiments of the invention relate generally to semiconductor device packages or electronics packages and, more particularly, to multi-layer fan-out wafer level packages and embedded multi-chip assemblies and methods of manufacturing thereof. The method enables the handling of thin substrate materials that typically are not used in multilayer structures in a panel process, and uses a device-last attach or device-almost last attach that minimizes yield losses associated with fine line interconnect from the loss of good devices due to interconnect losses.

State of the art electronics packaging covers a wide range of methods, structures and approaches from wire bond modules to flip chip modules and to embedded chip modules. Wire bonded modules are a mature packaging approach that is low cost but with limited electrical performance. These modules use wires bonded to chip pads to connect the top input/output (I/O) pads of power devices to an interconnect structure such as a metal-insulator-metal substrate such as ceramic, AlN or SiC substrate with patterned metal on top and bottom. An exemplary construction of a prior art wire bond electronics package 10 is illustrated in FIG. 1 with two power semiconductor devices 12 mounted onto a multilayer substrate 14 using die attach material 16—with the multilayer substrate 14 including bond pads 18, buried wiring layers 20, back side wiring 22, dielectric layers 24, microvias 26, and through holes 28. Wire bonds 30 connect die pads 32 located on the active surface 34 of semiconductor devices 12 to selected areas on the multilayer substrate 14, such as bond pads 18. Molding resin 36 encapsulates the semiconductor devices 12 and the wire bonds 18 and exposed portions of multilayer substrate 14. Wire bonds 18 have inherently high inductance, generally high series resistance, current crowning on the bond pads, and microcracking within the semiconductor devices 12 near bonding sites.

Prior art flip chip modules experience reduced semiconductor substrate damage as compared to wire bond packages, with flip chip modules using solder bumps that have larger current carrying cross-sections than wire bonds. A general construction of a prior art flip chip electronics package 40 is illustrated in FIG. 2, with two semiconductor devices 12 attached to a multilayer substrate 14. The multilayer substrate 14 includes terminal pads 18, buried wiring layers 20, back side wiring 22, dielectric layers 24, microvias 26 and through holes 28. The two semiconductor devices 12 are attached to terminal pads 18 by means of flip chip solder bumps 42. Molding resin 36 encapsulates the semiconductor devices 12. While flip chip modules such as that illustrated in FIG. 2 provide some advantages over wire bond technology, the flip chip solder bumps have poor electrical conductivity, are susceptible to solder fatigue, and provide a very poor thermal cooling pathway.

Embedded chip modules and Fan-Out Wafer Level Packages (WLPs) are packaging approaches that address the limitations of wire bond and flip chip packages by eliminating wire bonds and solder bumps and replacing them with direct metallization contacts. Embedded chip modules and Fan-Out WLPs are moving into the mainstream of microelectronics packaging for low and mid-complexity semiconductor devices, with these approaches being driven by the latest portable electronics devices, such as smart phones, as each new generation of smart phones puts more function into a smaller space with the requirement that the electronics consume less power. Embedded chip modules combine multiple electronic devices, such as semiconductor chips, capacitors, resistors and/or inductors in a common package using direct chip interconnects. Fan-Out WLPs embed one semiconductor chip under an interconnect structure that fans out the chip I/O terminals from the restricted area of the chip surface to a larger footprint. This allows device I/O pitch to be relaxed to a larger I/O terminal pitch that facilitates attachment to a printed circuit board (PCB).

An example embedded device module 46 is illustrated in FIG. 3A, such as might be fabricated using General Electric Company's power overlay (POL) technology. In the embedded device module 46 of FIG. 3, two semiconductor devices 12 are attached to an overlay dielectric structure 14. The overlay dielectric structure 14 has two dielectric layers 48 with first micro-via connections 50 formed through the lowest of dielectric layers 48 to die pads 32 of semiconductor devices 12 and connecting them to buried wiring layer 44, and with second microvia connections 52 formed through the upper dielectric layer 48 to buried wiring layer 20 and connecting to topside wiring layer 54. Molding resin 36 encapsulates the semiconductor devices 12.

A general construction of a prior art Fan-Out Wafer Level Package (WLP) 56 is depicted in FIG. 3B, with one semiconductor device 11 molded into a resin material 36. An overlay dielectric structure 14 lies over the active surface 34 of the semiconductor device 12 and the top surface 58 of resin material 36. Generally, the process of forming the Fan-Out WLP 56 starts with embedding semiconductor device 12 in resin material 36, with top surface 58 of resin material 36 level with active surface 34 of semiconductor device 12. A first overlay dielectric layer 14a is then applied over the active surface 34 of semiconductor device 12 and the top surface 58 of resin material 36. Next, microvias are formed in the first overlay dielectric layer 14a to die pads 32 and optionally, to optional feed through conductors 60 that may be embedded in the resin material 36. First wiring layer 20 is applied to the first overlay dielectric layer 14a and into the microvias to form first microvia connections 50 to die pads 32. Second overlay dielectric layer 14b is applied to first overlay dielectric layer 14a and first wiring layer 20. Microvias are then formed in the second overlay dielectric layer 14b to portions of first wiring layer 20. Top side wiring layer 54 is applied to the second overlay dielectric layer 14b and into the microvias and forms second microvia connections 52 to exposed portions of first wiring layer 20. Additional overlay dielectric layers and wiring layers can be applied as needed for more complex, higher I/O pad count devices.

Beneficially, an embedded device module provides reduced parasitics (e.g., resistance capacitance and inductance), superior thermal performance, faster operation, and lower power dissipation than wire bond modules or flip chip modules, but is also more complex, less mature, and more costly with lower module yields, while Fan-Out WLPs allow a device I/O pitch to be relaxed to a larger I/O terminal pitch, to facilitate attachment of the device to a printed circuit board (PCB) and thereby reduce PCB complexity, lower its costs, and increase its yields. However, it is recognized that one of the key limitations with embedded device technology and Fan-Out WLP into more complex devices with higher I/O count, is the yield loss associated with the interconnect structure. The interconnect structure in embedded and Fan-Out devices is fabricated after the electronic devices have been incorporated into the structure. All interconnect structures have yield losses caused by opens, shorts, and latent defects. These defects get worse when line widths, line spacing, and via diameters are reduced as device I/O count increase. Wire bond modules and flip chip modules are chips last structures, where the chips are only mounted onto the interconnect substrate if the substrate is free of interconnect defects, and thus are not committed to substrates with bad interconnects. With chips first embedded chip modules and Fan-Out WLPs, the chip is mounted to the interconnect structure before the interconnect structure is complete and tested to verify that it is defect free. A defect that occurs after the chip is committed will cause the chip to be discarded along with the defective interconnect structure, resulting in a higher chip yield loss that chip last approaches. The interconnect yield loss inherently increases as the complexity of the chip and the required interconnect structure increase, as happens with chips with higher I/O counts.

Accordingly, it would be desirable to provide a new interconnect structure and associated manufacturing process that can provide the advantages of an embedded chip module and/or a Fan-Out WLP device without the costly loss of good chip due to a defective interconnect structure.

BRIEF DESCRIPTION OF THE INVENTION

In accordance with one aspect of the invention, a method of manufacturing a multi-layer electronics package via a double-sided build-up includes attaching a base insulating substrate to a frame having an opening therein and such that the frame is positioned above and/or below the base insulating substrate to provide support thereto, the base insulating substrate comprising a first side and a second side opposite the first side. The method also includes applying a first conductive wiring layer on the first side of the base insulating substrate, forming vias in the base insulating substrate extending from the second side to the first side to expose portions of the first conductive wiring layer, forming a second conductive wiring layer on the second side of the base insulating substrate that covers the vias and the exposed portions of the first conductive wiring layer, and bonding at least one additional insulating substrate to the base insulating substrate, the at least one additional insulating substrate being bonded to at least one of the first side and the second side of the base insulating substrate. The method further includes forming vias in each of the at least one additional insulating substrate to expose regions of at least one of the first conductive wiring layer and the second conductive wiring layer; and forming an additional conductive wiring layer on each of the at least one additional insulating substrate that covers the vias formed therein and the exposed regions of the at least one of the first conductive wiring layer and the second conductive wiring layer, wherein the base insulating substrate, the first and second conductive wiring layers, the at least one additional insulating substrate, and the additional conductive wiring layer form a multilayer interconnect structure, with the frame providing support for the manufacturing of the multi-layer electronics package, including the via formation and the first, second, and additional conductive wiring layer formation.

In accordance with another aspect of the invention, a method of manufacturing, a method of manufacturing an interconnect structure includes attaching a base insulating substrate to a perimeter frame having an opening therein, the base insulating substrate having a thickness of between 5 to 50 micrometers and comprising a first side and a second side opposite the first side. The method also includes applying a first conductive wiring layer on the first side of the base insulating substrate, forming vias in the base insulating substrate extending from the second side to the first side to expose portions of the first conductive wiring layer, and forming a second conductive wiring layer on the second side of the base insulating substrate that covers the vias and the exposed portions of the first conductive wiring layer, wherein the frame comprises a clamp-type frame positioned above and below the base insulating substrate to hold the base insulating substrate therebetween and provide support thereto for the manufacturing of the interconnect structure, including the via formation and the first and second conductive wiring layer formation.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 1 is a schematic cross-section side view of a prior art multichip electronics package incorporating wire bonds.

FIG. 2 is a schematic cross-section side view of a prior art multichip electronics package incorporating solder bumps.

FIG. 4 is a schematic cross-section side view of a core interconnect structure, according to an embodiment of the invention.

FIG. 5 is a schematic cross-section side view of a multilayer interconnect structure, according to an embodiment of the invention.

FIG. 10 is a schematic cross-section side view of an electronics package, according to another embodiment of the invention.

FIG. 11 is a schematic cross-section side view of an electronics package, according to yet another embodiment of the invention.

FIGS. 22A-22E are schematic cross-section side views of a process for fabricating the electronics packages as depicted in FIGS. 6-9, according to an embodiment of the invention.

FIGS. 23A-23I are schematic cross-section side views of a process for fabricating the electronics packages as depicted in FIGS. 10 & 11, according to an embodiment of the invention.

FIGS. 24A-24F are schematic cross-section side views of a process for fabricating the electronics packages as depicted in FIGS. 12 & 13, according to an embodiment of the invention.

FIG. 25 is a schematic cross-section side view of an electronics package, according to an embodiment of the invention.

FIG. 26 is a schematic cross-section side view of an electronics package, according to an embodiment of the invention.

FIG. 27 is a schematic cross-section side view of an electronics package, according to an embodiment of the invention.

FIGS. 28A-28F are schematic cross-section side views of a process for fabricating the electronics package as depicted in FIG. 25, according to an embodiment of the invention.

FIGS. 29A-29D are schematic cross-section side views of a process for fabricating the electronics package as depicted in FIG. 26, according to an embodiment of the invention.

FIGS. 30A-30D are schematic cross-section side views of a process for fabricating the electronics package as depicted in FIG. 27, according to an embodiment of the invention.

DETAILED DESCRIPTION

Figure 3A:
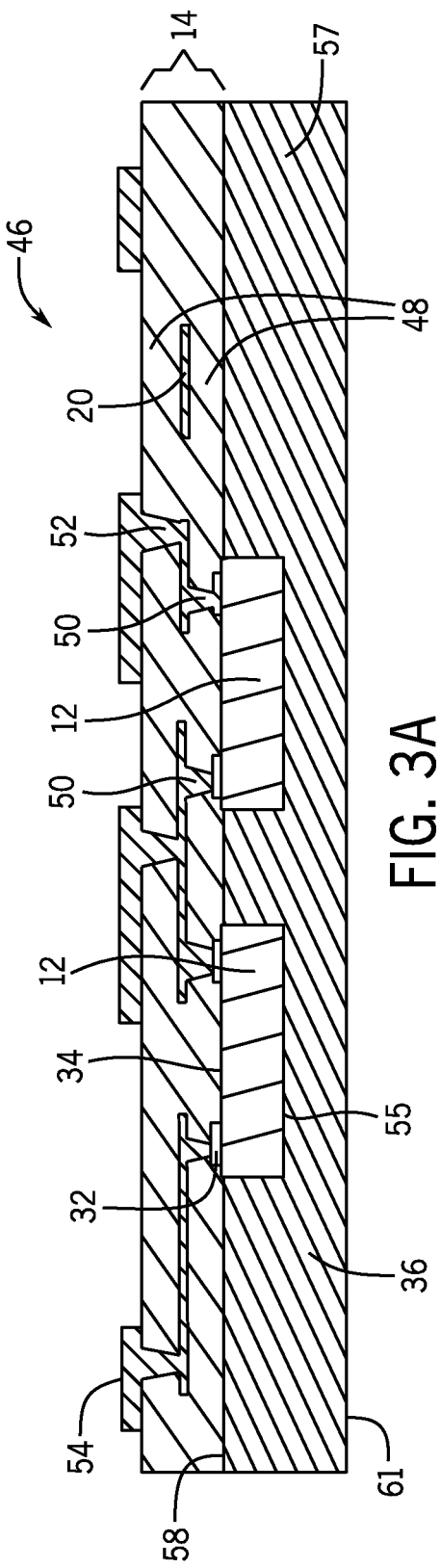
FIG. 3A is a schematic cross-section side view of a prior art multichip electronics package incorporating embedded chip technology.
Figure 3B:
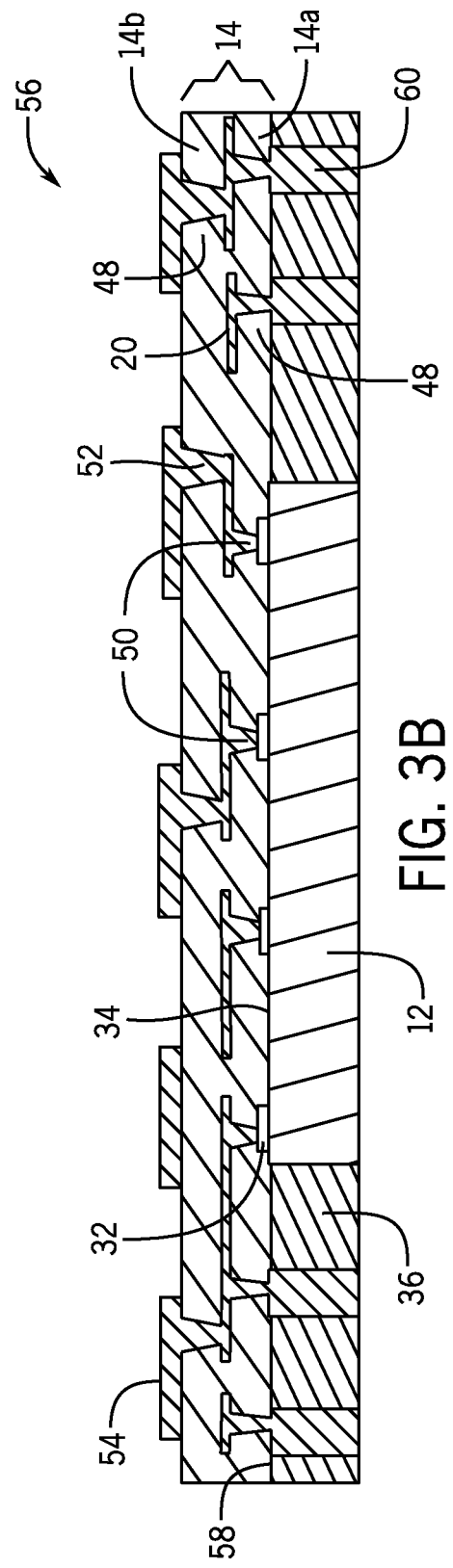
FIG. 3B is a schematic cross-section side view of a prior art Fan-Out WLP electronics package incorporating embedded chip technology.

Embodiments of the present invention provide a device-last or device-almost last method of manufacturing an electronics package or module and resulting electronics package that includes a semiconductor device attached to a fine-line build-up multilayer flex substrate, with the build-up multilayer flex structure having multiple dielectric layers, multiple wiring layers with narrow line widths and narrow line to line spaces, and small microvias connecting adjacent wiring layers in the flex structure. Embodiments of the invention therefore provide for an electronics package or module that includes high electrical conductivity connections from the semiconductor device to the electronics package terminals and provides a direct thermal path with low thermal conductivity. The semiconductor device is embedded in an insulating resin that provides a low cost environmental protection for high reliability. The electronics package can be surface mounted onto a substrate or placed within a multi-component module for complex circuits.

As used herein, the term "semiconductor device" refers to a semiconductor component, device, die or chip that perform specific functions such as a power transistor, power diode, analog amplifier, RF element, as non-limiting examples. Typical semiconductor devices include input/output (I/O) interconnections, referred to herein as contacts or contact pads, which are used to connect the semiconductor device to external circuitry and are electrically coupled to internal elements within the semiconductor device. The semiconductor devices described herein may be power semiconductor devices used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). Semiconductor devices may also be digital logic devices, such as a microprocessor, microcontroller, memory device, video processor, or an Application Specific Integrated Circuit (ASIC), as non-limiting examples.

While the various embodiments of an electronics package referenced below are shown and described as including a particular arrangement of a semiconductor device, interconnection wiring, and electronics package terminals, it is understood that alternative arrangements and configurations could also be implemented and thus embodiments of the invention are not limited only to the specifically illustrated devices and arrangements thereof. That is, the electronics package embodiments described below should also be understood to encompass electronics packages that might include additional electronic components and/or one or more alternative device types of semiconductor devices including acoustic devices, microwave devices, millimeter devices, RF communication devices, and micro-mechanical (MEMS) devices. The electronics packages described herein may also include one or more resistors, capacitors, inductors, filters, and similar devices and combinations thereof. As used herein the term "electrical component" may be understand to encompass any of the various types of semiconductor devices described above in addition to resistors, capacitors, inductors, filters and similar passive devices, and energy storage components (e.g., batteries).

FIGS. 4 and 5 illustrate schematic cross-sectional views of multilayer dielectric film structures according to embodiments of the invention. Each of the multilayer dielectric film structures may be used as part of an electronics package that includes one or more semiconductor devices electrically and mechanically coupled to the multilayer dielectric film structure. The multilayer dielectric film structures may be used in a device-last or device-almost last package fabrication process, as will be further described below according to additional embodiments of the invention.

Referring first to FIG. 4, a core interconnect structure 70 has a base insulating substrate 72 with multiple microvias 74 passing from bottom surface 76 to top surface 78. According to various embodiments, base insulating substrate 72 may be provided in the form of an insulating film or dielectric substrate, such as for example a Kapton® laminate flex, although other suitable electrically insulating materials may also be employed, such as Ultem®, polytetrafluoroethylene (PTFE), or another polymer film, such as a liquid crystal polymer (LCP) or a polyimide substrate, as non-limiting examples. A first conductive wiring layer 80 is provided and formed on top surface 78 of base insulating substrate 72, and a second conductive wiring layer 82 is on a bottom surface 76 of base insulating substrate 72. The second conductive wiring layer 82 is formed so as to extend down into microvias 74 formed through base insulating substrate 72 and makes electrical connection to portions of first conductive wiring layer 80. Core interconnect structure 70 can be used as a two interconnect layer flex structure as is or can be further processed to by adding additional interconnect layers, as described in further detail below.

Referring now to FIG. 5, a multilayer interconnect structure 84 has as its core, core interconnect structure 70 depicted in FIG. 4. A first insulating substrate 86 is bonded to the top surface 78 of base insulating substrate 72 and first conductive wiring layer 80 with an adhesive or joining material 88. A second insulating substrate 90 is bonded to the bottom surface 76 of base insulating substrate 72 and second conductive wiring layer 82 with adhesive 88. Upper microvias 92 are formed through first insulating substrate 86 to first conductive wiring layer 80. A third conductive wiring layer 94 is formed on the outer surface of second insulating substrate 90 and into upper microvias 92, making electrical connection to portions of first conductive wiring layer 80. Lower microvias 96 are formed through second insulating substrate 90 to second conductive wiring layer 82. A fourth conductive wiring layer 98 is formed on the outer surface of second insulating substrate 90 and into lower microvias 96, making electrical connection to portions of second conductive wiring layer 82. The multilayer interconnect structure 84 in FIG. 5 can be used as a four-interconnect layer flex structure, as is, or can be further processed by adding additional interconnect layers or by incorporation of other elements to form an electronics package as described in further detail below.

As can be seen in FIG. 5, the manufacturing of multilayer interconnect structure 84 is performed as a double-sided build-up off of core interconnect structure 70, with first and second insulating substrates 86, 90 being applied on opposing sides of base insulating substrate 72 and the third and fourth conductive wiring layers 94, 98 then being formed thereon. As a double-sided build-up is employed for the manufacturing of multilayer interconnect structure 84, microvias 74, 92, 96 are formed from differing directions—with the upper microvias 92 being formed from a first direction (top-down) and the microvias 74 and lower microvias 96 being formed from a second direction (bottom-up). This double-sided build-up thus results in upper microvias 92 being formed with angled side surfaces that are oriented in a first direction and microvias 74 and lower microvias 96 being formed with angled side surfaces that are oriented in a second direction opposed/opposite to the first direction, with the microvias 74, 92, 96 then being metallized to form conductive wiring layers 80, 82, 94, 98 extending through the vias in differing directions and being formed on opposing surfaces of the first and second insulating substrates 86, 90. Alternatively, it is recognized that a sequential build-up process could be used in manufacturing multilayer interconnect structure 84 rather than a double-sided build-up.

Referring now to FIGS. 6-13, schematic cross-sectional views of electronics packages that include a semiconductor device are illustrated, according to embodiments of the invention. With regard to the embodiments illustrated in FIGS. 6-13, it is recognized that the core interconnect structure 70 of FIG. 4 and/or the multilayer interconnect structure 84 depicted in FIG. 5 may be integrated into the various electronics packages thereof, and that the electronics packages are built off of the core interconnect structure 70 and/or multilayer interconnect structure 84 using a device-last technique.

Figure 6:
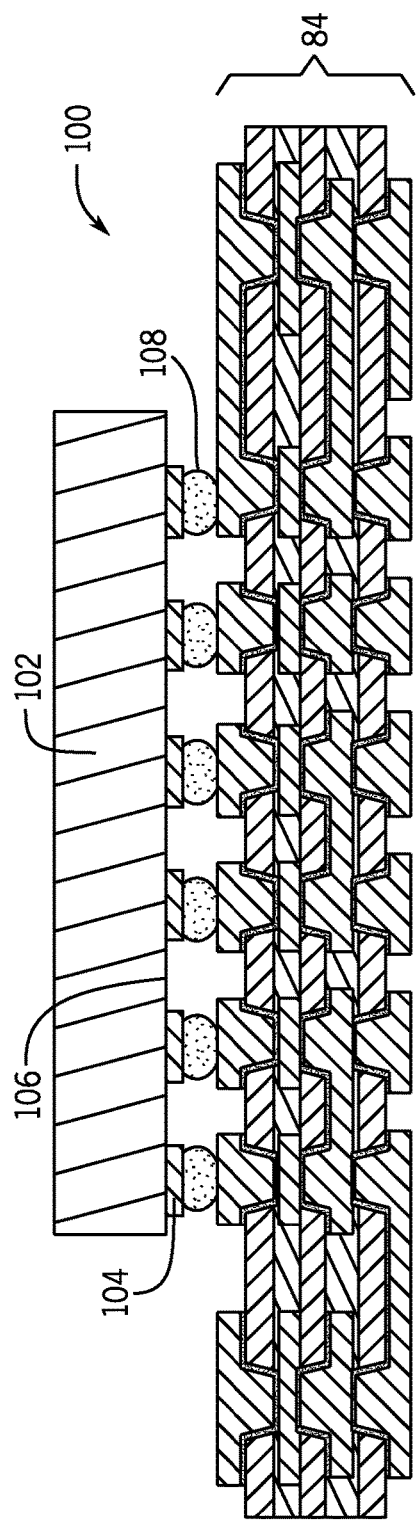
FIG. 6 is a schematic cross-section side view of an electronics package, according to an embodiment of the invention.

Referring first to FIG. 6, an electronics package 100 is illustrated that includes a semiconductor device 102 attached to multilayer interconnect structure 84. Semiconductor device 102 has I/O pads 104 on its active surface 106. Interconnect elements 108 electrically connect the I/O pads 104 to portions of the third conductive wiring layer 94. Electronics package 100 can be used as a Fan-Out WLP or can be further processed for more complex assemblies, as will be described in further detail later on.

Figure 7:
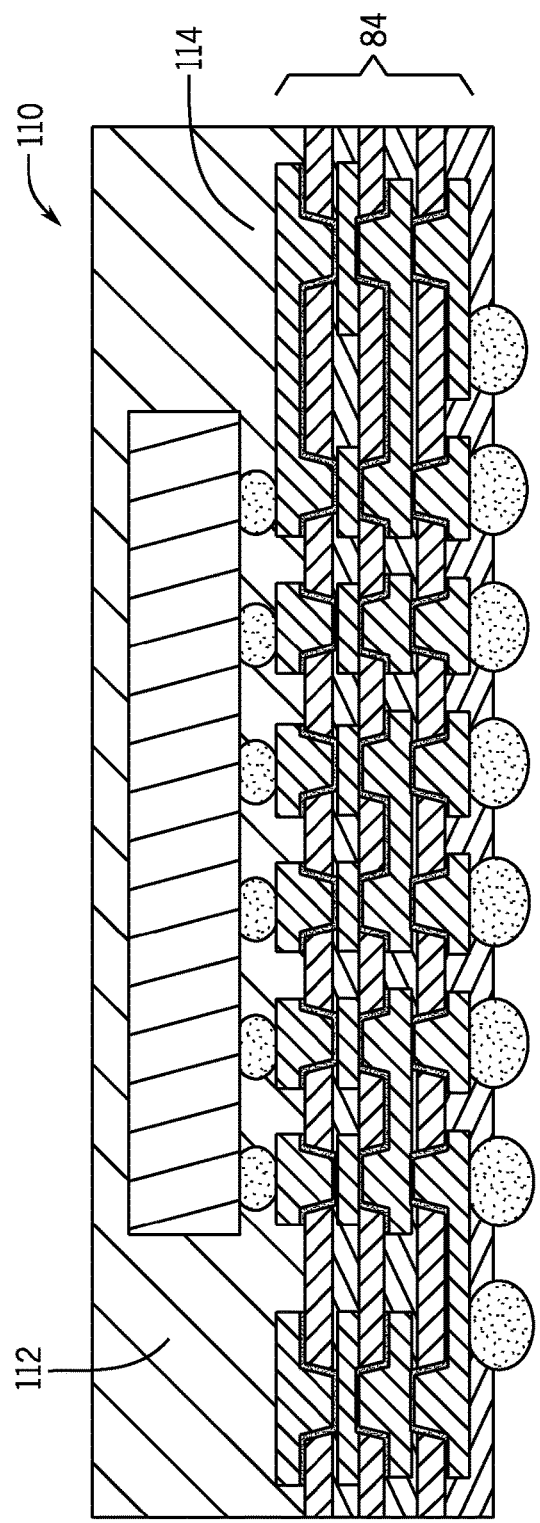
FIG. 7 is a schematic cross-section side view of an electronics package, according to another embodiment of the invention.

Referring now to FIG. 7, an electronics package 110 is illustrated that is formed out of electronics package 100 with the addition of a resin material 112. Resin material 112 encapsulates the semiconductor device 102 and an upper surface 114 of the multilayer interconnect structure 84, and forms the body of the electronics package 110.

Figure 8:
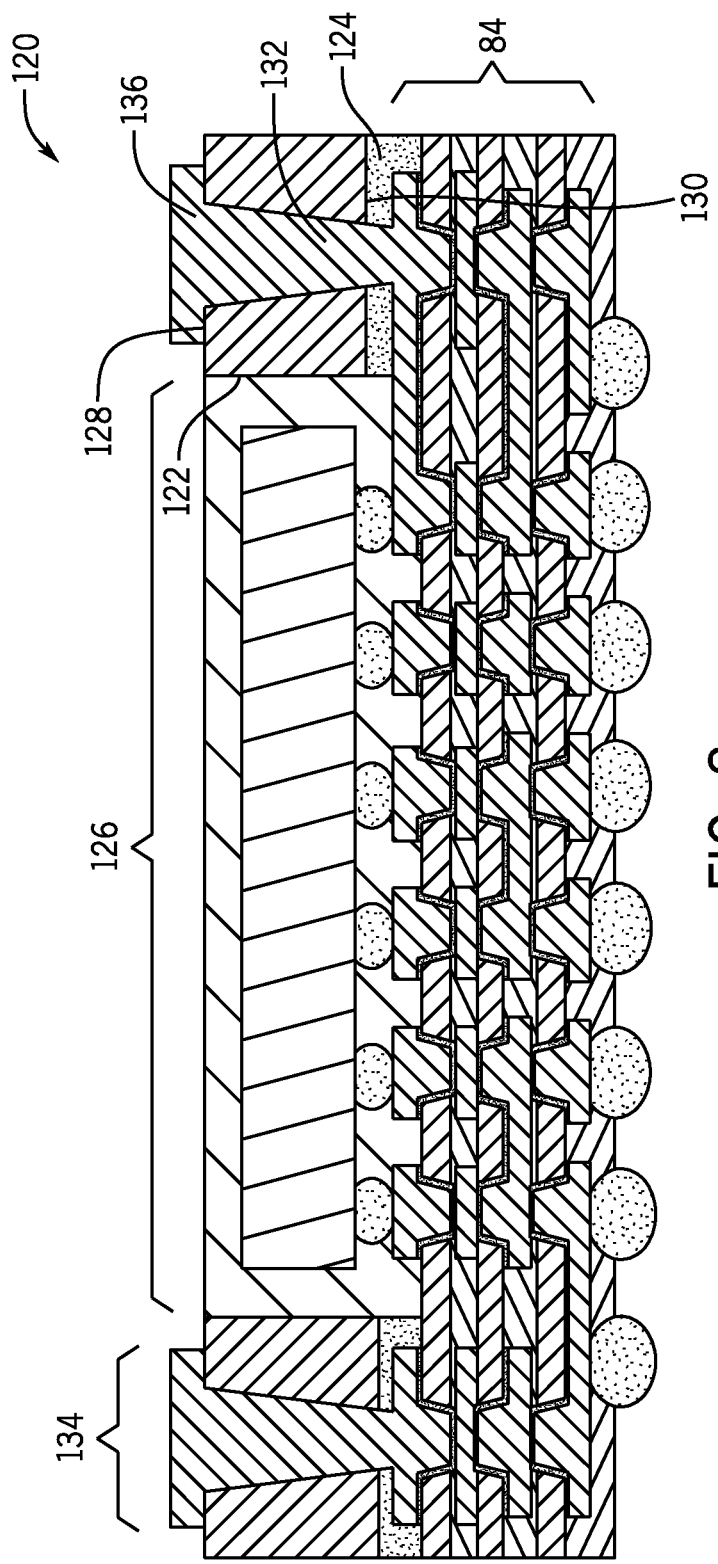
FIG. 8 is a schematic cross-section side view of an electronics package, according to another embodiment of the invention.

Referring now to FIG. 8, an electronics package 120 is illustrated that is formed out of electronics package 100 with the addition of a core board 122 attached to the upper surface 114 of the multilayer interconnect structure 84 with adhesive 124. The core board 122 includes an opening 126 extending from its top surface 128 to its bottom surface 130 for accommodating semiconductor device 102. The core board 122 has vias 132 that extend from a top surface 128 thereof through a bottom surface 130 in its perimeter regions 134 and extend to third conductive wiring layer 94 of the multilayer interconnect structure 84. Top side terminals 136 overlay the vias 132, which electrically interconnect the topside terminals 136 to third conductive wiring layer 94 of the multilayer interconnect structure 84. Resin material 112 fills opening 126 and encapsulates semiconductor device 102. The combination of the core board 122 and the resin material 112 form the body of the electronics package 120.

Figure 9:
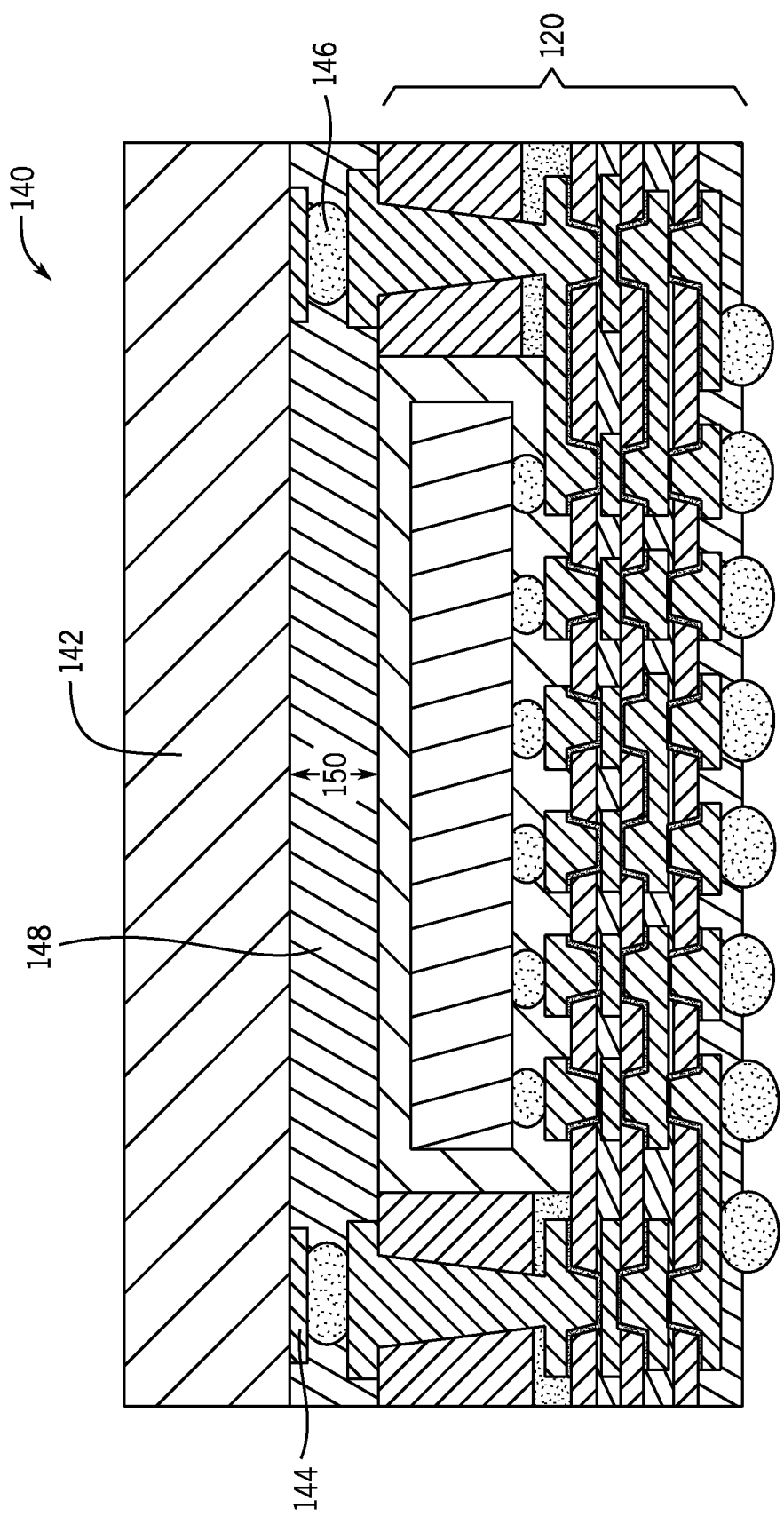
FIG. 9 is a schematic cross-section side view of an electronics package, according to an embodiment of the invention.

Referring now to FIG. 9, an electronics package 140 is illustrated that is formed out of electronics package 120 with the addition of a topside package 142—thereby forming a package-on-package (POP) structure. The topside package 142 has bottom side I/O pads 144. The topside package 142 can be an electronics component such as, for example, a molded chip carrier, a multichip module, a 3D die stack module, or the like, and is attached to the electronics package 120 by, for example solder bumps 146. An underfill resin 148 can be used to encapsulate the solder bumps 146 and fill the gap 150 between topside package 142 and the top surface 128 of the core board 122.

Referring now to FIG. 10, an electronics package 152 is illustrated that includes the core interconnect structure 70 depicted in FIG. 4. A core board 154 is attached to the top surface of the base insulating substrate 72 after first conductive wiring layer 80 is provided and formed on top surface 78 of base insulating substrate 72, with core board 154 being attached via an adhesive 156. The core board 154 includes conductive feed through holes 158 electrically tied to topside terminals 160 and bottom side terminals 162 and an opening 164 through the core board 154 that is positioned to accommodate semiconductor device 102. As can be seen in FIGS. 4-7, and while still referring to FIG. 10, perimeter microvias 74 in core interconnect structure 70 connect the second conductive wiring layer 82 of core interconnect structure 70 to bottom side terminals 162, and the semiconductor device 102 is attached to core interconnect structure 70. The second insulating substrate 90 is bonded to the bottom surface 76 of base insulating substrate 72 and second conductive wiring layer 82 with adhesive 88. Lower microvias 96 are formed through second insulating substrate 90 to second conductive wiring layer 82. Bottom conductive wiring layer 98 is on the outer surface of second insulating substrate 90 and extends into lower microvias 96, making electrical connection to portions of second conductive wiring layer 82. The semiconductor device 102—with I/O pads 104 on its active surface 106—is mounted within the opening 164 with its active surface 106 face down. Interconnect elements 108 electrically connect the I/O pads 104 to portions of the first conductive wiring layer 80. The resin material 112 fills opening 164 and encapsulates semiconductor device 102, with the combination of the core board 154 and the resin material 112 forming the body of the electronics package 152.

Referring now to FIG. 11, an electronics package 170 is illustrated that is formed out of the electronics package 152—with the addition of a topside package 172 forming a package-on-package (POP) structure. The topside package 172 has bottom side I/O pads 174. Topside package 172 can be an electronics component such as for example a molded chip carrier, a multichip module, a 3D die stack module, or the like, and is attached to the electronics package 152 by, for example solder bumps 176. An underfill resin 178 can be used to encapsulate solder bumps 176 and fill gap 180 between topside package 172 and the top surface of the core board 154.

Figure 12:
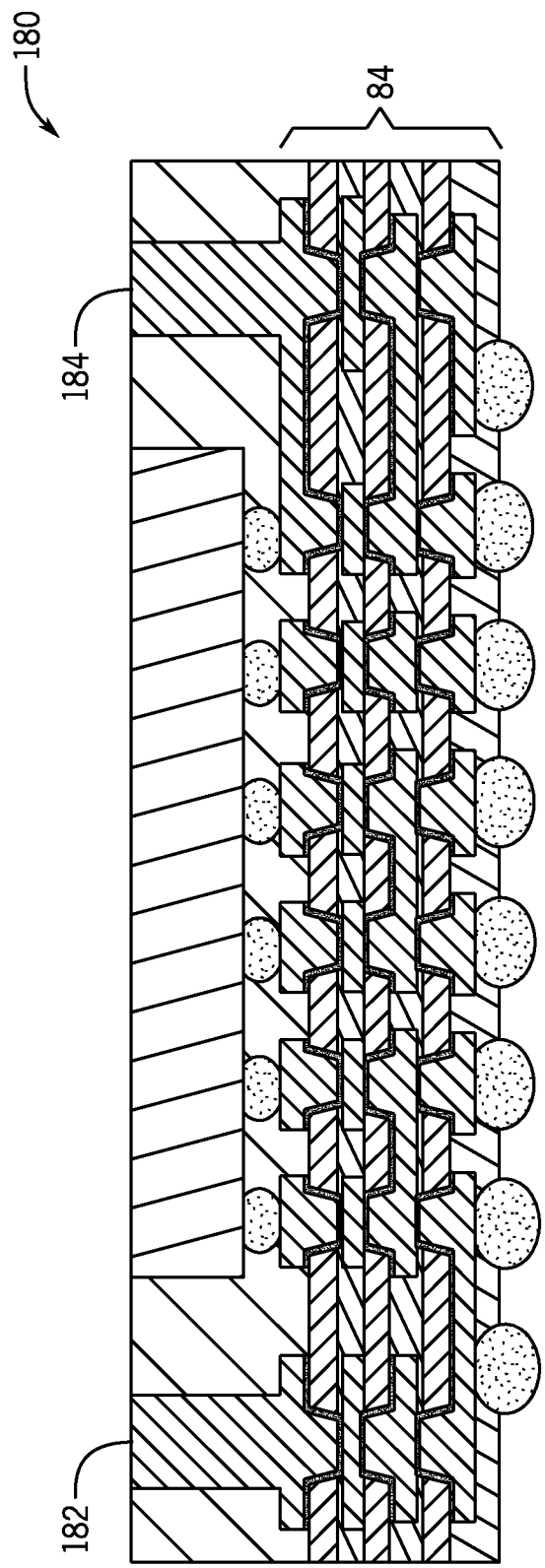
FIG. 12 is a schematic cross-section side view of an electronics package, according to yet another embodiment of the invention.

Referring now to FIG. 12, and with reference back to FIGS. 4-7, an electronics package 180 is illustrated that is composed of the multilayer interconnect structure 84 depicted in FIG. 5, with conductive posts 182 being formed on perimeter regions of the third conductive wiring layer 94. Semiconductor device 102 is mounted onto multilayer interconnect structure 84 and has I/O pads 104 on its active surface 106. Interconnect elements 108 electrically connect I/O pads 104 to portions of third conductive wiring layer 94. Resin material 112 encapsulates semiconductor device 102, conductive posts 182, and the upper surface 114 of the multilayer interconnect structure 84, and forms the body of the electronics package 180. Exposed ends of conductive posts 182 form topside terminals 184.

Figure 13:
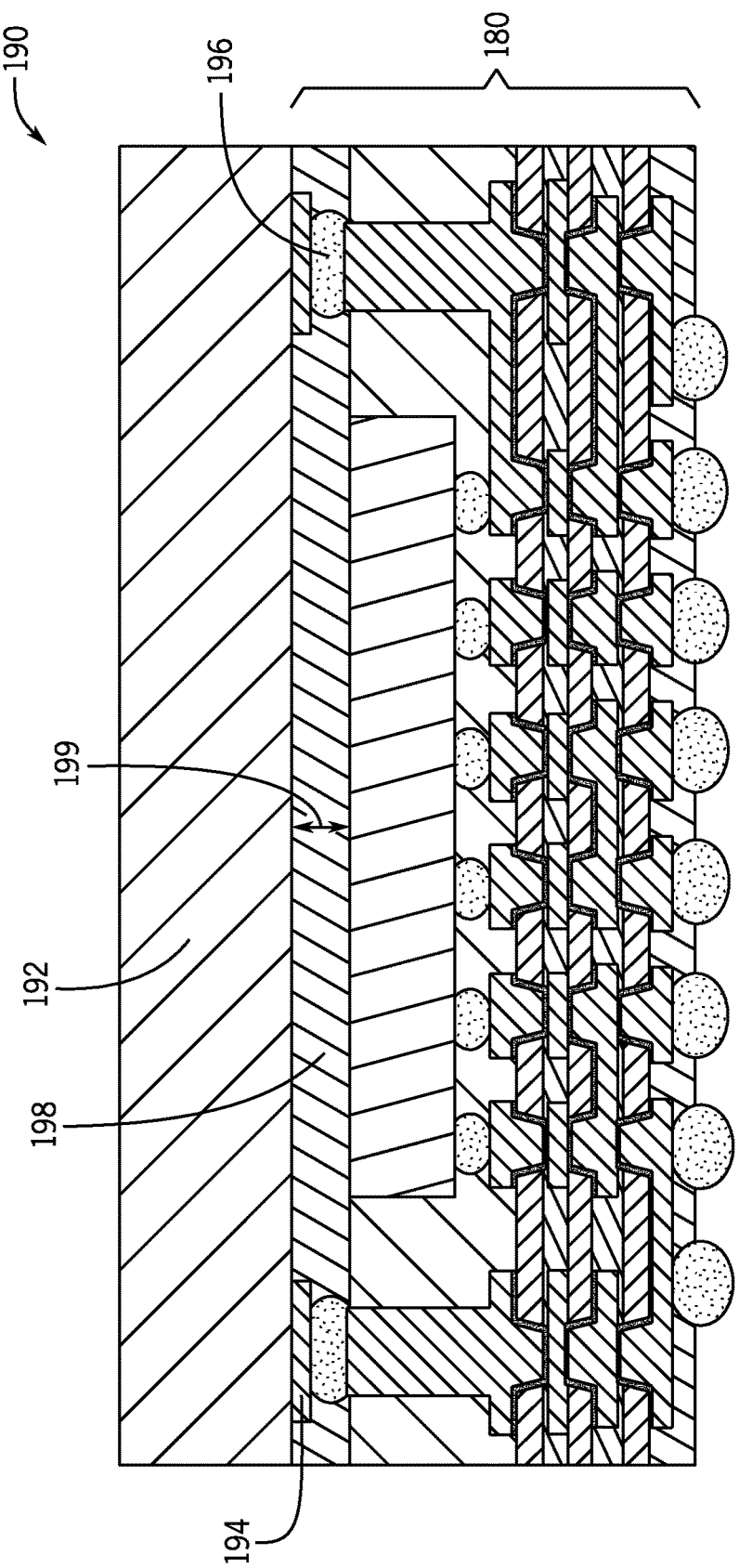
FIG. 13 is a schematic cross-section side view of an electronics package, according to yet another embodiment of the invention.

Referring now to FIG. 13, an electronics package 190 is illustrated that is formed out of the electronics package 180—with the addition of a topside package 192 forming a package-on-package (POP) structure. The topside package 192 has bottom side I/O pads 194. Topside package 192 can be an electronics component such as for example a molded chip carrier, a multichip module, a 3D die stack module, or the like, and is attached to the electronics package 180 by, for example solder bumps 196. An underfill resin 198 can be used to encapsulate solder bumps 196 and fill gap 199 between topside package 192 and the top surface of the resin material 112.

Figure 14:
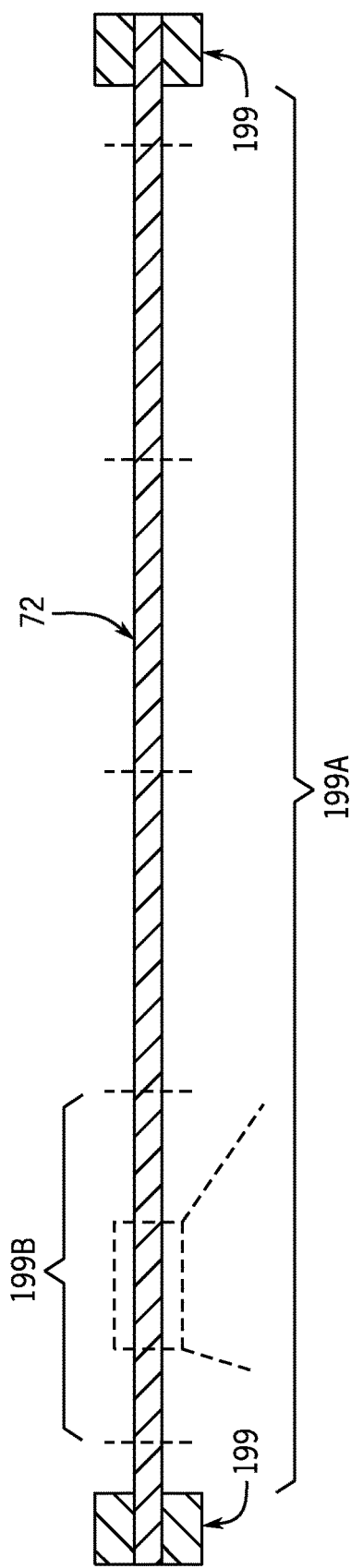
FIG. 14 is a schematic cross-section side view of a perimeter frame useable for build-up of any of the interconnect structures and electronics packages of FIGS. 4-13.

Referring now to FIGS. 14-24, and with continued reference to FIGS. 4-13, process flow sequences for forming the core interconnect structure 70 of FIG. 4, the multilayer interconnect structure 84 of FIG. 5, and the electronics packages 100, 110, 120, 140, 152, 170, 180, 190 of FIGS. 6-13 are depicted, along with a frame structure employed for performing each of the build-up processes. Referring first to FIG. 14, a perimeter frame 199 is illustrated that would be implemented in the build-up of each of the core interconnect structure, the multilayer interconnect structure, and the electronics packages illustrated in FIGS. 15-24. As depicted, the frame 199 comprises a mechanical structure having an opening 199a therein within which the base insulating substrate 72 is mounted. The frame 199 is positioned above and/or below the base insulating substrate 72, such that—in one embodiment—the frame 199 may form a clamp holding the thin base insulating substrate. The base insulating substrate 72 secured to frame 199 has multiple circuit sites 199b where multiple packages would be formed—with a single circuit site being shown in greater detail in each of FIGS. 15-24. Thus, while not illustrated in each of FIGS. 15-24, it is to be understood that the perimeter frame 199 is utilized in each of these process flows to perform the build-up of the respective interconnect structure or electronics package.

Beneficially, the frame 199 is constructed such that, during the build-up process of an interconnect structure and/or electronics package, the frame 199 provides support as well as protection to all structures on the frame side of the substrate, which may be a top side, bottom side, or top and bottom sides depending on the specific frame construction. An example of such protection is the frame 199 providing protection for the conductive posts 182 (FIG. 12) so that they are not damaged during fabrication, even if multiple frames are stacked on top of each other—with the frame having a height greater than a height of the posts 182 such that they are protected during fabrication. The frame 199 thus provides for manufacturing of thin multilayer structures, structures with small and easily damaged protruding feature or components thereon. The frame 199 also may provide for manufacturing of structures with cavities or holes therein by providing the necessary support for such cavity/hole formation.

Figure 15A:
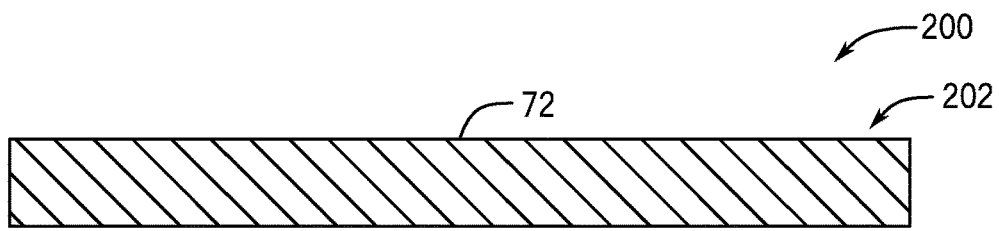
FIGS. 15A-15J are schematic cross-section side views of a process for fabricating a center core portion of a multilayer interconnect structure as depicted in FIG. 4, according to an embodiment of the invention.

Referring now to FIGS. 15A-15J, a preferred method 200 of forming core interconnect structure 70 is depicted, according to an embodiment of the invention. Initially, a base insulating substrate 72 having a thickness of about 5 to 50 microns, and preferably 10 to 25 microns, is mounted onto a perimeter frame 199 (FIG. 14) within an opening thereof at STEP 202 to facilitate handling during processing, as shown in FIG. 15A. According to various embodiments, base insulating substrate 72 may be provided in the form of an insulating film or dielectric substrate, such as for example a Kapton® laminate flex, although other suitable electrically insulating materials may also be employed, such as Ultem®, polytetrafluoroethylene (PTFE), or another polymer film, such as a liquid crystal polymer (LCP) or a polyimide substrate, as non-limiting examples.

Figure 15B:
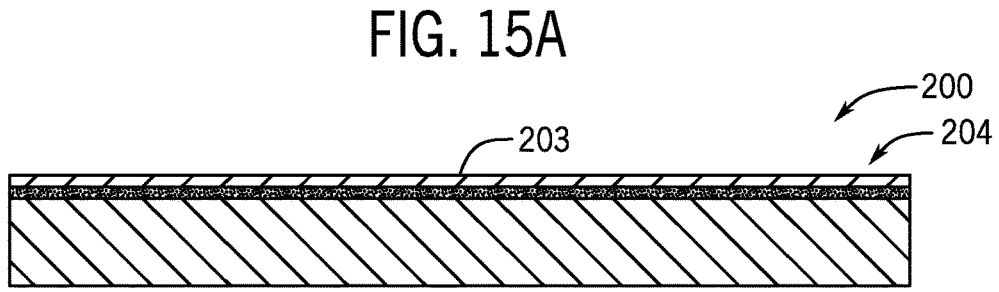
Figure 15C:
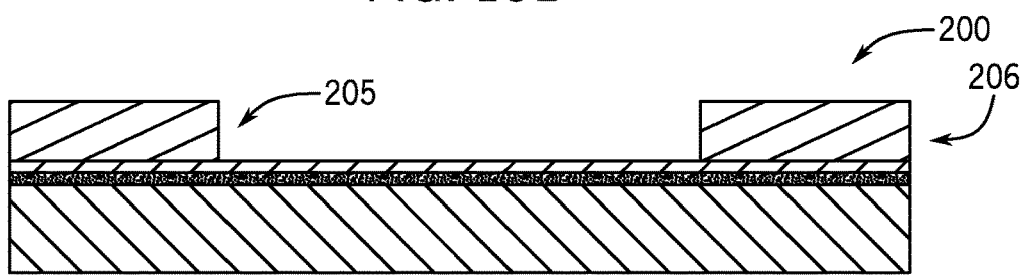
Figure 15D:
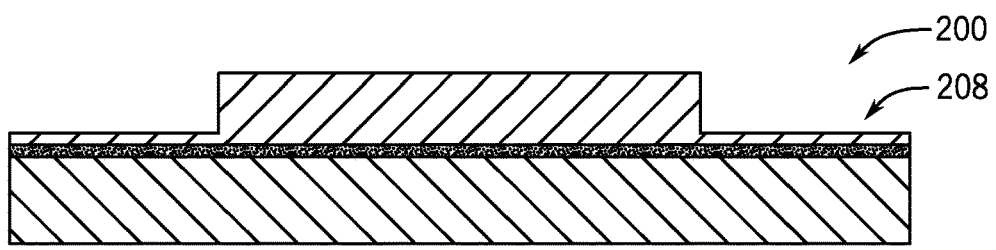

In a next step of method, an adhesion layer such as titanium and a seed layer such as copper, collectively indicated at 203, are deposited onto the top surface of the base insulating substrate at STEP 204 by, for example, sputtering, CVD, evaporation or the like, as shown in FIG. 15B. The barrier layer would preferably have a thickness of 0.05 to 1.0 microns and the seed layer would preferably have a thickness of 0.5 to 4.0 microns. A photomask material 205 is then applied to the metallized surface at STEP 206 preferably to a thickness of 10 to 50 microns in one non-limiting example, with a thickness of the photomask material being be selected based upon the desired thickness of a plated-up metal to be subsequently applied, as shown in FIG. 15C. The photomask material 205 is photopatterned using, for example, UV light using a mask or using a direct write system. Upon application of the photomask material and photopatterning thereof, a thick layer of metal, such as copper for example, is electro-plated preferably to a thickness of 5 to 25 microns and then the remaining photoresist is removed, as shown at STEP 208 in FIG. 15D. It is contemplated that the barrier layer, photomask material, and layer of metal may be provided at other thicknesses than those listed herein in alternative embodiments.

Figure 15E:
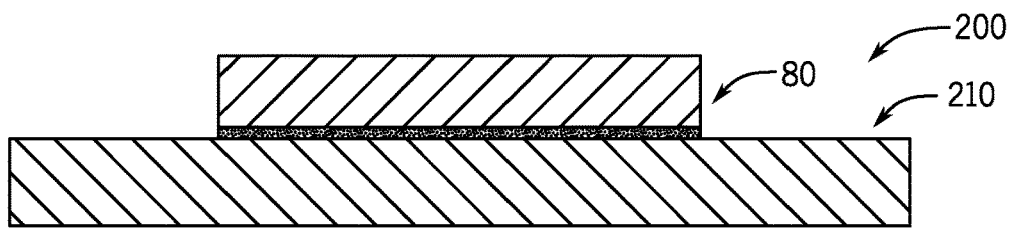
Figure 15F:
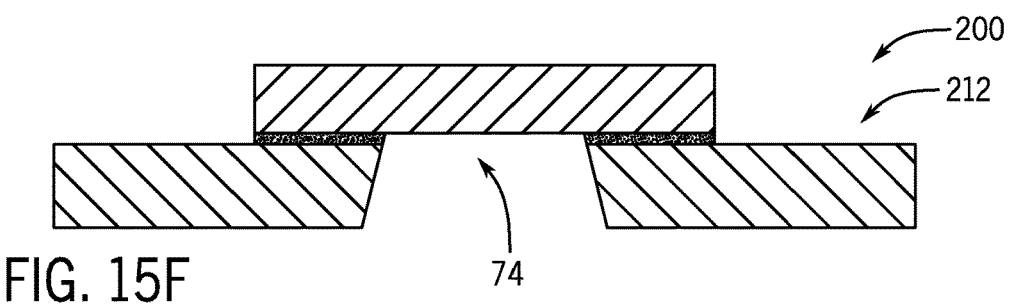
Figure 15G:
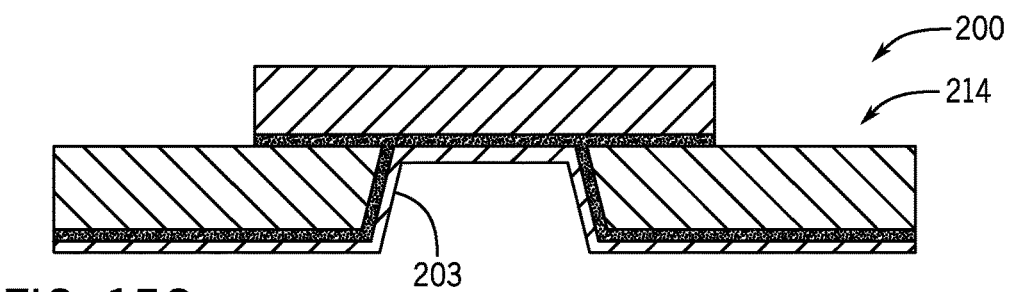

In a next step of method, at STEP 210, the exposed seed metal is removed by etching and then the exposed barrier metal is removed by etching, with such etching steps being performed by chemical etching, for example, as shown in FIG. 15E. The resulting metal layer forms a topside conductive wiring layer 80 with pad areas and trace areas. Microvias 74 are then formed through the base dielectric film 72 at STEP 212 using, for example, laser ablation, chemical etch, plasma etch, or the like, as shown in FIG. 15F. The microvias 74 are preferably formed through the base dielectric film 72 to pad areas of the topside conductive wiring layer 80. Metallization depositions are repeated for the bottom surface of the base dielectric film at STEP 214 by depositing a barrier layer and a seed layer 203 onto the bottom surface, into the microvias 74, and onto the exposed regions of the topside conductive wiring layer 80, as shown in FIG. 15G.

Figure 15H:
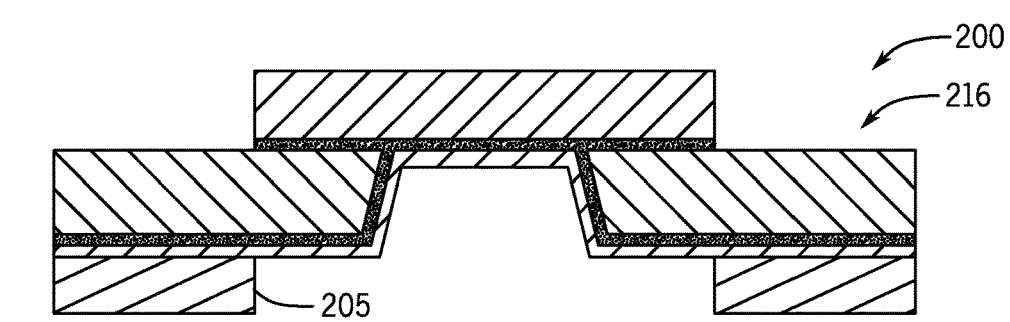
Figure 15I:
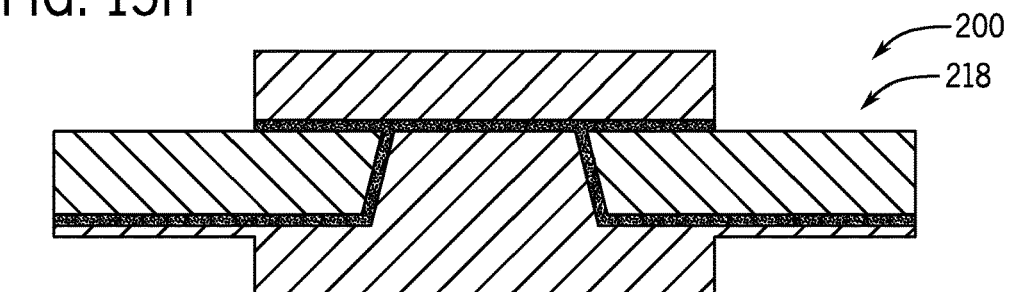
Figure 15J:
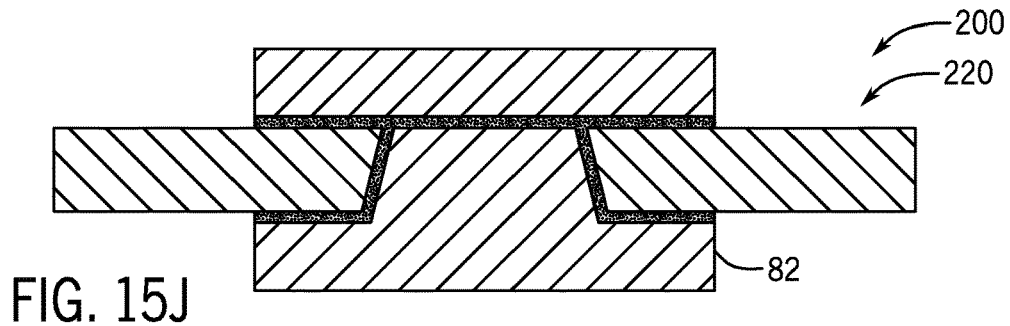

At STEP 216 of method 200, a photomasking process is repeated on the bottom surface of the base dielectric film, such as detailed above in STEP 206, as shown in FIG. 15H. The metallization process detailed above in STEP 208 is then repeated on the bottom surface of the base dielectric film 72 at STEP 218, as shown in FIG. 15I, and the metal removal processes detailed above in STEP 210 are repeated on the bottom surface of the base dielectric film at STEP 220, as shown in FIG. 15J. The resulting metal layer forms a bottom side conductive wiring layer 82 with pad areas, trace areas, and conductive microvias.

Figure 16A:
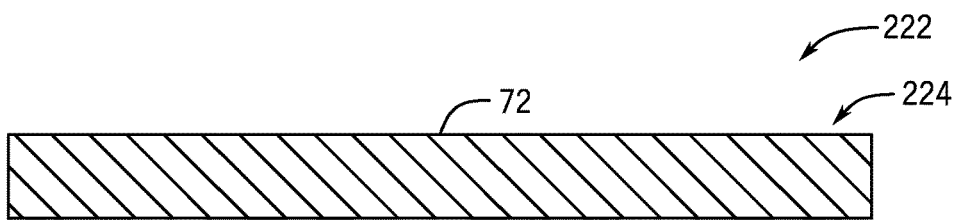
FIGS. 16A-16J are schematic cross-section side views of another process for fabricating the center core portion of a multilayer interconnect structure as depicted in FIG. 4, according to an embodiment of the invention.
Figure 16B:
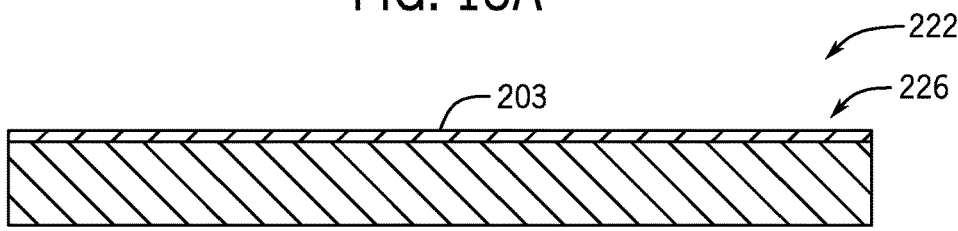
Figure 16C:
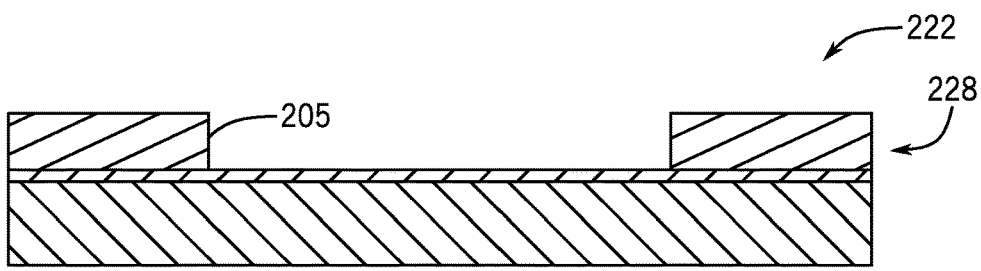
Figure 16D:
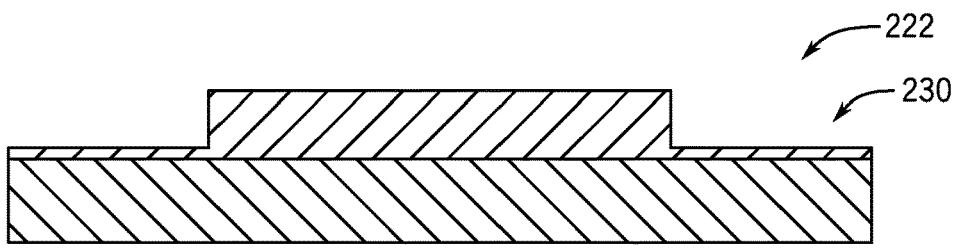

Referring now to FIGS. 16A-16J, another preferred method 222 of forming core interconnect structure 70 is depicted with detailed process steps, according to an embodiment of the invention. In describing the method 222, the process steps that differ from the process steps set forth above in the method 200 of FIGS. 15A-15J are discussed in greater detail below, while those steps corresponding to identical steps in the method 200 of FIGS. 15A-15J are only briefly described. In method 222, a base insulating substrate 72 is mounted onto a perimeter frame 199 (FIG. 14) to facilitate handling during processing at STEP 224, as shown in FIG. 16A. A seed layer 203 is then formed on the upper surface of the base insulating substrate at STEP 226 by, for example, electroless plating, as shown in FIG. 16B. A topside photomask 205 is then applied to the metallized surface of the base insulating substrate and patternized at STEP 228, as shown in FIG. 16C, with a topside thick layer of metal then formed at STEP 230, as shown in FIG. 16D.

Figure 16E:
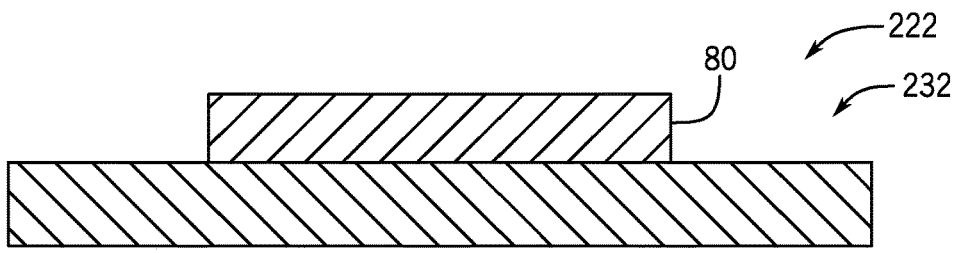
Figure 16F:
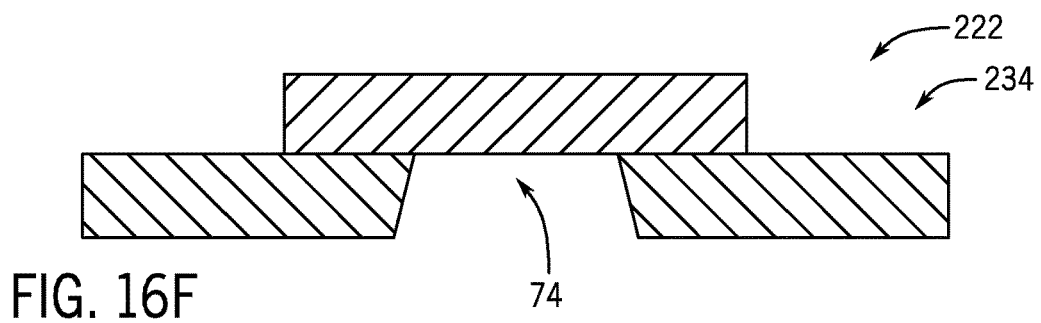
Figure 16G:
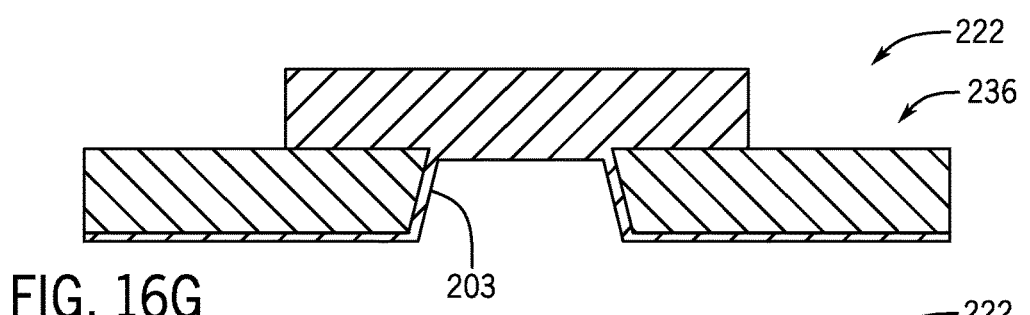
Figure 16H:
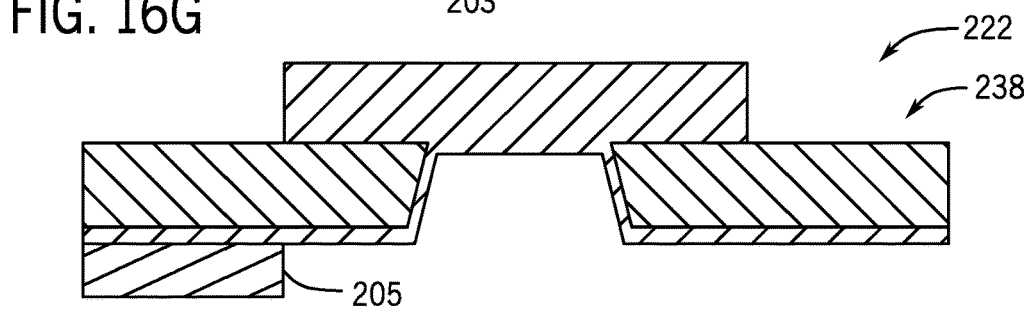
Figure 16I:
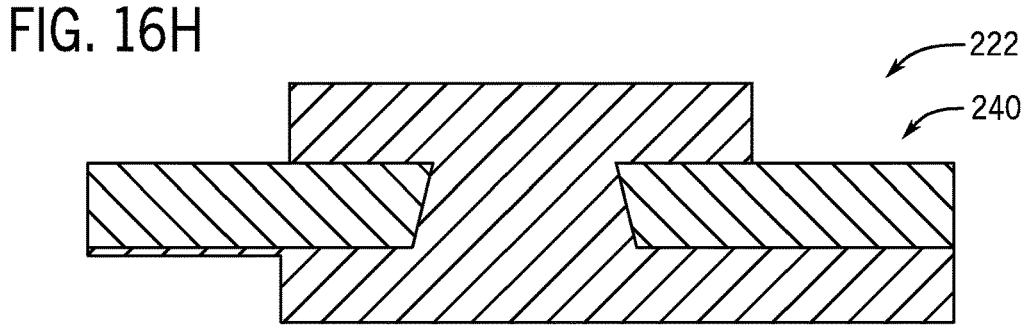
Figure 16J:
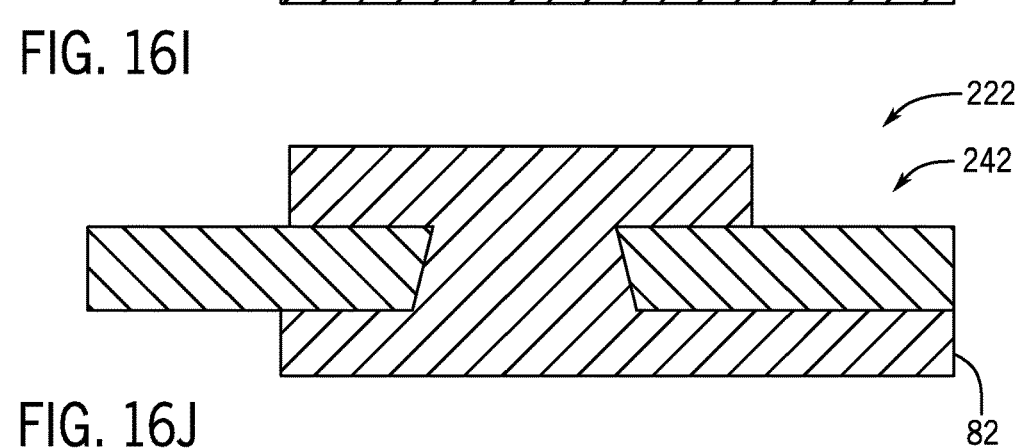

In a next step of method, the topside photomask 205 is removed and the exposed seed metal 203 is then removed at STEP 232 by etching the seed metal, such as by chemical etching, as shown in FIG. 16E. The resulting metal layer forms a topside conductive wiring layer 80 with pad areas and trace areas. Upon completion of the topside conductive wiring layer, microvias 74 are formed in the base insulating substrate at STEP 234, as shown in FIG. 16F. Metallization depositions, as detailed above in STEP 226, are then repeated for the bottom surface of the base insulating substrate 72—with a seed layer 203 being deposited onto the bottom surface and into the microvias 74 at STEP 236, as shown in FIG. 16G. A bottom side photomask 205 is then applied and patterned on the bottom surface of the base insulating substrate at STEP 238, as shown in FIG. 16H, and a bottom side thick metal is formed at STEP 240, as shown in FIG. 16I. At STEP 242, the exposed seed metal on the bottom surface of the base insulating substrate is then removed by etching, such as by chemical etching—with the resulting metal layer forming a bottom side conductive wiring layer 82 with pad areas, trace areas, and conductive microvias, as shown in FIG. 16J.

It is recognized that a variation of the process illustrated in FIGS. 15A-15J and 16A-16J might be performed where, after microvia 74 is formed through substrate 72 to the copper wiring layer 80, the substrate 72 could be used as a masking layer to fill in via 74. That is, a plate-up of copper could be performed in the microvia 74 only, without the copper extending onto the lower surface of the substrate 72 as is shown in FIGS. 15A-15J and 16A-16J. Such a process variation would be applicable to fine pitch components and in cases where additional routing is not required (i.e., stacked via only).

Figure 17A:
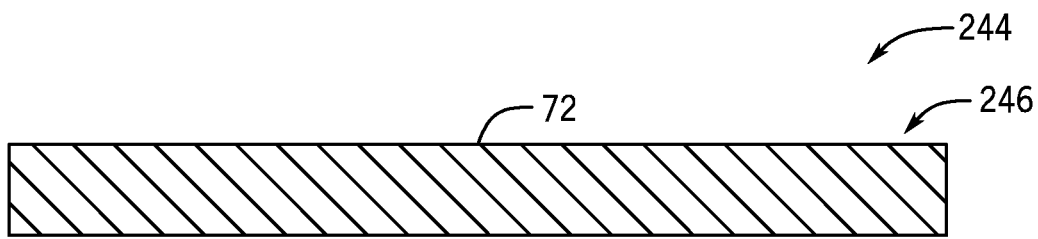
FIGS. 17A-17G are schematic cross-section side views of yet another process for fabricating the center core portion of a multilayer interconnect structure as depicted in FIG. 4, according to an embodiment of the invention.
Figure 17B:
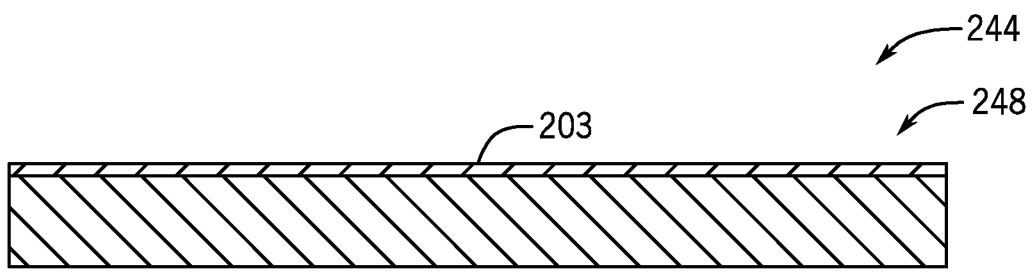
Figure 17C:
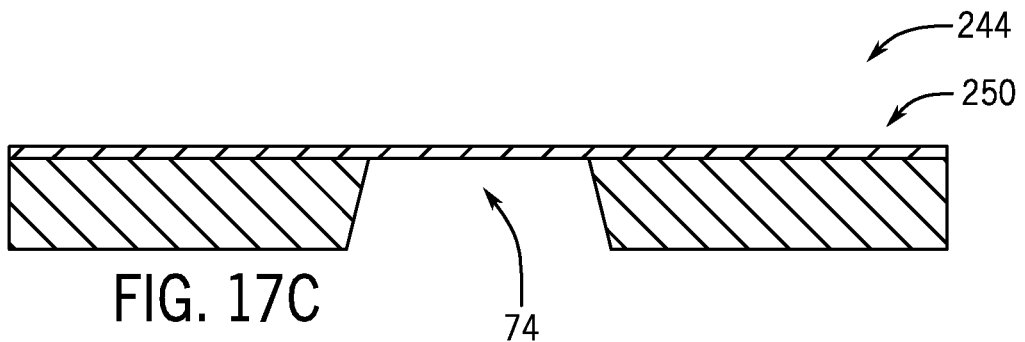
Figure 17D:
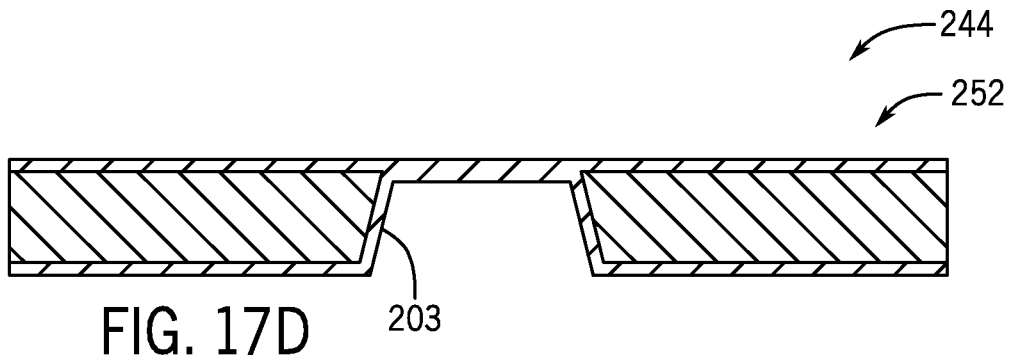

Referring now to FIGS. 17A-17G, yet another preferred method 244 of forming core interconnect structure 70 is depicted with detailed process steps, according to an embodiment of the invention. In describing the method 244, the process steps that differ from the process steps set forth above in the method 222 of FIG. 16A-16J are discussed in greater detail below, while those steps corresponding to identical steps in the method 222 of FIGS. 16A-16J are only briefly described. In a first step of the method 244, a base insulating substrate 72 is mounted onto a perimeter frame 199 (FIG. 14) to facilitate handling during processing at STEP 246, as shown in FIG. 17A. As shown in FIG. 17B, a seed layer 203 is then formed on the upper surface of the base insulating substrate 72 at STEP 248 by, for example, electroless plating, and microvias 74 are subsequently formed in the base insulating substrate at STEP 250 in a direction from the bottom surface of the base insulating substrate, as shown in FIG. 17C. Metallization depositions are then repeated for the bottom surface of the base insulating substrate at STEP 252—with a seed layer 203 being deposited onto the bottom surface and into the microvias 74, as shown in FIG. 17D.

Figure 17E:
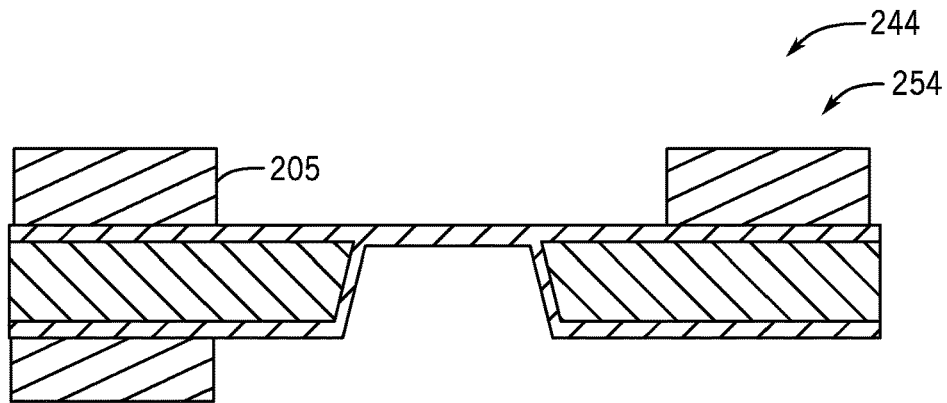
Figure 17F:
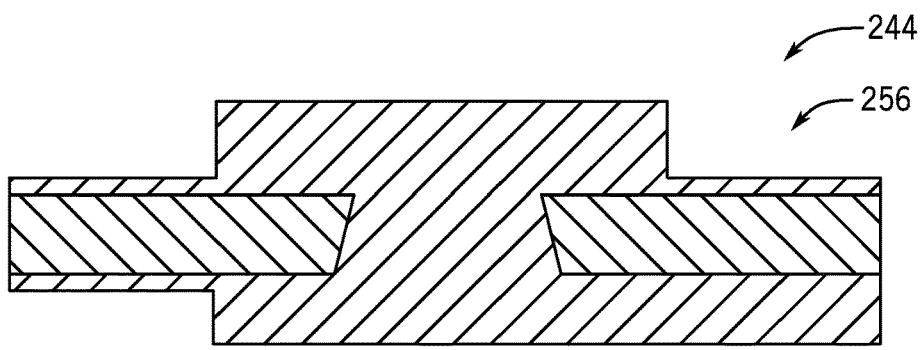
Figure 17G:
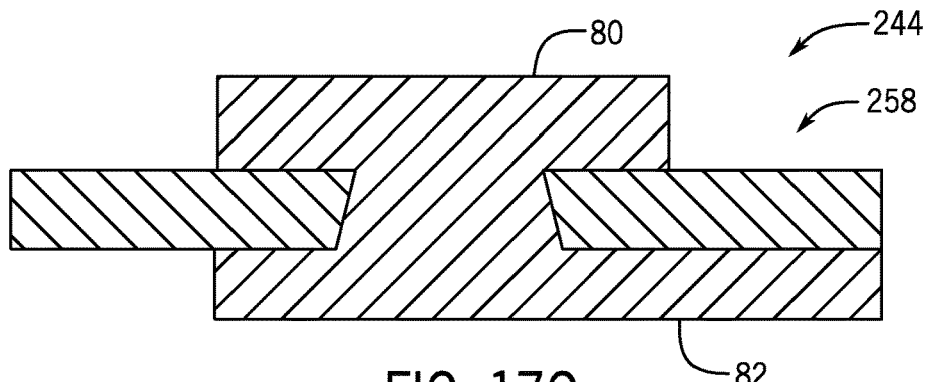

In a next step of method 244, and as shown in FIG. 17E, topside and bottom side photomasks 205 are then applied and patterned on respective surfaces of the base insulating substrate 72 at STEP 254, with a thick metal then being formed on both the upper surface and the lower surface of the base insulating substrate at STEP 256, as shown in FIG. 17F. At STEP 258, the exposed seed metal 203 on the top and bottom surfaces of the base insulating substrate 72 is then removed by etching, such as by chemical etching—with the resulting metal layers forming a topside conductive wiring layer 80 with pad areas and trace areas, and forming a bottom side conductive wiring layer 82 with pad areas, trace areas, and conductive microvias, as shown in FIG. 17G.

Figure 18A:
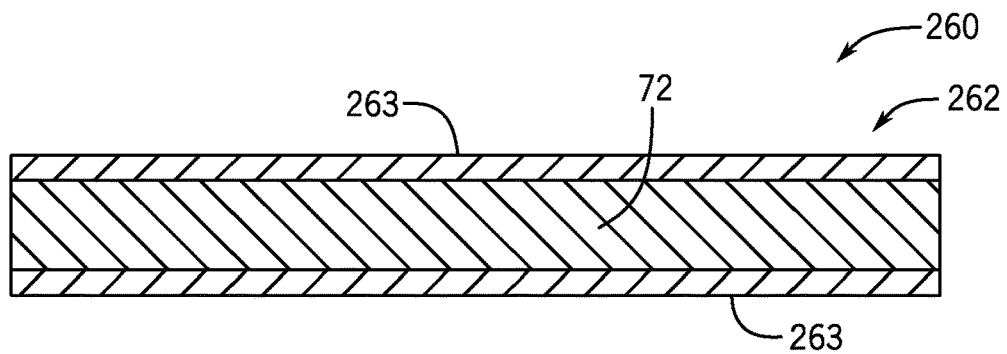
FIGS. 18A-18G are schematic cross-section side views of yet another process for fabricating the center core portion of a multilayer interconnect structure as depicted in FIG. 4, according to an embodiment of the invention.

Referring now to FIGS. 18A-18G, still another preferred method 260 of forming core interconnect structure 70 is depicted with detailed process steps, according to an embodiment of the invention. In describing the method 260, the process steps that differ from the process steps set forth above in the method 244 of FIGS. 17A-17G are discussed in greater detail below, while those steps corresponding to identical steps in the method 244 of FIGS. 17A-17G are only briefly described. In a first step of the method 260, a base insulating substrate 72 is mounted onto a perimeter frame 199 (FIG. 14) to facilitate handling during processing at STEP 262, as shown in FIG. 18A. The base insulating substrate 72 is composed of a polyimide, epoxy or the like, and has a thickness of about 5 to 50 microns, and preferably 10 to 25 microns, with the base insulating substrate including topside and bottom side metal cladding 263 preferably 2 to 10 microns thick and preferably composed of copper.

Figure 18B:
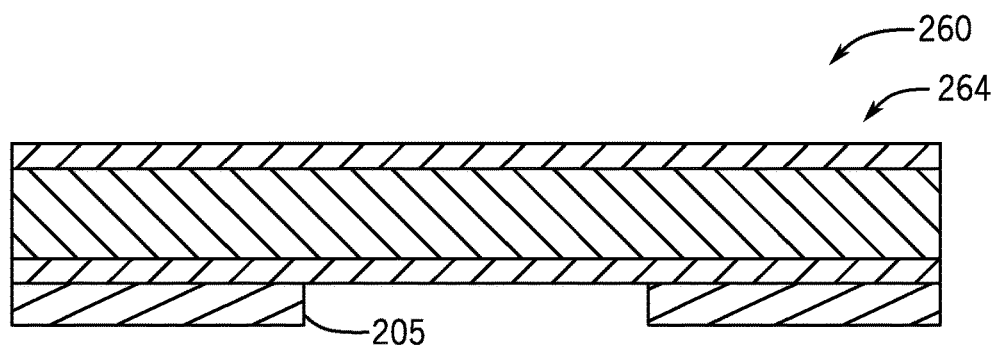
Figure 18C:
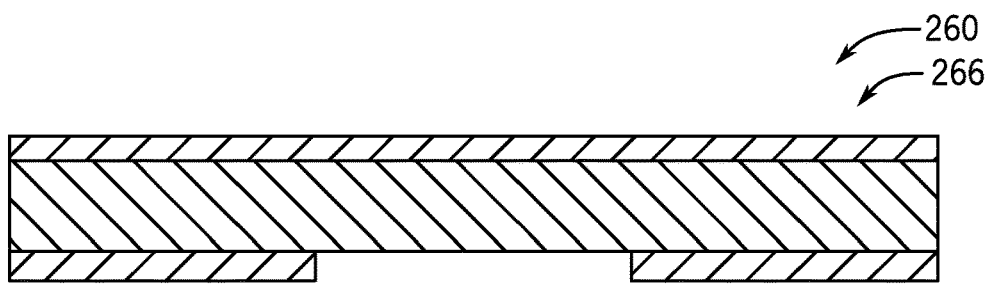
Figure 18D:
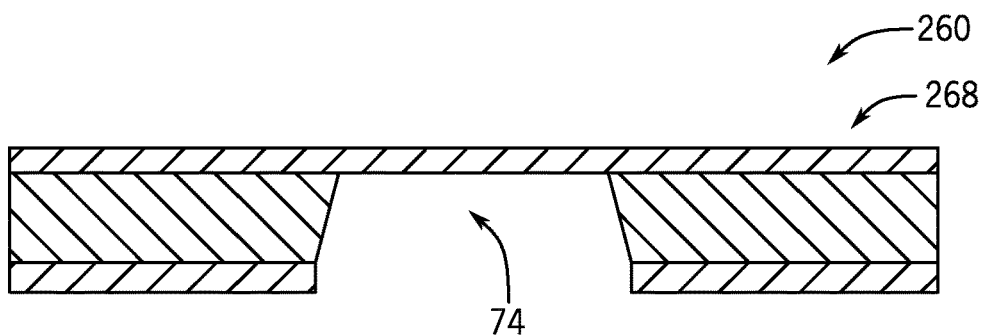
Figure 18E:
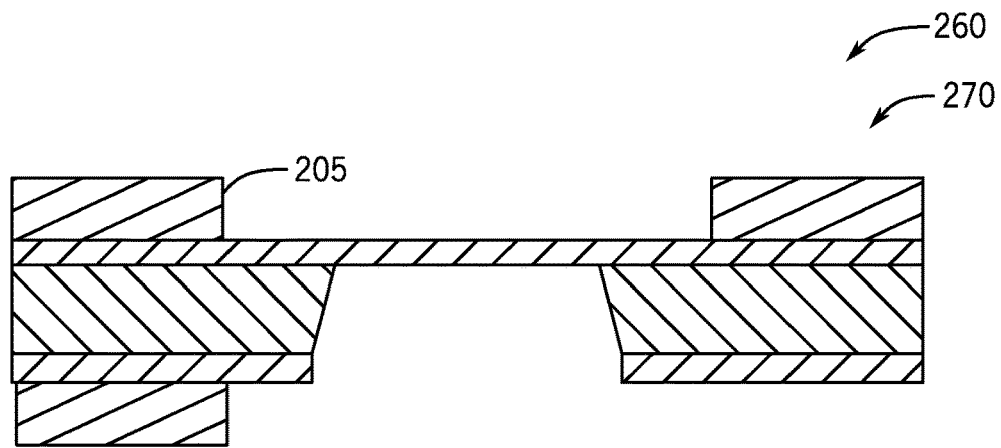
Figure 18F:
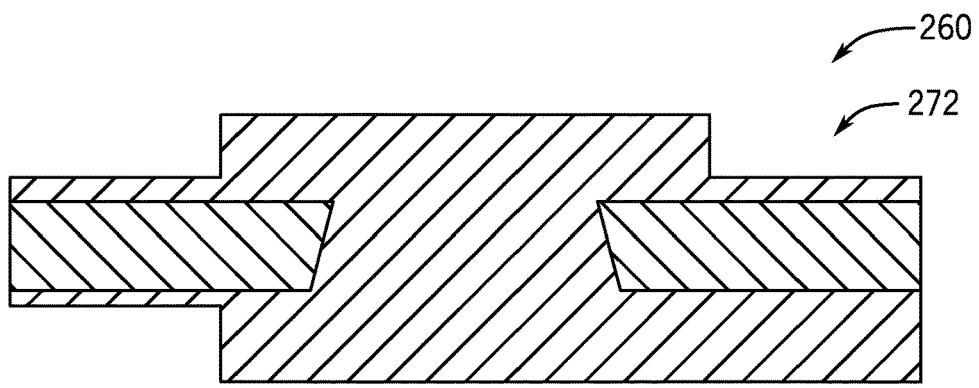
Figure 18G:
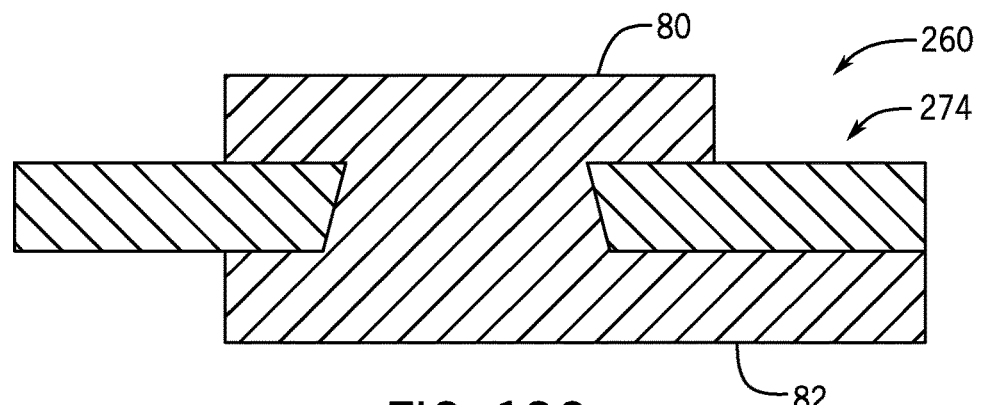

As shown in FIG. 18B, a bottom side photomask 205 is then applied to the metal cladded bottom surface of the base insulating substrate 72 and patternized at STEP 264, and the exposed metal cladding 263 on the bottom side is removed by etching at STEP 266, as shown in FIG. 18C. Next, microvias 74 are etched through the base insulating substrate 72 at STEP 268 using the patterned bottom metallization as a mask, as shown in FIG. 18D. As shown in FIG. 18E, topside and bottom side photomasks 205 are then applied and patterned on respective surfaces of the base insulating substrate 72 at STEP 270, and a thick metal is then formed on both the upper surface and the lower surface of the base insulating substrate and in the microvia at STEP 272, as shown in FIG. 18F. Upon formation of the thick metal, the cladding 263 on both the upper surface and the lower surface of the base insulating substrate 72 are removed at STEP 274, with the resulting metal layers forming a topside conductive wiring layer 80 with pad areas and trace areas, and forming a bottom side conductive wiring layer 82 with pad areas, trace areas, and conductive microvias, as shown in FIG. 18G.

Figure 19A:
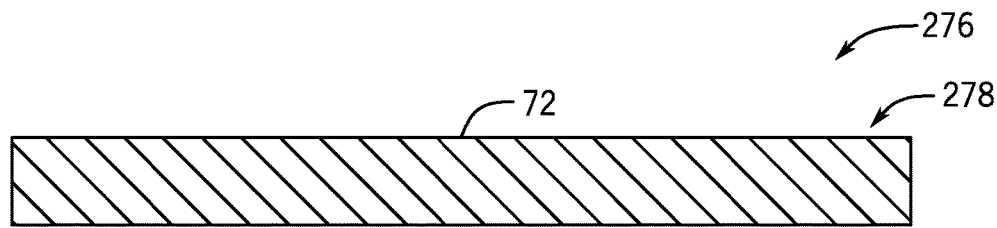
FIGS. 19A-19F are schematic cross-section side views of yet another process for fabricating the center core portion of a multilayer interconnect structure as depicted in FIG. 4, according to an embodiment of the invention.
Figure 19B:
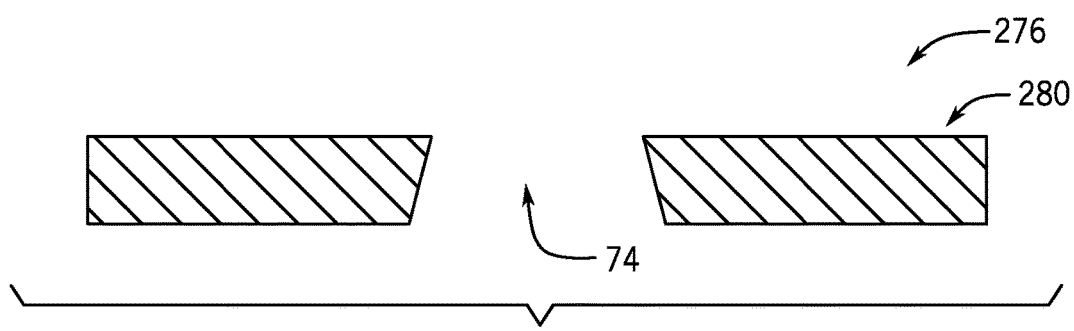
Figure 19C:
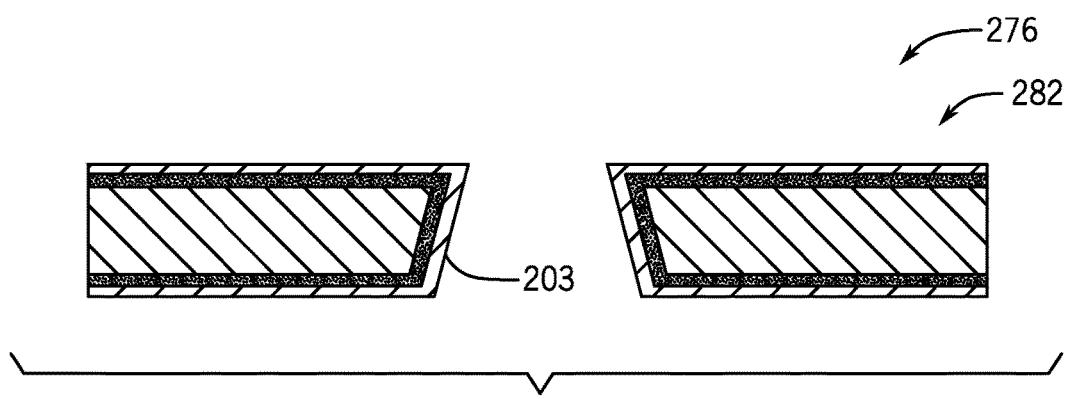
Figure 19D:
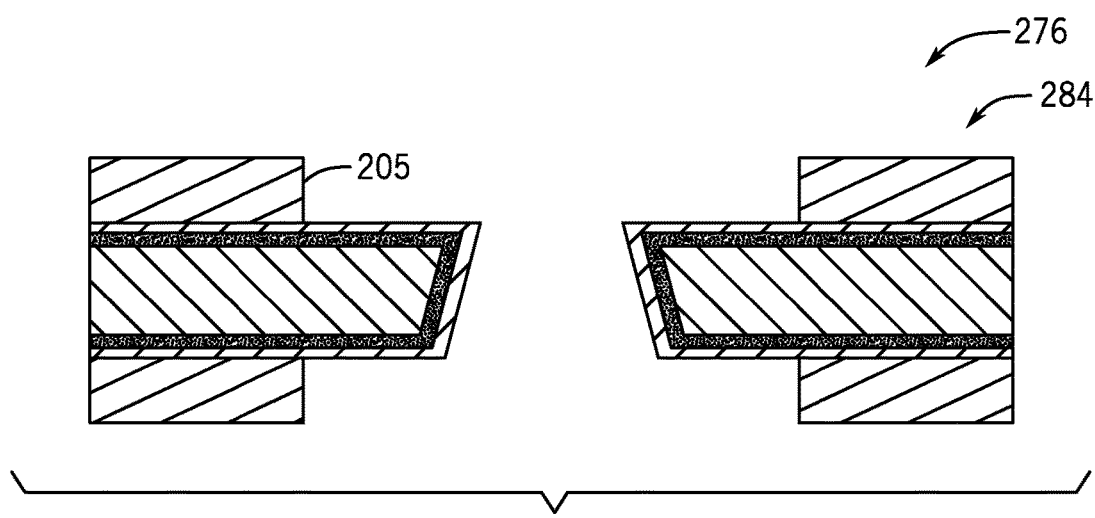
Figure 19E:
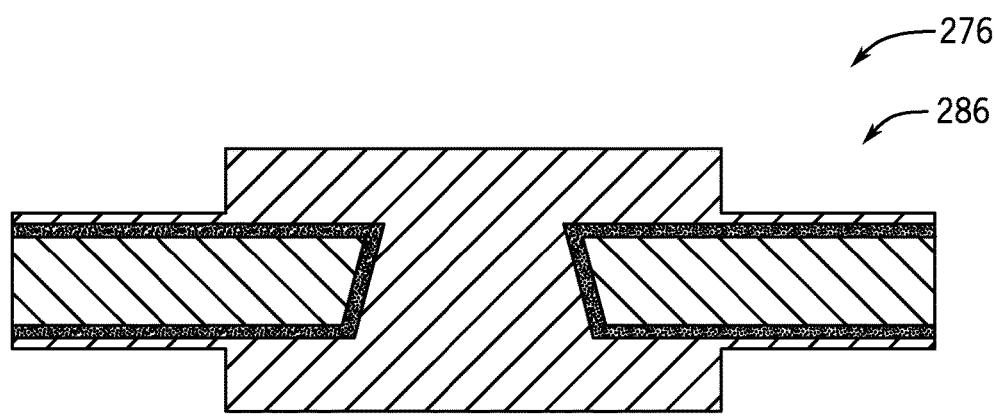
Figure 19F:
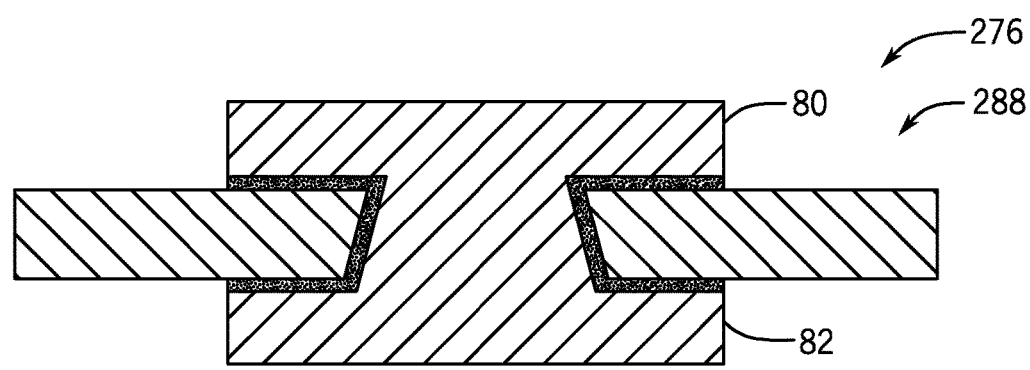

Referring now to FIGS. 19A-19F, still another preferred method 276 of forming core interconnect structure 70 is depicted with detailed process steps, according to an embodiment of the invention. In describing the method 276, the process steps that differ from the process steps set forth above in the methods 200, 222 of FIGS. 15A-15J and 16A-16J are discussed in greater detail below, while those steps corresponding to identical steps in the methods 200, 222 of FIGS. 15A-15J and 16A-16J are only briefly described. In a first step of the method 276, a base insulating substrate 72 is mounted onto a perimeter frame 199 (FIG. 14) to facilitate handling during processing at STEP 278, as shown in FIG. 19A. As shown in FIG. 19B, microvias 74 are then formed in the base insulating substrate at STEP 280, and a barrier layer and a seed layer 203 are then formed at STEP 282, such as via a sputtering, CVD, evaporation or the like, as shown in FIG. 19C. As shown in FIG. 19D, upon forming of the barrier and seed layers 203, a photomask 205 is then applied and patterned on the top and bottom sides of base insulating substrate 72 at STEP 284, with thick metal then being formed in the microvias 74 and on the top and bottom sides of the base insulating substrate at STEP 286, as shown in FIG. 19E. Finally, the barrier layer and seed layer are etched from the top and bottom sides of the base insulating substrate at STEP 288, such that top and bottom side conductive wiring layers 80, 82 are provided, as shown in FIG. 19F. Alternatively, the barrier and seed layer at STEP 280 can be replaced by an electroless seed layer as detailed in reference to FIGS. 15A-15J.

Figure 20A:
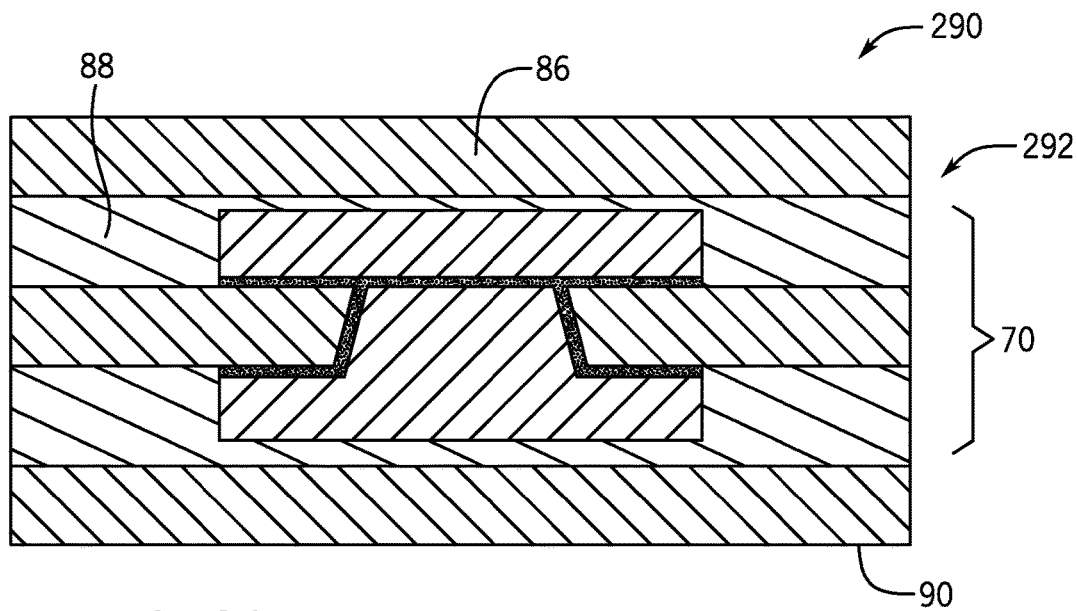
FIGS. 20A-20D are schematic cross-section side views of a process for fabricating the outer portions of a multilayer interconnect structure as depicted in FIG. 5, according to an embodiment of the invention.

Referring now to FIGS. 20A-20D, a preferred method 290 of forming outer interconnect layers on a core interconnect structure to form multilayer interconnect structure 84 of FIG. 5 is depicted. In a first step of the method 290, first and second insulating substrates 86, 90 are laminated onto top and bottom surfaces of the core interconnect structure 70 at STEP 292, as shown in FIG. 20A. The insulating substrates have a thickness of about 5 to 50 microns, and preferably 10 to 25 microns, and are composed of a polyimide, Ultem, bismaleimide-triazine (BT) resin, liquid crystal polymer, benzocyclobutane (BCB), polyetherimide, epoxy, epoxy-glass or the like. A joining material 88 is used to laminate the insulating substrates to the core interconnect structure. In one embodiment, the joining material comprises an adhesive having a thickness of about 5 to 20 microns, with the adhesive being composed of a polyimide such as CIBA GEIGY 412 or AMOCO AI-10, for example. Alternately, a self-bonding film such as an epoxy-glass pre-preg could be used without a separate joining material layer.

Figure 20B:
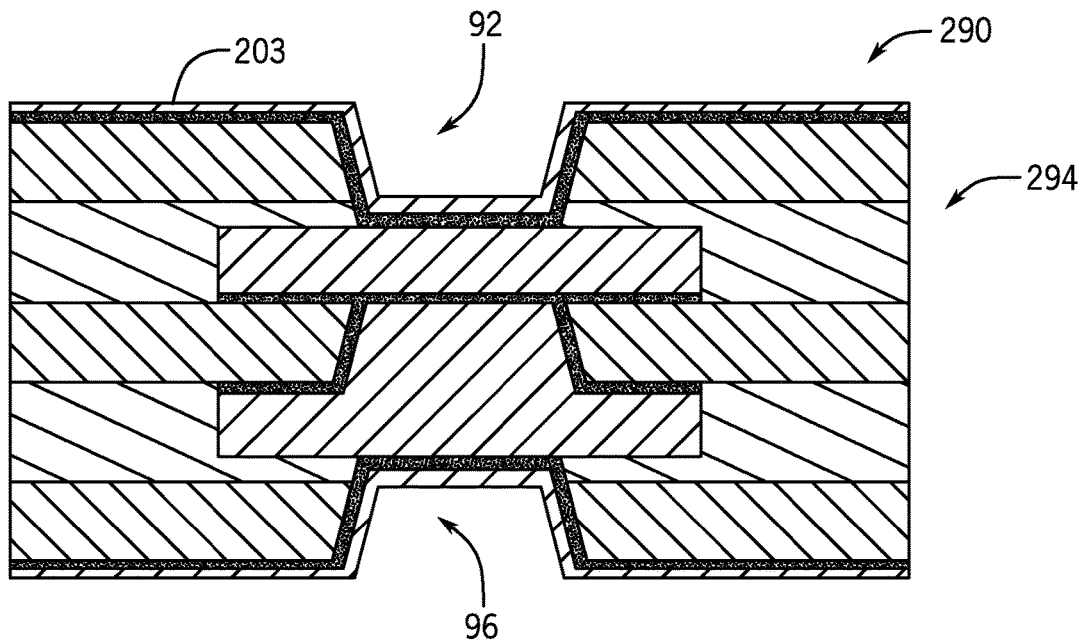
Figure 20C:
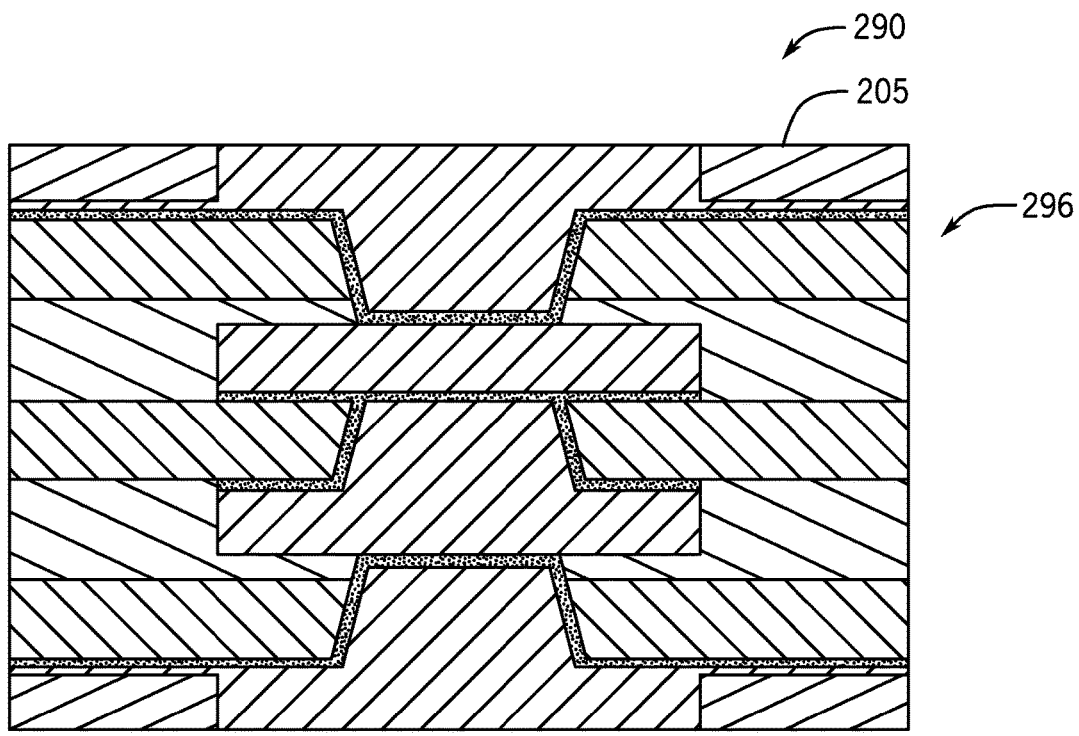
Figure 20D:
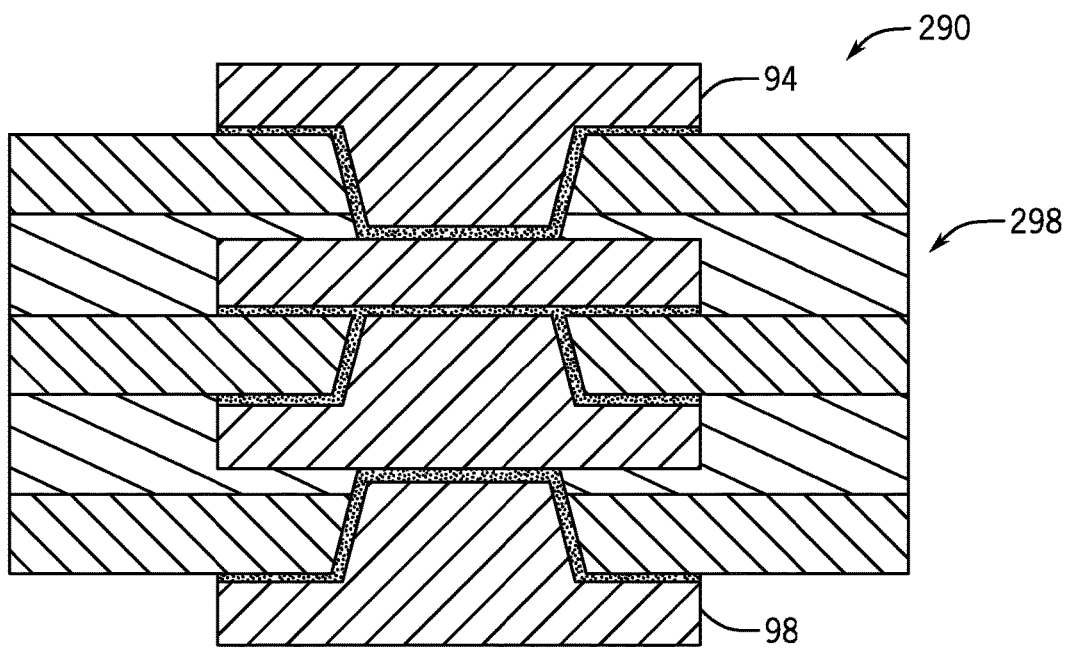

In a next step of method 290, and as shown in FIG. 20B, microvias 92, 96 are formed through the top and bottom outer insulating substrates 86, 90 at STEP 294, such as by laser ablation, chemical etch or the like, with barrier and seed layers 203 also being applied to the outer surfaces of insulating substrates at STEP 294. A photomask 205 is then subsequently applied and patterned on the over the barrier/seed layers 203 on top and bottom surfaces of insulating substrates at STEP 296, as shown in FIG. 20C. Thick metal is formed on the top and bottom sides of insulating substrates at STEP 296 by a patterned plate-up using the photoresist as a mask. The photoresist 205 is then removed and the seed and barrier layers 203 are removed at STEP 298 to form third and fourth conductive wiring layers 94, 98, with the resulting structure constructed as a multilayer insulating substrate structure with four wiring layers and three dielectric layers, as shown in FIG. 20D. While not shown in FIGS. 20A-20D, it is recognized that additional interconnect layers can be added to the multilayer interconnect structure by repeating STEPS 292-298.

Figure 21A:
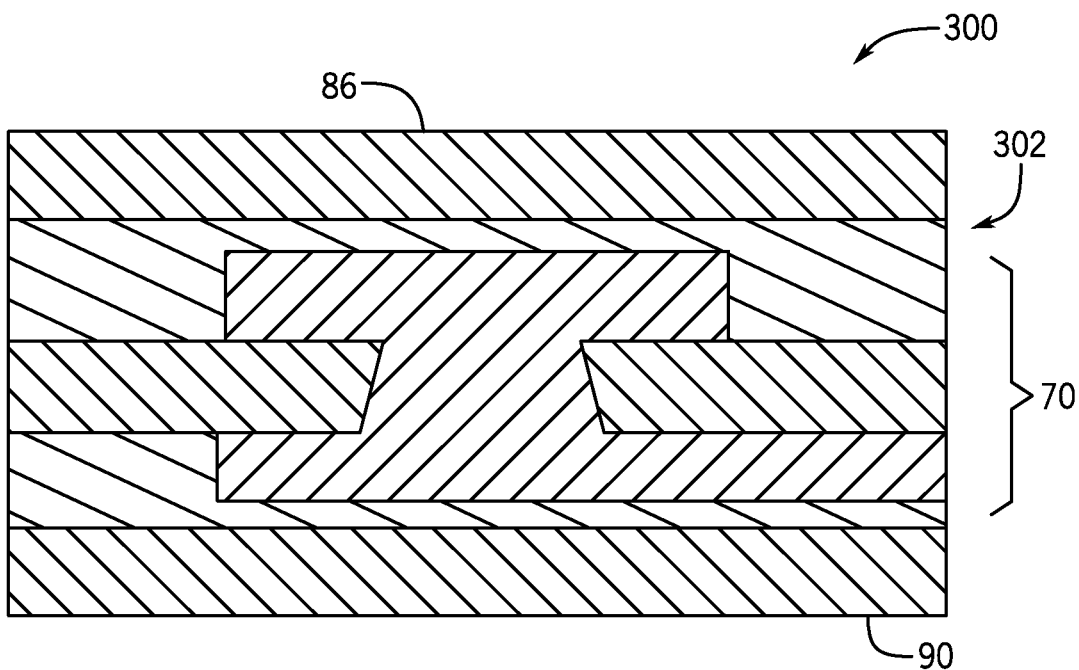
FIGS. 21A-21D are schematic cross-section side views of another process for fabricating the outer portions of a multilayer interconnect structure as depicted in FIG. 5, according to an embodiment of the invention.
Figure 21B:
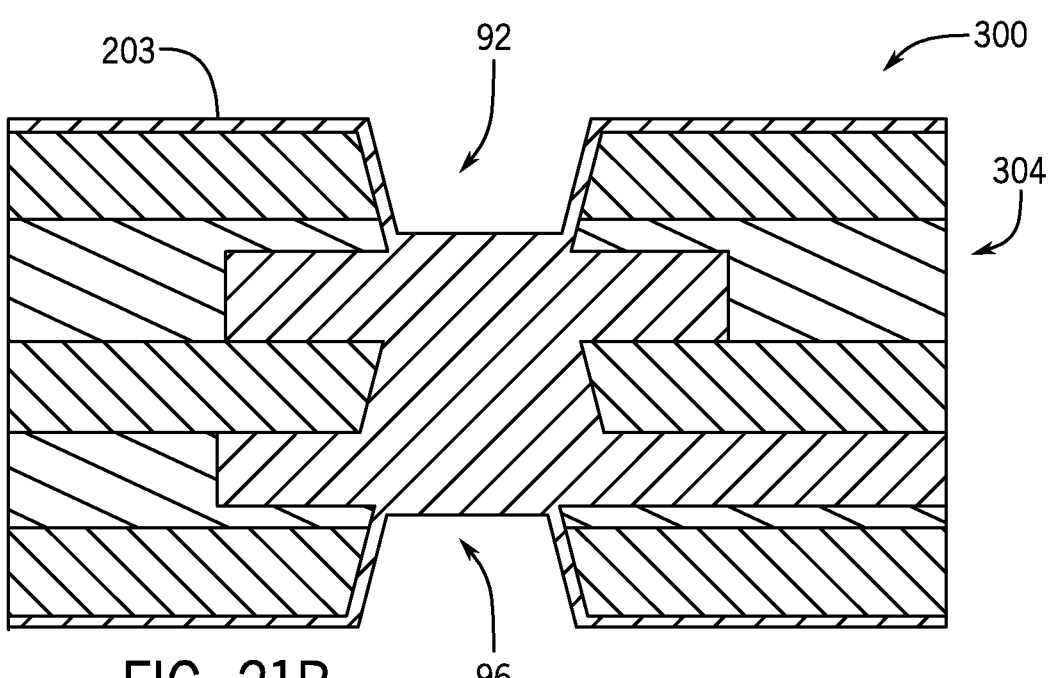
Figure 21C:
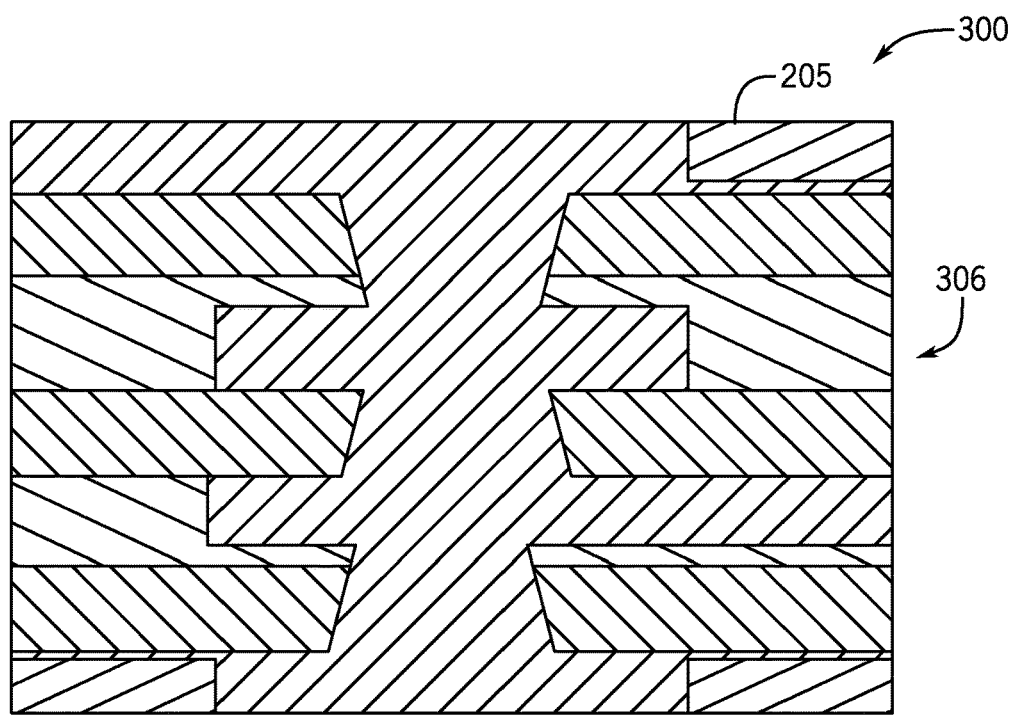
Figure 21D:
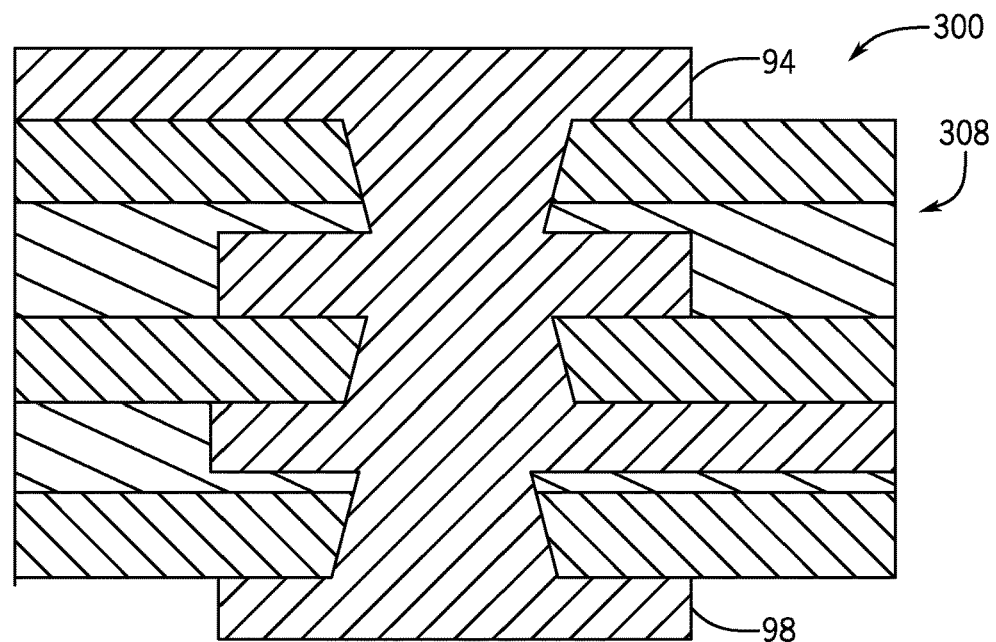

Referring now to FIGS. 21A-21D, another preferred method 300 of forming outer interconnect layers on a core interconnect structure to form multilayer interconnect structure 84 is depicted. In a first step of the method 300, first and second insulating substrates 86, 90 are laminated onto top and bottom surfaces of the core interconnect structure 70 at STEP 302, as shown in FIG. 21A. Microvias 92, 96 are then formed through the top and bottom outer insulating substrates at STEP 304, as previously described, with seed layers 203 also applied to the outer surfaces of the insulating substrates at STEP 304, as shown in FIG. 21B. A photomask 205 is then applied and patterned on the top and bottom surfaces of insulating substrates 86, 90 at STEP 306 and thick metal is formed on the top and bottom sides by a patterned plate-up using the photoresist as a mask, as shown in FIG. 21C. The photoresist 205 and the seed layers 203 are then removed at STEP 308 to form third and fourth conductive wiring layers 94, 98, with the resulting structure constructed as a multilayer insulating substrate structure 84 with four wiring layers and three dielectric layers, as shown in FIG. 21D.

Accordingly, it is seen that various methods may be utilized to fabricate a core interconnect structure 70 and multilayer interconnect structure 84 for use in an electronics package. Each of the described methods provides for fabrication of a core interconnect structure and/or multilayer interconnect structure 84 that includes wiring layers with narrow line widths and narrow line to line spaces and small microvias connecting adjacent wiring layers in the structure.

Figure 22C:
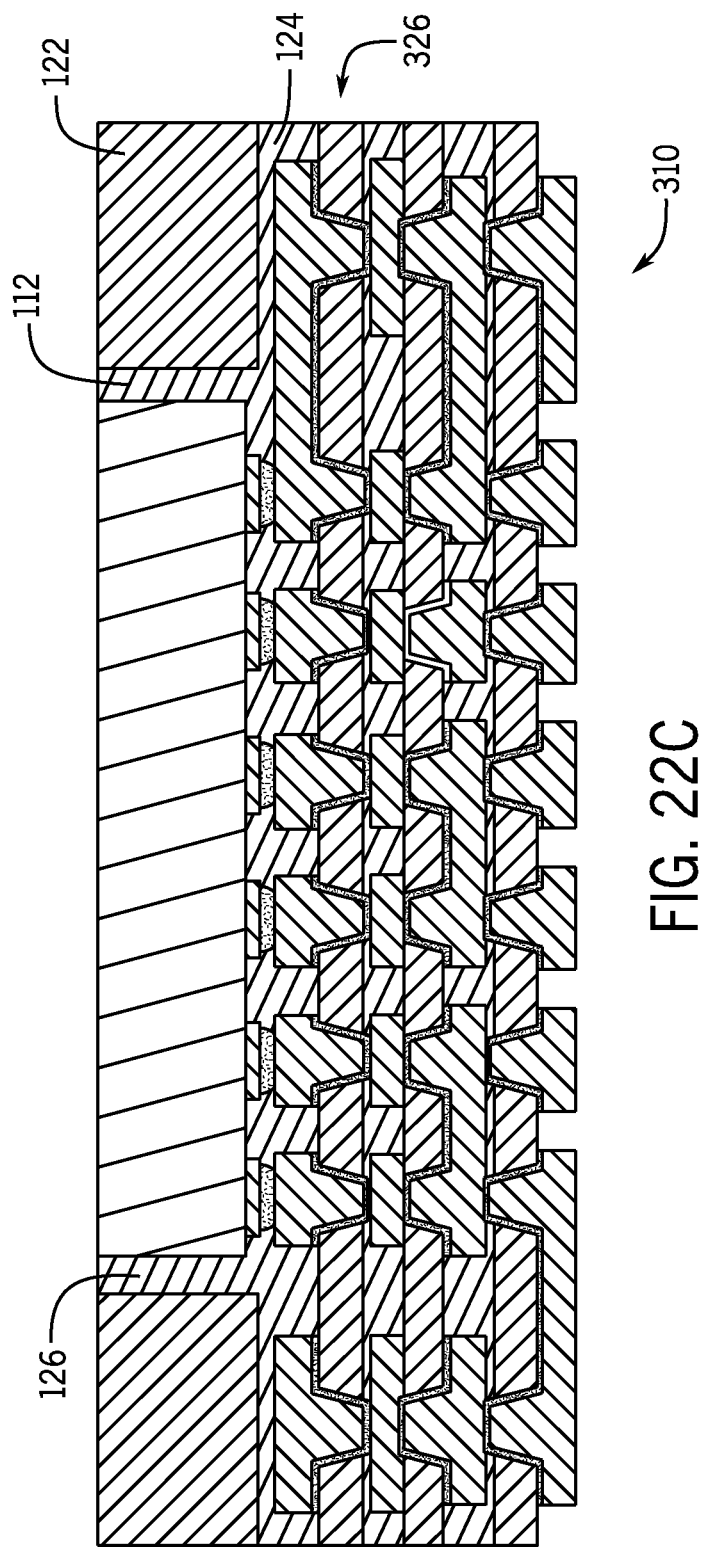
Figure 22D:
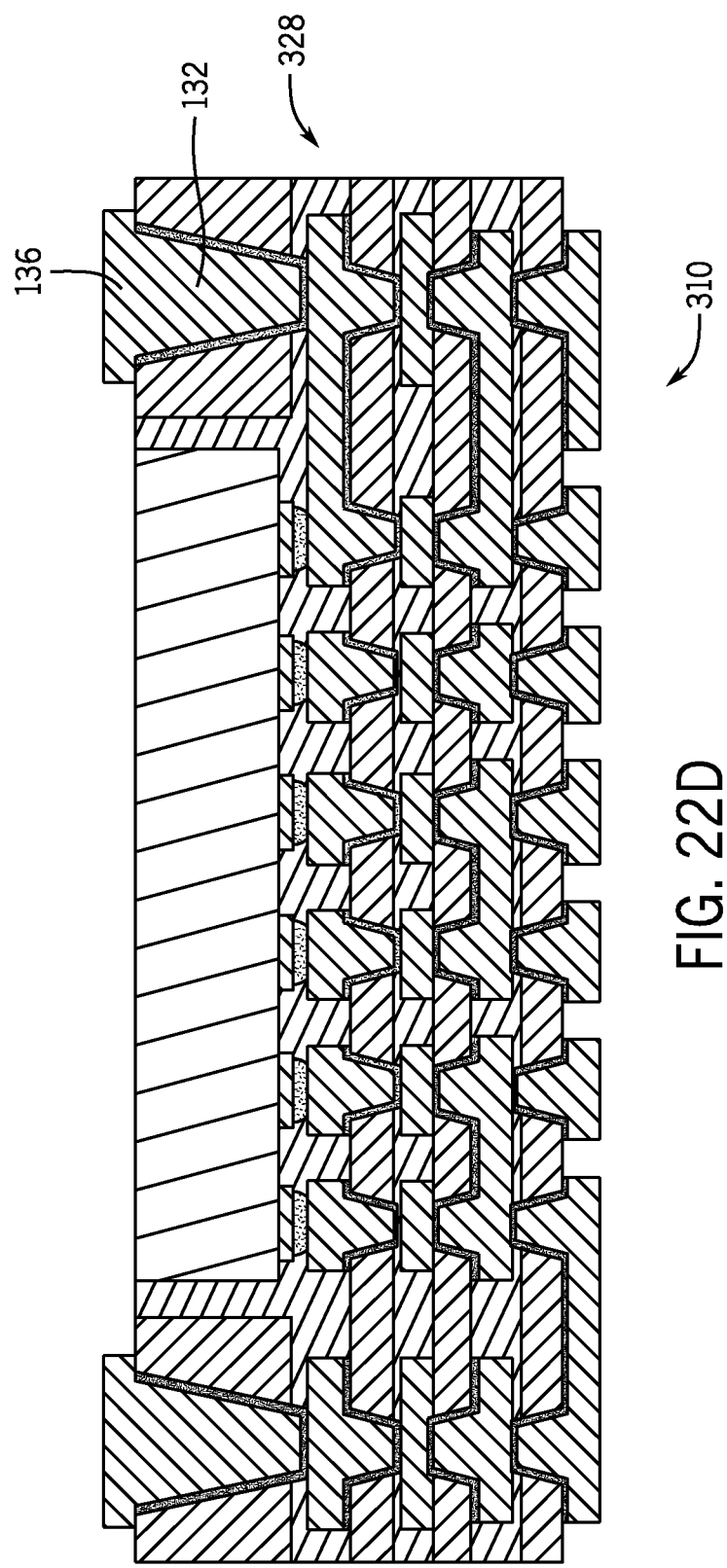
Figure 22E:
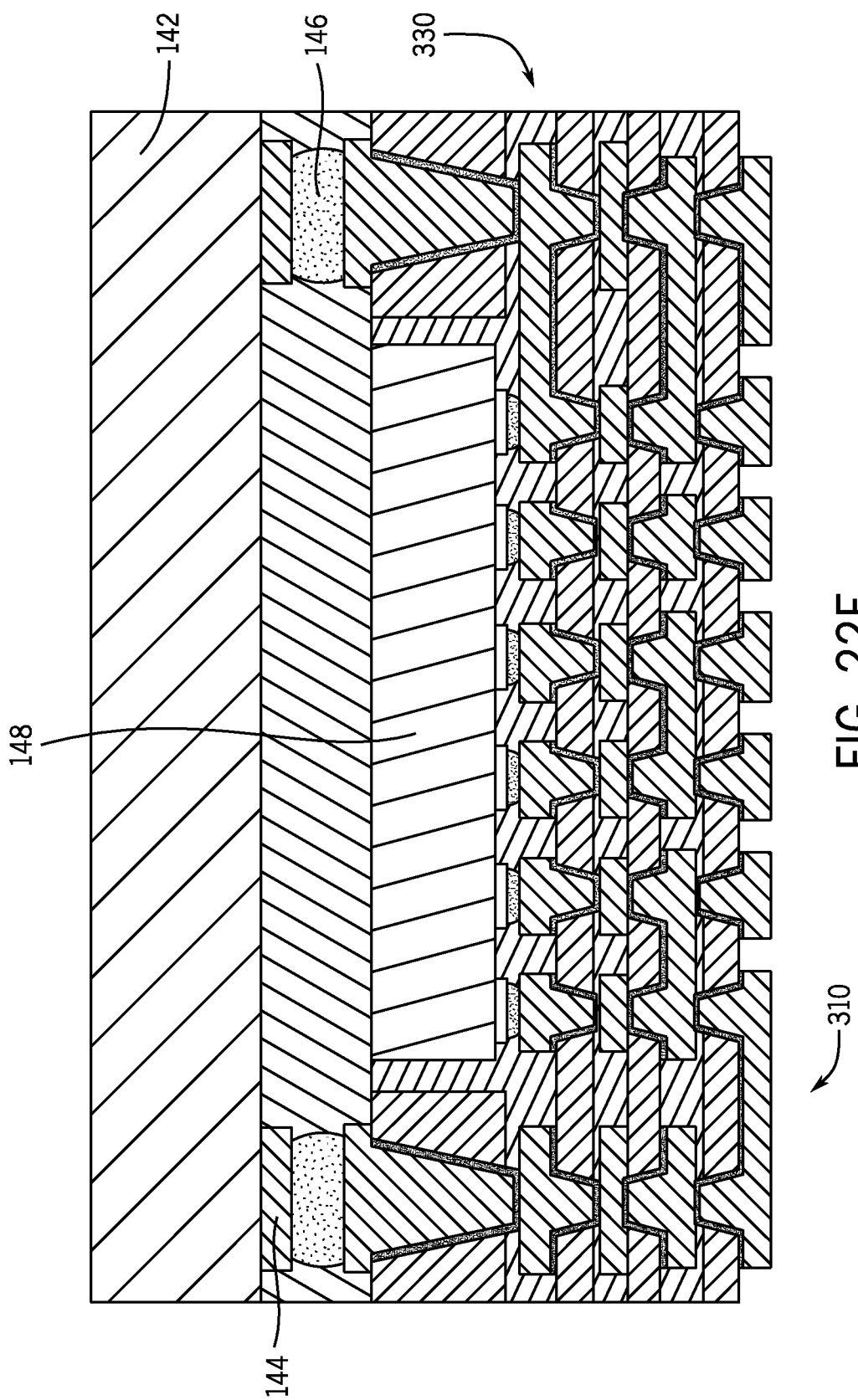

Referring now to FIGS. 22-24, and with reference back to FIGS. 7-13 and the components therein, preferred methods of forming electronics packages are depicted according to embodiments of the invention. Referring first to FIGS. 22A-22E, process steps of a method 310 are illustrated therein for forming the electronics package 100 as depicted in FIG. 6, the electronics package 110 as depicted in FIG. 7, the electronics package 120 as depicted in FIG. 8, and the electronics package 140 as depicted in FIG. 9. As illustrated at STEP 312 in FIG. 22A, a multilayer interconnect structure 84 is provided, with it being recognized that the multilayer interconnect structure 84 may be constructed in accordance with any of the methods shown and described above in FIGS. 15-21. Upon fabrication/providing of the multilayer interconnect structure 84, a semiconductor device 102 is then attached to multilayer interconnect structure 84 at STEP 314, as shown in FIG. 22B. Semiconductor device 102 has I/O pads 104 on its active surface, with the I/O pads 104 being electrically attached to the specific regions of the third conductive wiring layer 94 by a die attachment element 108. According to exemplary embodiments, and as depicted in FIGS. 31A-31E, the die attachment element 108 may comprise nano-solder bumps 316 (FIG. 31A), thin solder paste 318 (FIG. 31B), diffusion bonding 320 (Cu or Au) (FIG. 31C), carbon nano-tubes 322 (FIG. 31D), or conductive adhesive 324 (FIG. 31E), although it is recognized that other die attachment elements may also be utilized (e.g., thermocompression bonding or thermosonic bonding). According to one embodiment, attachment of the semiconductor device 102 completes the fabrication of electronics package 100, as previously illustrated in FIG. 6.

In one embodiment, fabrication of the electronics package continues at STEP 326, where a core board 122 with opening 126 is bonded to the topside of multilayer interconnect structure 84 using adhesive 124, as shown in FIG. 22C. The core board 122 is positioned such that the semiconductor device 102 resides within the opening 126, with a resin material 112 being dispensed into opening 126 and filling the opening 126 to encapsulate the semiconductor device 102. It should be noted that if the resin material is applied over the semiconductor device 102 without first mounting the core board 122, electronics package 110 of FIG. 7 is achieved.

In a next step of an electronics package fabrication process, vias 132 are formed through the core board 122 in perimeter region 134 thereof at STEP 328, with the vias being formed from top surface of core board 122 through the bottom surface of core board 122 and through adhesive 124 to portions of the third conductive wiring layer 94 of the multilayer interconnect structure 84, as shown in FIG. 22D. Conductive material is then formed in the via and on portions of the top surface 128 of core board 122, forming an electrical connection from top surface of core board 122—such that an electronics package 120 as illustrated in FIG. 8 is provided.

In one embodiment, and as shown in FIG. 22E, fabrication of the electronics package continues at STEP 330, where a topside package 142 with I/O pads 144 is mounted onto the electronics package 120 formed upon completion of STEP 328. The I/O pads 144 of topside package 142 are electrically connected to topside terminals 136 by a connection element 146 such as for example a solder ball, solder paste, or conductive adhesive. Optionally, underfill material 148 is dispensed to fill a gap between the surface of the topside package 142 and the top surface of electronics package 120 such that an electronics package 140 as illustrated in FIG. 9 is provided.

Figure 23E:
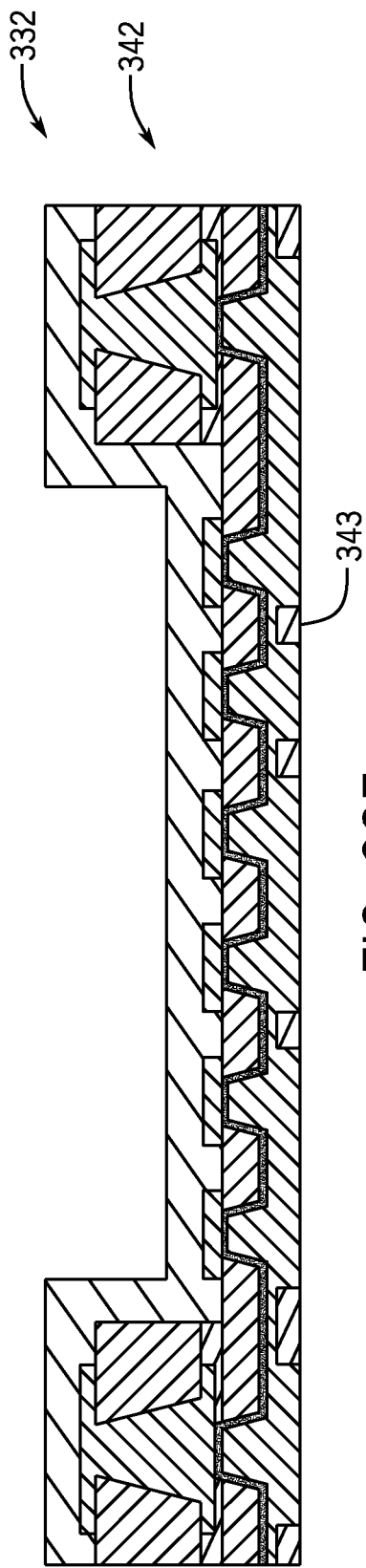

Referring now to FIGS. 23A-23I, a preferred method 332 of forming electronics package 152 as depicted in FIG. 10 and electronics package 170 as depicted in FIG. 11 is depicted. At STEP 334 of the method 332, a one sided, core interconnect structure 70a with only one wiring layer—first interconnect wiring layer 80—on the top surface 78 of base insulating substrate 72 is provided (as depicted in STEP 210 of FIG. 15 or STEP 232 of FIG. 16), along with a core board 154 with opening 164 and conductive feed through holes 158, topside terminals 160, and bottom side terminals 162, as shown in FIG. 23A. The core interconnect structure 70a and core board 154 are then aligned to each other. At STEP 336, the one sided core interconnect structure 70a is laminated to core board 154 using an adhesive material 156, as shown in FIG. 23B, with microvias then being formed from the bottom side of core interconnect structure 70a to first interconnect wiring layer 80 and to bottom side terminals 162 on core board 154 at STEP 338, as shown in FIG. 23C. At STEP 340 of method 332, the top surface of core interconnect structure 70a and the exposed surfaces of core board 154 are covered with a protective photoresist 341, as shown in FIG. 23D. A barrier layer and a seed metal layer or a seed metal layer without a barrier layer, indicated at 203, is then applied to the bottom surface of the core interconnect structure 70a, into the microvias 74 and onto exposed portions of first interconnect wiring layer 80 and bottom side terminals 162.

Figure 23F:
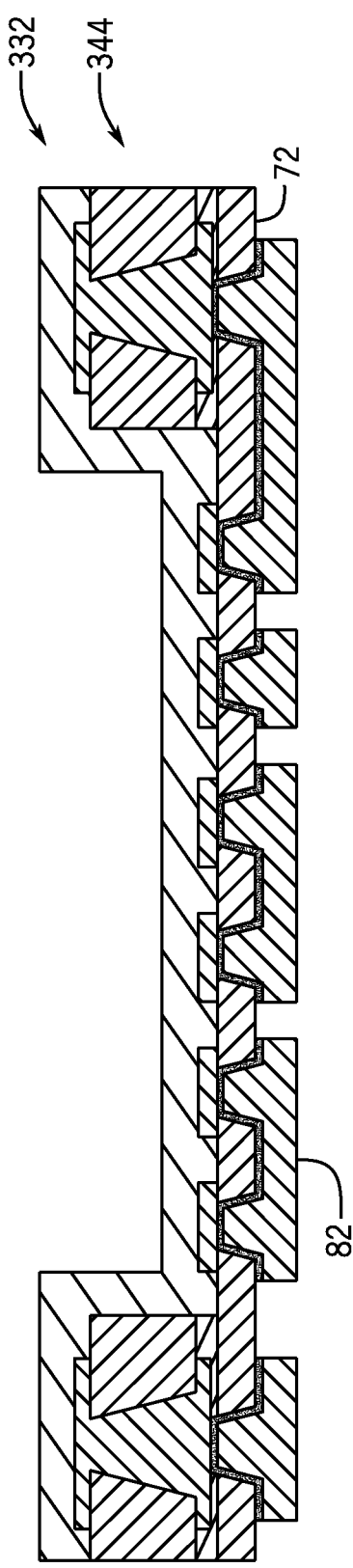
Figure 23G:
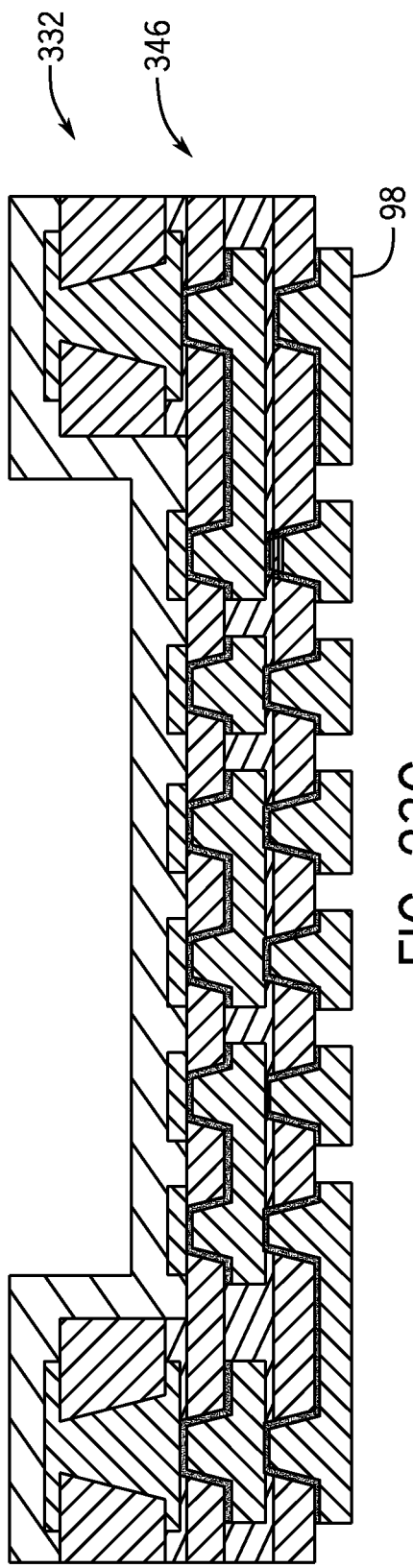
Figure 23H:
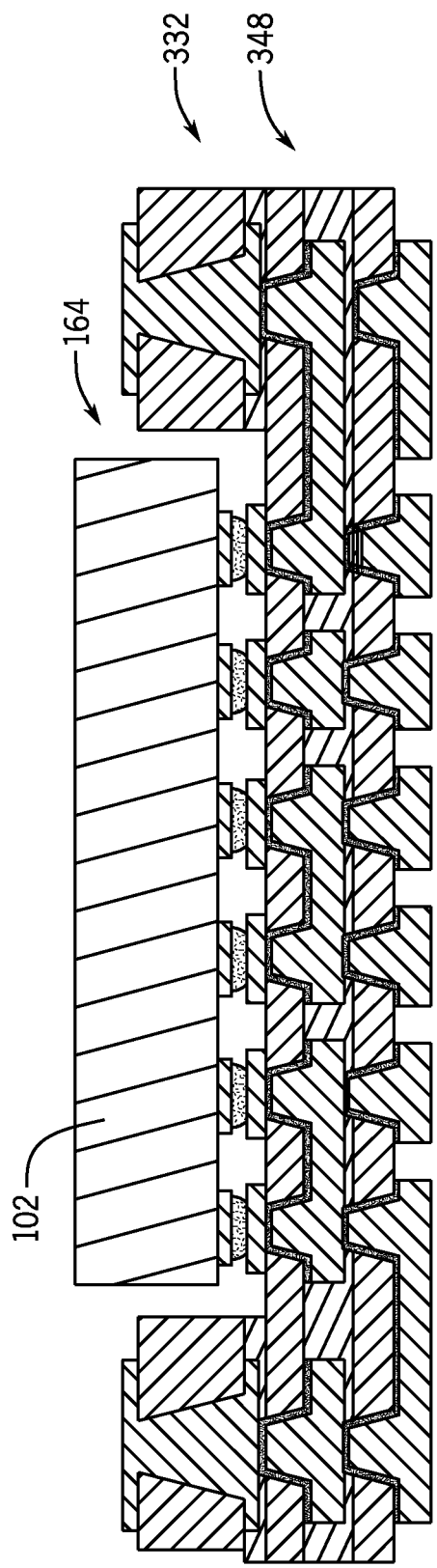

At STEP 342, a photomask material 343 is applied to the seed layer 203 and photopatterned to form an opening, so as to permit a patterned plate-up of selected portions of the seed layer, as shown in FIG. 23E. Electroplating is used to plate up a thick metal layer of 5 to 50 microns in the regions where the photoresist 343 is removed, such as with a copper plate-up. The remaining photoresist 343 is then removed and the exposed seed layer 203 is etched off at STEP 344, so as to form second conductive wiring layer 82, as shown in FIG. 23F. Upon completion of STEP 344, an additional wiring layer 98 is formed on the bottom surface of core interconnect structure 70a at STEP 346—such as by applying the process steps detailed in STEPS 302-308 of the method of FIG. 21, as shown in FIG. 23G. As shown in FIG. 23H, the protective photoresist 341 applied in STEP 340 is removed at STEP 348 and semiconductor device 102 is electrically attached to the top surface of core interconnect structure 70a using the same processes detailed in STEP 314 of FIG. 22B—such that an electronics package 152 as illustrated in FIG. 10 is provided. Although not depicted in FIG. 23H, following STEP 348, a resin material 112 can be dispensed into opening 164 and to fill the opening 164 to encapsulate the semiconductor device 102 to form electronics package 152 as depicted in FIG. 10.

Figure 23I:
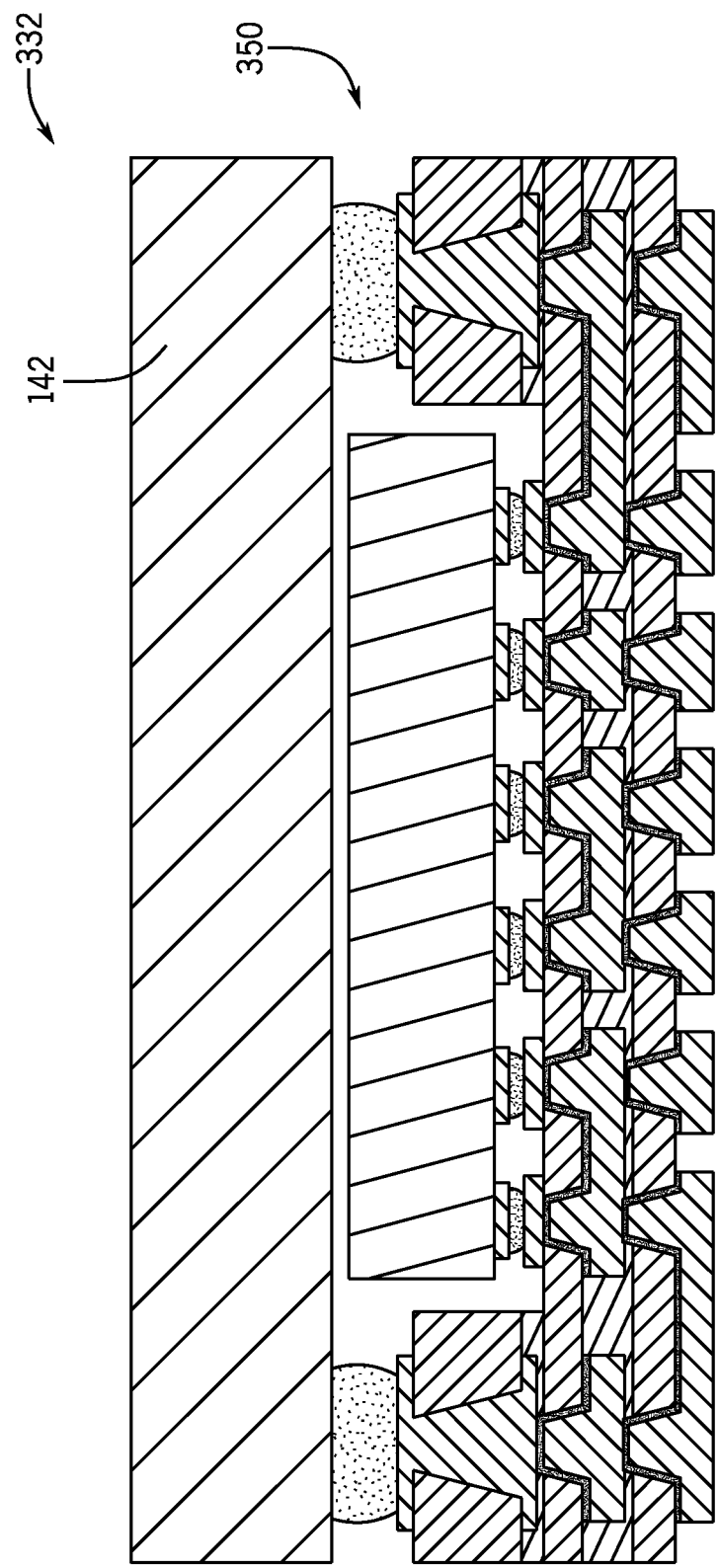

As shown in FIG. 23I, in one embodiment, fabrication of the electronics package continues at STEP 350, where a topside package 142 is mounted onto the top of electronics package 152 using the same processes detailed in STEP 330 of FIG. 22E—such that an electronics package 170 as illustrated in FIG. 11 is provided.

Figure 24C:
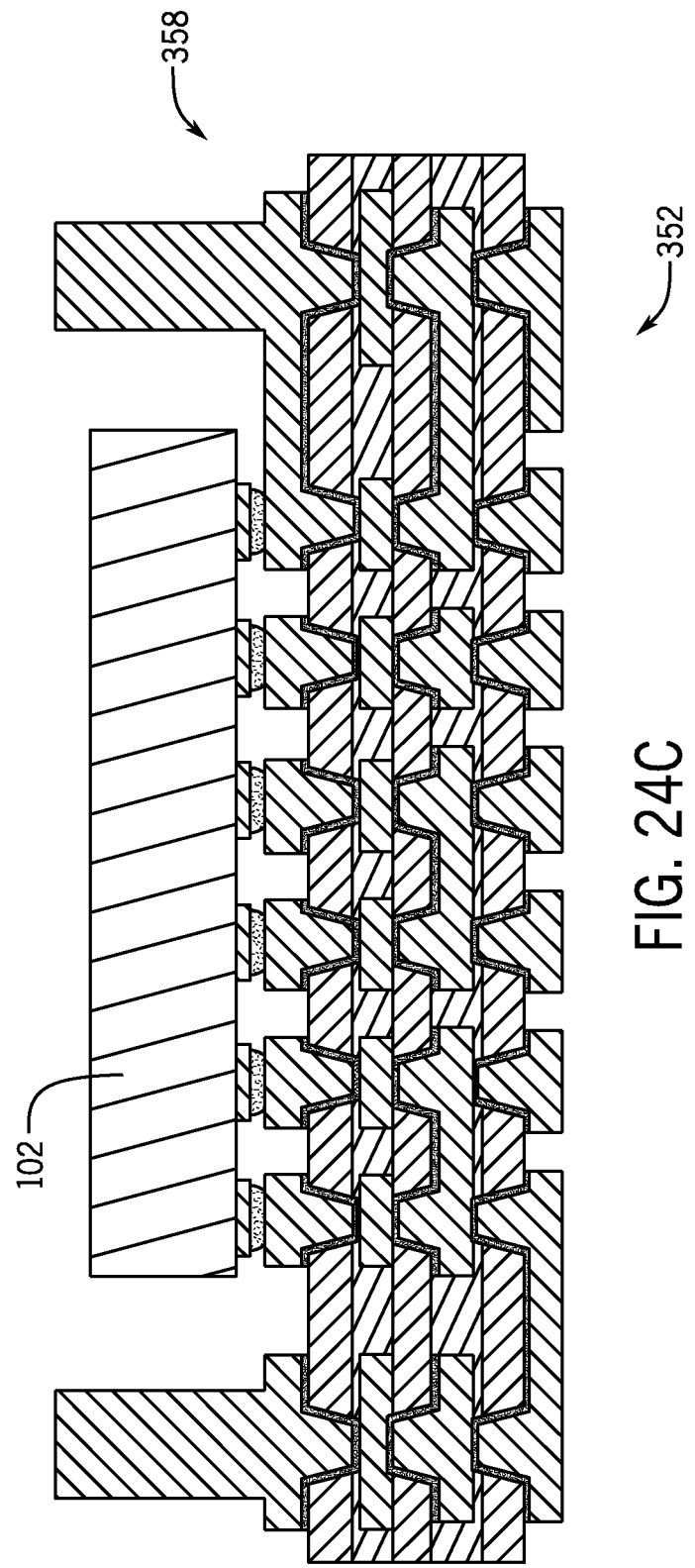

Referring now to FIGS. 24A-24F, a preferred method 352 of forming electronics package 180 as depicted in FIG. 12 and electronics package 190 as depicted in FIG. 13 is illustrated. In a first step of method 352, and as shown in FIG. 24A, a multilayer interconnect structure 84 is prepared at STEP 354, such as previously shown and described in FIG. 5. As shown in FIG. 24B, conductive posts 182 are then formed on the perimeter areas of third conductive wiring layer 94 at STEP 356 by, for example, applying a thin photoresist on the third wiring layer, patterning the resist to open areas at specific perimeter areas, applying a thin seed layer such as, for example, copper, and applying a thick photoresist with a thickness of preferably 50 to 400 microns. The photoresist is then photo-patterned to create columnar openings at the same specific perimeter areas. A thick metal is then pattern plated-up to form conductive posts 182 preferably with electroplated copper, and the remaining photoresist thick photoresist is then removed, the exposed seed layer is removed and then the thin photoresist is removed.

Figure 24D:
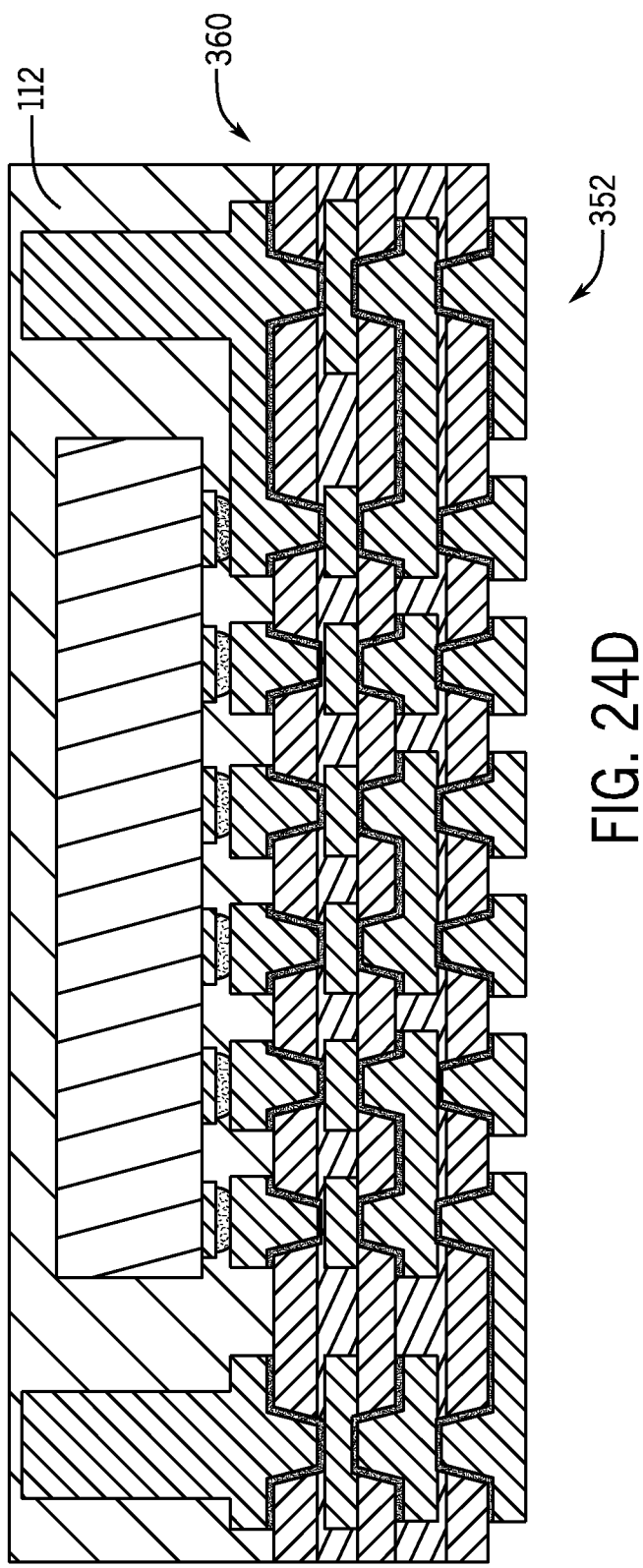
Figure 31A:
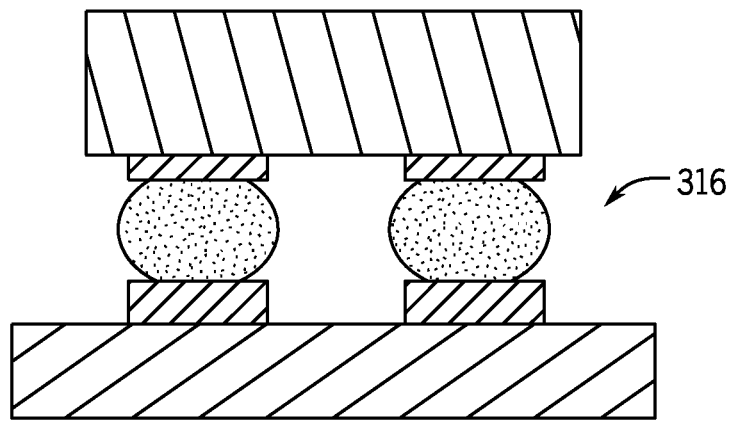
FIGS. 31A-31E are schematic cross-section side views of chip attach structures incorporated into the electronics package embodiments of this invention.
Figure 31B:
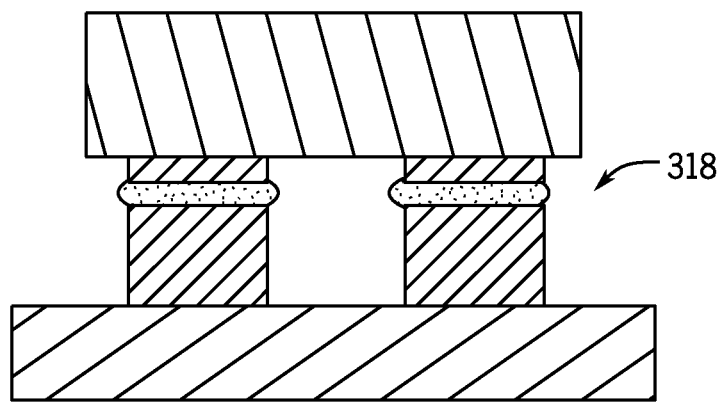
Figure 31C:
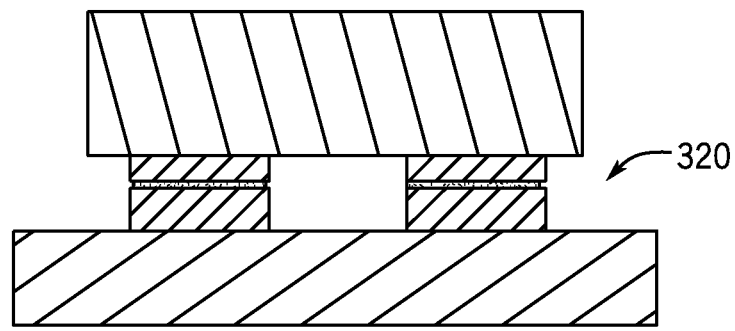
Figure 31D:
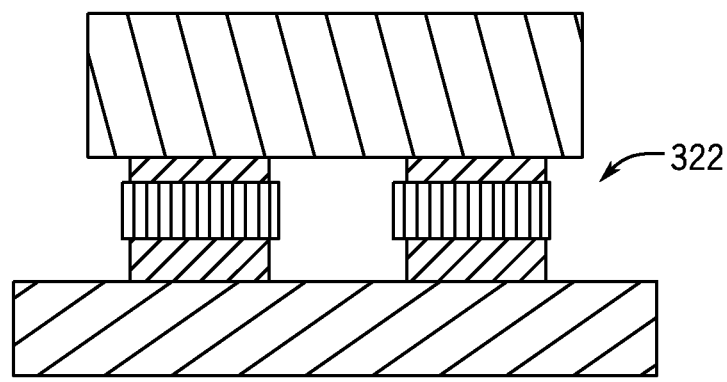
Figure 31E:
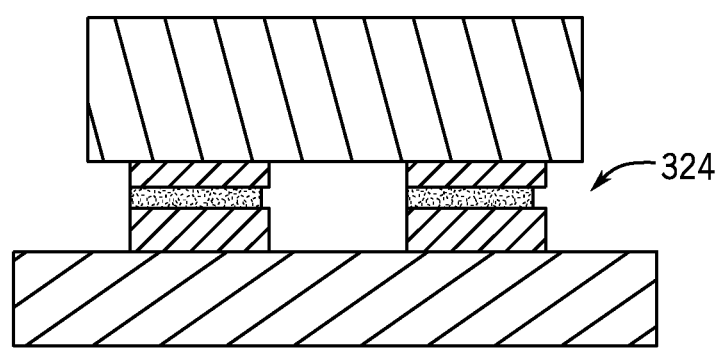

At STEP 358 of method 352, a semiconductor device 102 is electrically attached to the top surface of multilayer interconnect structure 84, as shown in FIG. 24C, such as by using the same processes detailed in STEP 314 of FIG. 22B. As shown in FIG. 24D, resin material 112 is then applied over the top surface of multilayer interconnect structure 84 at STEP 360, such that semiconductor device 102 and conductive posts 182 are fully encapsulated therein, such as previously described in STEP 326 of FIG. 22C. At STEP 362, the top surface of resin material 112 is then back ground to expose the tops of the conductive posts 182—such that an electronics package 180 as illustrated in FIG. 12 is provided, as shown in FIG. 24E.

As shown in FIG. 24F, in one embodiment, fabrication of the electronics package continues at STEP 364, where a topside package 142 is mounted onto the top of electronics package 180 using the same processes detailed in STEP 330 of FIG. 22E—such that an electronics package 190 as illustrated in FIG. 11 is provided.

Referring now to FIGS. 25-27, schematic cross-sectional views of electronics packages that include a semiconductor device are illustrated, according to embodiments of the invention. With regard to the embodiments illustrated in FIGS. 25-27, it is recognized that the electronics packages are built off of a modified core interconnect structure 70 and/or multilayer interconnect structure 84 using a device-almost last technique.

Referring first to FIG. 25, an electronics package 370 is illustrated that includes semiconductor device 102, bottom insulating substrate 372, and a modified multilayer interconnect structure 374. The lower surface 376 of modified multilayer interconnect structure 374 and active surface 106 of semiconductor device 102 are bonded to top surface 378 of bottom insulating substrate 372, such as by adhesive 380 for example. Multilayer interconnect structure 374 is composed of multiple dielectric layers, bottom conductive wiring layer 382, top conductive wiring layer 384, and at least one inner conductive wiring layer 386, with microvia connections connecting between adjacent wiring layers. A cavity 388 is formed in the multilayer interconnect structure 374 forming a window frame around semiconductor device 102. Resin material 390 fills cavity 388 encapsulating semiconductor device 102. Outer microvias 392 are formed through bottom insulating substrate 372 to I/O pads 104 of semiconductor device 102 and to selected portions of bottom conductive wiring layer 382. Outer conductive wiring layer 394 is formed on the bottom/outer surface 396 of bottom insulating substrate 372 and into outer microvias 392, electrically connecting to the semiconductor device to the multilayer interconnect structure 374 by what are termed herein as "via-last connections."

Referring now to FIG. 26, an electronics package 400 is illustrated having all the elements of electronics package 370 shown in FIG. 25, with additional connections/routing also included therein. The electronics package 400 further contains a buried conductive wiring layer 402 formed on top surface 378 of bottom insulating substrate 372 and additional outer microvias 392a formed through bottom insulating substrate 372 to selected areas of buried conductive wiring layer 386, with outer conductive wiring layer 394 also connecting through additional outer microvias 392a to exposed portions of buried conductive wiring layer 386, so as to provide additional wiring capability. Adhesive 538 of electronics package 400 is preferable thicker than adhesive 380 of electronic package 370 of FIG. 24 to accommodate the thickness of buried conductive layer 402. Outer microvias 392 therefore are deeper vias (i.e., "deep vias"), going through both the bottom insulating substrate 372 and the thicker adhesive 538.

Referring now to FIG. 27, an electronics package 406 is illustrated having all of the elements of electronics package 400 shown in FIG. 26, with still additional connections/routing also included therein. The electronics package 406 further contains a second buried conductive wiring layer 408 formed on bottom/outer surface 396 of bottom insulating substrate 372, outer dielectric layer 373 on the bottom/outer surface 396 of bottom insulating layer 372 and on second buried conductive wiring layer 408 and additional outer microvias 392b formed through outer dielectric layer 373 to selected areas of second buried conductive wiring layer 408, with outer conductive wiring layer 394 also connecting through additional outer microvias 392b to exposed portions of second buried conductive wiring layer 408 providing still more wiring capability. Outer microvias 394 of electronic package 406 are deeper than the outer microvias 394 of electronic packages 370 or 400 as they pass through—i.e., "deep vias".

Referring now to FIGS. 28-30, preferred methods of forming the electronics packages of FIGS. 25-27 are depicted, according to embodiments of the invention.

In reference to FIGS. 28A-28F, a preferred method 410 of forming electronics package 370 as depicted in FIG. 25, is shown. In a first step of method 410, and as shown in FIG. 28A, a multilayer interconnect structure 84 is provided at STEP 412—with the multilayer interconnect structure 84 being fabricated according to one of the methods illustrated in detail in FIGS. 14-20. However, as illustrated in FIG. 28A, the center portion of multilayer interconnect structure 84 has no conductive wiring layers (80, 82, 94, 98) and no microvias (74, 92, 96). At STEP 414, the modified multilayer interconnect structure 374 is formed by removing the center portion of multilayer interconnect structure 84, such as by laser cutting, plasma etch, or mechanical punching, for example, so as to form a cavity for attachment of a semiconductor device 102 in a later step, as shown in FIG. 28B. Next, bottom insulating substrate 372 is laminated to the lower surface of the modified multilayer interconnect structure 374 at STEP 416, such as by using adhesive 380, for example, as shown in FIG. 28C.

The method 410 continues at STEP 418 with placement of semiconductor device 102 into the through hole 388 and bonding thereof to the top surface of bottom insulating substrate 372 using, for example, adhesive 380, as shown in FIG. 28D. The semiconductor device 102 and the modified multilayer interconnect structure 374 are preferably bonded in one step by heat, for example, or modified multilayer interconnect structure 374 can be bonded prior to applying die attach adhesive and bonding semiconductor device 102 in a subsequent step. At STEP 420, a resin material 390 is dispensed into the through hole 388 so as to encapsulate semiconductor device 102, and cured such as by heat for example, as shown in FIG. 28E. At STEP 422, outer microvias 392 are formed through bottom insulating substrate 372 to I/O pads 104 of semiconductor device 102 and to selective portions of bottom conductive wiring layer 382 of modified multilayer interconnect structure 374, as shown in FIG. 28F. An outer conductive wiring layer 394 is also formed on bottom surface of bottom insulating substrate 372, into outer microvias 392, and onto exposed portions of I/O pads 104 and bottom conductive wiring layer 382.

Referring now to FIGS. 29A-29D, a preferred method 424 of forming electronics package 400 as depicted in FIG. 26, is shown. The method begins at STEP 426, where base interconnect film 428 is laminated to the lower surface of modified multilayer interconnect structure 374 using, for example, adhesive 380, as shown in FIG. 29A. Base interconnect film 428 is composed of bottom insulating substrate 372 and buried conductive wiring layer 402. At STEP 430, semiconductor device 102 is placed into the through hole 388 and bonded to the top surface of base interconnect film 428 using, for example, adhesive 380, as shown in FIG. 29B. The semiconductor device 102 and the modified multilayer interconnect structure 374 are preferably bonded in one step by heat, for example, or modified multilayer interconnect structure 374 can be bonded prior to applying die attach adhesive and bonding semiconductor device 102 in a subsequent step.

At STEP 432 of method, a resin material 390 is dispensed into the through hole 388, so as to encapsulate semiconductor device 102, as shown in FIG. 29C. At STEP 434, outer microvias 392 are formed through bottom insulating substrate 372 to I/O pads 104 of semiconductor device 102 (i.e., deep via-last connections) and to selective portions of bottom conductive wiring layer 382 of modified multilayer interconnect structure 374, and outer microvias 392a are formed to selective portions of buried conductive wiring layer 402, as shown in FIG. 29D. Outer conductive wiring layer 394 is formed on bottom surface of bottom insulating substrate 372, into outer microvias 392 and 392a, and onto exposed portions of I/O pads 104, bottom conductive wiring layer 382, and buried conductive wiring layer 402.

Referring now to FIGS. 30A-30D, a preferred method 440 of forming electronics package 406 as depicted in FIG. 26, is shown. Method 440 begins at STEP 442, where base interconnect film 444 is laminated to lower surface modified multilayer interconnect structure 374 using, for example, adhesive 380, as shown in FIG. 30A. Base interconnect film 444 is composed of bottom insulating substrate 372, buried conductive wiring layer 402, second buried conductive wiring layer 408 and outer dielectric layer 373. At STEP 446, semiconductor device 102 is placed into the through hole 388 and bonded to the top surface of base interconnect film 428 using, for example, adhesive 380, as shown in FIG. 30B. The semiconductor device 102 and the modified multilayer interconnect structure 374 are preferably bonded in one step by heat, for example, or modified multilayer interconnect structure 374 can be bonded prior to applying die attach adhesive and bonding semiconductor device 102 in a subsequent step.

At STEP 448 of method, a resin material 390 is dispensed into the through hole 388, so as to encapsulate semiconductor device 102, as shown in FIG. 30C. At STEP 450, outer microvias 392 are formed through outer dielectric layer 373, bottom insulating substrate 372 and adhesive 380 to I/O pads 104 of semiconductor device 102 and to selective portions of bottom conductive wiring layer 382 of modified multilayer interconnect structure 374, as shown in FIG. 30D. A first set of outer microvias 392a are formed through outer dielectric layer 373 and bottom insulating substrate 372 to selective portions of buried conductive wiring layer 402 and a second set of outer microvias 392b are formed through outer dielectric layer 373 to selective portions of second buried conductive wiring layer 408. Outer conductive wiring layer 394 is formed on bottom surface of outer dielectric layer 373, into outer microvias 392, 392a and 392b, and onto exposed portions of I/O pads 104, bottom conductive wiring layer 382, buried conductive wiring layer 402, and second buried conductive wiring layer 408.

For each of the electronics package process flows shown and described in FIGS. 22-24 and 28-30, it is recognized that a testing step would ideally be performed prior to placement/attachment of the semiconductor device on the electronics package. The electrical test that is performed would ensure the functionality of the substrate and package structure prior to device attachment, so as to not populate a device on un-yielding substrate locations but only at known good locations of the substrate and package structure.

Beneficially, embodiments of the invention thus provide electronics packages that include high electrical conductivity connections from the semiconductor device to the electronics package terminals and with a direct thermal path with low thermal conductivity. The electronics packages are manufactured via methods that enable the handling of thin substrate materials that typically are not used in multilayer structures in a panel process, with a perimeter frame being used for support during via and conductive wiring formation of a core interconnect structure and a subsequent double-sided build-up of a multi-layer interconnect structure where the base insulating substrate and additional insulating substrates have a thickness of between 5 to 50 micrometers. The electronics packages are manufactured using a chips-last attach or chips-almost last attach that minimizes yield losses associated with fine line interconnect from the loss of good devices due to interconnect losses. Embedded chip modules and/or a Fan-Out WLP devices can thus be fabricated without the costly loss of good chip due to a defective interconnect structure.

Therefore, according to one embodiment of the invention, a method of manufacturing a multi-layer electronics package via a double-sided build-up includes attaching a base insulating substrate to a frame having an opening therein and such that the frame is positioned above and/or below the base insulating substrate to provide support thereto, the base insulating substrate comprising a first side and a second side opposite the first side. The method also includes applying a first conductive wiring layer on the first side of the base insulating substrate, forming vias in the base insulating substrate extending from the second side to the first side to expose portions of the first conductive wiring layer, forming a second conductive wiring layer on the second side of the base insulating substrate that covers the vias and the exposed portions of the first conductive wiring layer, and bonding at least one additional insulating substrate to the base insulating substrate, the at least one additional insulating substrate being bonded to at least one of the first side and the second side of the base insulating substrate. The method further includes forming vias in each of the at least one additional insulating substrate to expose regions of at least one of the first conductive wiring layer and the second conductive wiring layer; and forming an additional conductive wiring layer on each of the at least one additional insulating substrate that covers the vias formed therein and the exposed regions of the at least one of the first conductive wiring layer and the second conductive wiring layer, wherein the base insulating substrate, the first and second conductive wiring layers, the at least one additional insulating substrate, and the additional conductive wiring layer form a multilayer interconnect structure, with the frame providing support for the manufacturing of the multi-layer electronics package, including the via formation and the first, second, and additional conductive wiring layer formation.

According to another embodiment of the invention, a method of manufacturing, a method of manufacturing an interconnect structure includes attaching a base insulating substrate to a perimeter frame having an opening therein, the base insulating substrate having a thickness of between 5 to 50 micrometers and comprising a first side and a second side opposite the first side. The method also includes applying a first conductive wiring layer on the first side of the base insulating substrate, forming vias in the base insulating substrate extending from the second side to the first side to expose portions of the first conductive wiring layer, and forming a second conductive wiring layer on the second side of the base insulating substrate that covers the vias and the exposed portions of the first conductive wiring layer, wherein the frame comprises a clamp-type frame positioned above and below the base insulating substrate to hold the base insulating substrate therebetween and provide support thereto for the manufacturing of the interconnect structure, including the via formation and the first and second conductive wiring layer formation.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method of manufacturing a multi-layer electronics package via a double-sided build-up, the method comprising:
    attaching a base insulating substrate to a frame having an opening therein and such that the frame is positioned above and/or below the base insulating substrate to provide support thereto, the base insulating substrate comprising a first side and a second side opposite the first side;
    applying a first conductive wiring layer on the first side of the base insulating substrate;
    forming vias in the base insulating substrate extending from the second side to the first side to expose portions of the first conductive wiring layer;
    forming a second conductive wiring layer on the second side of the base insulating substrate that covers the vias and the exposed portions of the first conductive wiring layer;
    bonding at least one additional insulating substrate to the base insulating substrate, the at least one additional insulating substrate being bonded to at least one of the first side and the second side of the base insulating substrate;
    forming vias in each of the at least one additional insulating substrate to expose regions of at least one of the first conductive wiring layer and the second conductive wiring layer; and
    forming an additional conductive wiring layer on each of the at least one additional insulating substrate that covers the vias formed therein and the exposed regions of the at least one of the first conductive wiring layer and the second conductive wiring layer;
    wherein the base insulating substrate, the first and second conductive wiring layers, the at least one additional insulating substrate, and the additional conductive wiring layer form a multilayer interconnect structure, with the frame providing support for the manufacturing of the multi-layer electronics package, including the via formation and the first, second, and additional conductive wiring layer formation.

2. The method of claim 1 wherein the base insulating substrate and at least one additional insulating substrate has a thickness of between 5 to 50 micrometers, with the frame providing support to the base insulating substrate and the at least one additional insulating substrate during via formation and the formation of conductive wiring layers, so as to enable the double-sided build-up of the multi-layer electronics package.

3. The method of claim 1 wherein the frame comprises a clamp-type frame positioned above and below the base insulating substrate to hold the base insulating substrate therebetween.

4. The method of claim 1 wherein bonding the at least one additional insulating substrate, forming the vias in each of the at least one additional insulating substrate, forming the additional conductive wiring layer, and patterning the additional conductive wiring layer comprises:
    bonding the at least one additional insulating substrate to one of the first side and the second side of the base insulating substrate;
    forming vias in the at least one additional insulating substrate to expose regions of one of the first conductive wiring layer and the second conductive wiring layer; and
    forming at least one additional conductive wiring layer on the at least one additional insulating substrate that covers the vias formed therein and the exposed regions of one of the first conductive wiring layer and the second conductive wiring layer.

5. The method of claim 4 wherein bonding the at least one additional insulating substrate comprises bonding a first insulating substrate and a second insulating substrate; and
    wherein forming the vias in the at least one additional insulating substrate comprises:
    forming vias in the first insulating substrate from a first direction; and
    forming vias in the second insulating substrate from a second direction opposite the first direction, as part of the double-sided build-up of the multi-layer, fine line flex electronics package.

6. The method of claim 1 further comprising electrically coupling an electrical component to the multilayer interconnect structure using a die attachment element.

7. The method of claim 6 further comprising:
    performing a testing step prior to coupling of the electrical component to the multilayer interconnect structure; and
    coupling the electrical component to the multilayer interconnect structure at a known good location of the multilayer interconnect structure subsequent to the testing step.

8. The method of claim 6 wherein the die attachment element comprises one of solder bumps, solder paste, a diffusion bonding element, carbon nano-tubes, and a conductive adhesive.

9. The method of claim 6 further comprising encapsulating the electrical component in a resin material to form a body of the electronics package, the resin material covering at least perimeter sides of the electrical component.

10. The method of claim 9 further comprising forming conductive posts electrically coupled to perimeter regions of the multilayer interconnect structure, the conductive posts extending through the resin material from a top surface thereof to a bottom surface thereof.

11. The method of claim 10 wherein the frame has a height greater than a height of the conductive posts, so as to provide protection to the conductive posts during formation.

12. The method of claim 11 further comprising:
attaching a topside package to the conductive posts, the topside package comprising input/output (I/O) pads electrically coupled to the conductive posts; and
adding an underside encapsulate to fill a gap between the topside package and an upper surface provided by the electrical component and the resin material.

13. The method of claim 6 further comprising:
bonding a core board to the multilayer interconnect structure, the core board comprising:
an opening therein to accommodate the electrical component; and
conductive connections extending through the core board and electrically connected to the multilayer interconnect structure; and
applying a resin material within the opening of the core board to encapsulate the electrical component.

14. The method of claim 13 further comprising attaching a topside package to the conductive connections of the core board, the topside package comprising input/output (I/O) pads electrically coupled to the conductive connections.

15. The method of claim 13 further comprising adding an underside encapsulate to fill a gap between the topside package and an upper surface provided by the core board and the resin material.

16. The method of claim 1 wherein a center portion of the multilayer interconnect structure is free of vias in the base insulating substrate and the at least one additional insulating substrate and is free of the first and second conductive wiring layers and the additional conductive wiring layers on the respective insulating substrates; and
wherein the method further comprises:
removing the center portion of the multilayer interconnect structure to form an opening through the multilayer interconnect structure, so as to form a modified multilayer interconnect structure;
attaching a bottom insulating substrate to a bottom surface of the modified multilayer interconnect structure;
attaching an electrical component to the bottom insulating substrate and within the opening of the modified multilayer interconnect structure;
dispensing a resin material in the opening to encapsulate the electrical component;
forming outer vias in the bottom insulating substrate; and
forming an outer conductive wiring layer in the outer vias and on an outer surface of the bottom insulating substrate to form electrical connections to input/output (I/O) pads of the electrical component and to a respective additional conductive wiring layer of the modified multilayer interconnect structure.

17. The method of claim 16 wherein the bottom insulating substrate includes a first buried conductive wiring layer formed on an inner surface of the bottom insulating substrate; and
wherein the method further comprises
forming a first set of additional outer vias in the bottom insulating substrate, with the outer conductive wiring layer extending through the first set of additional outer vias to form electrical connections to the first buried conductive wiring layer.

18. The method of claim 17 further comprising:
forming an additional bottom insulating dielectric layer on the outer surface of the bottom insulating substrate;
forming a second buried conductive wiring layer on an inner surface of the additional bottom insulating dielectric layer, such that the second buried conductive wiring layer is positioned between the bottom insulating substrate and the additional bottom insulating dielectric layer; and
forming a second set of additional outer vias in the bottom insulating substrate and the additional bottom insulating dielectric layer, with the outer conductive wiring layer extending through the second set of additional outer vias to form electrical connections to the second buried conductive wiring layer;
wherein the outer vias also go through the second buried conductive wiring layer.

19. A method of manufacturing an interconnect structure, the method comprising:
attaching a base insulating substrate to a perimeter frame having an opening therein, the base insulating substrate having a thickness of between 5 to 50 micrometers and comprising a first side and a second side opposite the first side;
applying a first conductive wiring layer on the first side of the base insulating substrate;
forming vias in the base insulating substrate extending from the second side to the first side to expose portions of the first conductive wiring layer; and
forming a second conductive wiring layer on the second side of the base insulating substrate that covers the vias and the exposed portions of the first conductive wiring layer;
wherein the frame comprises a clamp-type frame positioned above and below the base insulating substrate to hold the base insulating substrate therebetween and provide support thereto for the manufacturing of the interconnect structure, including the via formation and the first and second conductive wiring layer formation.

20. The method of claim 19 further comprising:
bonding at least one additional insulating substrate to the base insulating substrate, the at least one additional insulating substrate being bonded to at least one of the first side and the second side of the base insulating substrate;
forming vias in each of the at least one additional insulating substrate to expose regions of at least one of the first conductive wiring layer and the second conductive wiring layer; and
forming an additional conductive wiring layer on each of the at least one additional insulating substrate that covers the vias formed therein and the exposed regions of the at least one of the first conductive wiring layer and the second conductive wiring layer;
wherein the base insulating substrate, the first and second conductive wiring layers, the at least one additional insulating substrate, and the additional conductive wiring layer form a multi-layer interconnect structure, with the frame providing support for a double-sided build-up of the multi-layer interconnect structure.

21. The method of claim 19 further comprising forming one or more second level connections that protrude outwardly from the additional conductive wiring layer to provide an electrical connection from the multi-layer interconnect structure to an external circuit, and wherein the frame has a height greater than a height of the one or more second level connections, so as to provide protection to the one or more second level connections during formation thereof.

* * * * *